(12) United States Patent
Zhu

(10) Patent No.: US 11,158,547 B2
(45) Date of Patent: Oct. 26, 2021

(54) SEMICONDUCTOR DEVICE, METHOD OF MANUFACTURING THE SAME, AND ELECTRONIC DEVICE INCLUDING THE DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 29 days.

(21) Appl. No.: 16/337,878

(22) PCT Filed: Jul. 31, 2017

(86) PCT No.: PCT/CN2017/095124
§ 371 (c)(1),
(2) Date: Mar. 28, 2019

(87) PCT Pub. No.: WO2018/059107
PCT Pub. Date: Apr. 5, 2018

(65) Prior Publication Data
US 2020/0027879 A1    Jan. 23, 2020

(30) Foreign Application Priority Data

Sep. 30, 2016  (CN) .......................... 201610872541.2
Jun. 30, 2017  (CN) .......................... 201710531811.8

(51) Int. Cl.
*H01L 29/06*    (2006.01)
*H01L 29/165*   (2006.01)
(Continued)

(52) U.S. Cl.
CPC ...... *H01L 21/823885* (2013.01); *B82Y 10/00* (2013.01); *G05B 23/0216* (2013.01);
(Continued)

(58) Field of Classification Search
CPC ....... H01L 21/823885; H01L 21/02532; H01L 21/02636; H01L 21/2252; H01L 21/3065;
(Continued)

(56) References Cited

U.S. PATENT DOCUMENTS 9,251,888 B1    2/2016  Liaw
9,685,537 B1    6/2017  Xie et al.
(Continued)

FOREIGN PATENT DOCUMENTS

CN    1901225 A       1/2007
CN    102299154 A    12/2011
(Continued)

OTHER PUBLICATIONS

U.S. Patent Office Action dated Jun. 11, 2020 for U.S. Appl. No. 16/338,169 (39 pages).
(Continued)

*Primary Examiner* — Christine A Enad
(74) *Attorney, Agent, or Firm* — Christensen, Fonder, Dardi & Herbert PLLC

(57) ABSTRACT

A semiconductor device including a first source/drain region at a lower portion thereof, a second source/drain region at an upper portion thereof, a channel region between the first source/drain region and the second source/drain region and close to peripheral surfaces thereof, and a body region inside the channel region. The semiconductor device may further include a gate stack formed around a periphery of the channel region.

36 Claims, 45 Drawing Sheets

(51) Int. Cl.

| | | |
|---|---|---|
| H01L 29/78 | (2006.01) | |
| H01L 29/66 | (2006.01) | |
| H01L 21/8238 | (2006.01) | |
| H01L 21/8234 | (2006.01) | |
| B82Y 10/00 | (2011.01) | |
| H01L 29/267 | (2006.01) | |
| H01L 29/417 | (2006.01) | |
| H01L 29/775 | (2006.01) | |
| H01L 29/786 | (2006.01) | |
| H01L 29/10 | (2006.01) | |
| G05B 23/02 | (2006.01) | |
| G06T 19/00 | (2011.01) | |
| H04N 5/232 | (2006.01) | |
| H04N 7/18 | (2006.01) | |
| H01L 21/02 | (2006.01) | |
| H01L 21/3065 | (2006.01) | |
| H01L 29/04 | (2006.01) | |
| H01L 29/423 | (2006.01) | |
| H01L 21/225 | (2006.01) | |
| H01L 21/324 | (2006.01) | |
| H01L 29/08 | (2006.01) | |
| H01L 29/15 | (2006.01) | |
| H01L 29/205 | (2006.01) | |
| H01L 29/45 | (2006.01) | |
| H01L 29/778 | (2006.01) | |
| H01L 21/308 | (2006.01) | |
| H01L 21/822 | (2006.01) | |
| H01L 27/092 | (2006.01) | |
| H04N 13/332 | (2018.01) | |
| H04N 13/111 | (2018.01) | |
| H04N 13/366 | (2018.01) | |
| H04N 13/398 | (2018.01) | |
| G06F 3/0481 | (2013.01) | |
| G06F 3/0482 | (2013.01) | |
| G06K 9/00 | (2006.01) | |
| H04N 5/247 | (2006.01) | |
| H01L 21/3105 | (2006.01) | |

(52) U.S. Cl.
CPC ...... *G06T 19/006* (2013.01); *H01L 21/02532* (2013.01); *H01L 21/02636* (2013.01); *H01L 21/2252* (2013.01); *H01L 21/2258* (2013.01); *H01L 21/3065* (2013.01); *H01L 21/3083* (2013.01); *H01L 21/324* (2013.01); *H01L 21/8221* (2013.01); *H01L 21/82345* (2013.01); *H01L 21/823412* (2013.01); *H01L 21/823418* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/04* (2013.01); *H01L 29/0638* (2013.01); *H01L 29/0653* (2013.01); *H01L 29/0676* (2013.01); *H01L 29/0847* (2013.01); *H01L 29/1037* (2013.01); *H01L 29/1054* (2013.01); *H01L 29/1083* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/6656* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66666* (2013.01); *H01L 29/66712* (2013.01); *H01L 29/66742* (2013.01); *H01L 29/775* (2013.01); *H01L 29/7788* (2013.01); *H01L 29/7813* (2013.01); *H01L 29/7827* (2013.01); *H01L 29/7848* (2013.01); *H01L 29/78642* (2013.01); *H04N 5/23238* (2013.01); *H04N 7/181* (2013.01); *G05B 2219/32014* (2013.01); *G06F 3/0482* (2013.01); *G06F 3/04817* (2013.01); *G06K 9/00711* (2013.01); *G06K 2009/00738* (2013.01); *G06K 2209/19* (2013.01); *H01L 21/31053* (2013.01); *H01L 29/0649* (2013.01); *H04N 5/247* (2013.01); *H04N 13/111* (2018.05); *H04N 13/332* (2018.05); *H04N 13/366* (2018.05); *H04N 13/398* (2018.05)

(58) Field of Classification Search
CPC ............... H01L 21/3083; H01L 21/324; H01L 21/8221; H01L 21/823412; H01L 21/823418; H01L 21/82345; H01L 21/823475; H01L 21/823487; H01L 21/823807; H01L 21/283814; H01L 21/823842; H01L 21/823864; H01L 27/092; H01L 29/0653; H01L 29/7813; H01L 29/7848; H01L 29/66712; H01L 29/165
See application file for complete search history.

(56) References Cited

U.S. PATENT DOCUMENTS

| | | | |
|---|---|---|---|
| 9,786,758 | B1 | 10/2017 | Balakrishnan et al. |
| 2003/0116792 | A1 | 6/2003 | Chen et al. |
| 2006/0226495 | A1 | 10/2006 | Kwon |
| 2006/0255330 | A1 | 11/2006 | Chen et al. |
| 2007/0018252 | A1 | 1/2007 | Zhu |
| 2008/0067607 | A1 | 3/2008 | Verhulst et al. |
| 2010/0327319 | A1 | 12/2010 | Iacopi et al. |
| 2012/0104508 | A1 | 5/2012 | Zhu et al. |
| 2013/0082333 | A1 | 4/2013 | Chen et al. |
| 2015/0200288 | A1 | 7/2015 | Zhang et al. |
| 2015/0249143 | A1* | 9/2015 | Sano .................. H01L 27/11582 257/66 |
| 2015/0263094 | A1 | 9/2015 | Diaz et al. |
| 2015/0380555 | A1 | 12/2015 | Ohtou et al. |
| 2016/0049397 | A1 | 2/2016 | Chang et al. |
| 2016/0064541 | A1* | 3/2016 | Diaz .................... H01L 27/092 257/329 |
| 2016/0211368 | A1 | 7/2016 | Chen et al. |
| 2016/0268256 | A1 | 9/2016 | Yang et al. |
| 2016/0293739 | A1 | 10/2016 | Zhang |
| 2016/0315084 | A1 | 10/2016 | Wu et al. |
| 2016/0372316 | A1 | 12/2016 | Yang et al. |
| 2017/0077231 | A1 | 3/2017 | Balakrishnan et al. |
| 2017/0170196 | A1 | 6/2017 | Anderson et al. |
| 2017/0194318 | A1 | 7/2017 | Balakrishnan et al. |
| 2017/0338334 | A1* | 11/2017 | Cheng .............. H01L 21/26506 |
| 2017/0345927 | A1* | 11/2017 | Cantoro ............. H01L 29/7827 |
| 2018/0047832 | A1 | 2/2018 | Tapily et al. |
| 2018/0254322 | A1 | 9/2018 | Cheng et al. |
| 2018/0277676 | A1* | 9/2018 | Basker ............. H01L 29/66553 |
| 2019/0172928 | A1* | 6/2019 | Gluschenkov .... H01L 29/66666 |

FOREIGN PATENT DOCUMENTS

| | | |
|---|---|---|
| CN | 104022121 A | 9/2014 |
| CN | 104103515 A | 10/2014 |
| CN | 104916677 A | 9/2015 |
| CN | 105280705 A | 1/2016 |

(56) References Cited

FOREIGN PATENT DOCUMENTS

CN    106298778 A      1/2017
CN    107706094 A  *   2/2018   ......... H01L 21/0337

OTHER PUBLICATIONS

U.S. Patent Office Action dated Oct. 19, 2018 for U.S. Appl. No. 15/720,913.
U.S. Patent Office Action dated Dec. 27, 2018 for U.S. Appl. No. 15/720,913.
Chinese Patent Office Action dated Oct. 24, 2019 for Chinese Patent Application No. 201710531811.8 (6 pages).
U.S. Patent Office Action dated Sep. 30, 2019 for U.S. Appl. No. 15/720,913 (21 pages).
U.S. Patent Office Action dated Jan. 29, 2021 for U.S. Appl. No. 16/338,169 (23 pages).
U.S. Patent Office Action dated Mar. 1, 2021 for U.S. Appl. No. 16/337,882 (38 pages).
U.S. Patent Office Action dated Aug. 31, 2021 for U.S. Appl. No. 16/337,882 (34 pages).

* cited by examiner

SEMICONDUCTOR DEVICE, METHOD OF MANUFACTURING THE SAME, AND ELECTRONIC DEVICE INCLUDING THE DEVICE

CROSS-REFERENCE TO RELATED APPLICATIONS

This application is a U.S. national phase application of PCT Application No. PCT/CN2017/095124, filed on Jul. 31, 2017, entitled "SEMICONDUCTOR DEVICE, MANUFACTURING METHOD THEREOF, AND ELECTRONIC APPARATUS COMPRISING SAME," which claims priority to Chinese Patent Application No. 201610872541.2, filed on Sep. 30, 2016, entitled "SEMICONDUCTOR DEVICE, METHOD OF MANUFACTURING THE SAME, AND ELECTRONIC DEVICE INCLUDING THE DEVICE," and Chinese Patent Application No. 201710531811.8, filed on Jun. 30, 2017, entitled "SEMICONDUCTOR DEVICE, METHOD OF MANUFACTURING THE SAME, AND ELECTRONIC DEVICE INCLUDING THE DEVICE," which are incorporated herein by reference in their entireties.

TECHNICAL FIELD

The present disclosure relates generally to the semiconductor field, and more particularly, to a vertical semiconductor device, a method of manufacturing the same, and an electronic device including the semiconductor device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, it is generally required to reduce an area occupied by the source, the drain and the gate so as to scale down a footprint of the planar device, which may deteriorate performances of the device (for example, increased power consumption and resistance). Therefore, the area of the planar device is difficult to be further scaled down. In contrast, in a vertical device, a source, a gate and a drain are arranged in a direction substantially perpendicular to a substrate surface. As a result, a footprint of the vertical device is easier to be scaled down compared to the planar device.

SUMMARY

In view of the above, the present disclosure aims to provide, among others, a vertical semiconductor device with improved characteristics, a method of manufacturing the same, and an electronic device including the semiconductor device.

According to an aspect of the present disclosure, there is provided a semiconductor device, comprising: a substrate; a pillar-shaped active region extending vertically on the substrate, wherein the active region comprises a first source/drain region at a lower portion thereof, a second source/drain region at an upper portion thereof, a channel region between the first source/drain region and the second source/drain region and close to a peripheral surface thereof, and a body region inside the channel region; and a gate stack formed around a periphery of the channel region.

According to another aspect of the present disclosure, there is provided a method of manufacturing a semiconductor device, comprising: disposing a stack of a first source/drain layer, a preliminary channel layer, and a second source/drain layer on a substrate; forming a mask layer in a form of grid on the stack, the mask layer comprising body portions at intersections of the grid and bridge portions between the respective body portions; defining, in the stack, a plurality of active regions corresponding to the respective body portions using the mask layer, wherein in each of the active regions, the preliminary channel layer has its periphery recessed with respect to those of the first source/drain layer and the second source/drain layer; forming, in each of the active regions, a channel layer in a recess formed by the periphery of the preliminary channel layer with respect to those of the first source/drain layer and the second source/drain layer; and forming gate stacks around peripheries of the respective channel layers.

According to a further aspect of the present disclosure, there is provided an electronic device comprising an integrated circuit comprising the semiconductor device described above.

According to embodiments of the present disclosure, in the vertical device, the body region is disposed inside the channel region. The body region may be a doped well region, or may contribute to form a quantum well structure. The threshold voltage of the device may be adjusted or changed by the body region. When a bias is applied to the body region, the threshold voltage may be dynamically changed according to the bias.

BRIEF DESCRIPTION OF THE DRAWINGS

The above and other objects, features, and advantages of the present disclosure will become more apparent from following descriptions of embodiments thereof with reference to attached drawings, in which.

Throughout the drawings, the same or similar reference numbers denote like or similar elements.

DETAILED DESCRIPTION

Figure 1A:
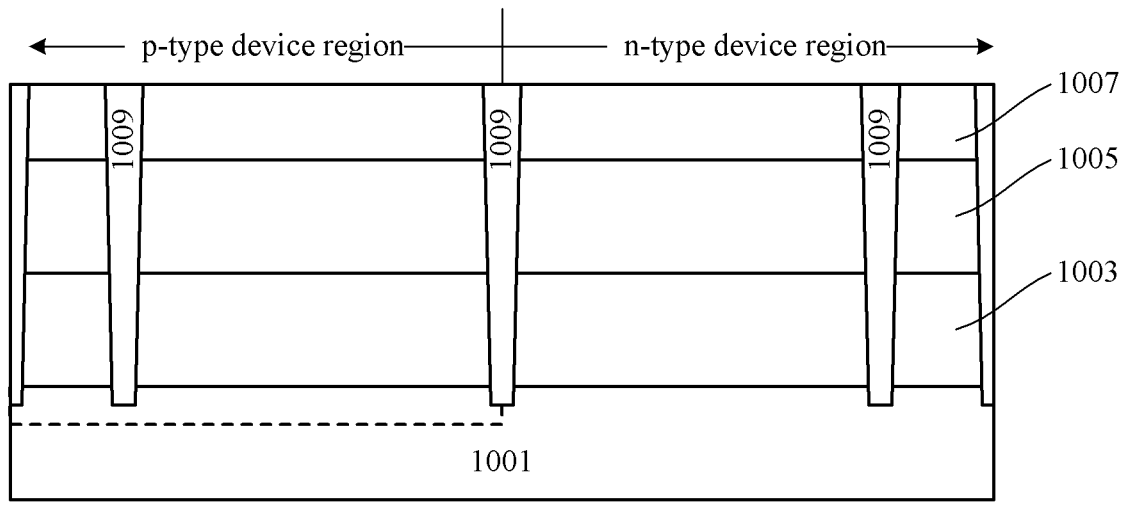
FIGS. 1(*a*) to 30 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/ element interposed therebetween. Further, if a layer/element is "on" a further layer/element in an orientation, then the layer/element can be "below" the further layer/element when the orientation is turned.

A vertical semiconductor device according to an embodiment of the present disclosure may comprise an active region extending vertically on a substrate (for example, in a direction substantially perpendicular to a surface of substrate). The active region may comprise a first source/drain region at a lower portion thereof, a second source/drain region at an upper portion thereof, and a channel region between the first source/drain region and the second source/drain region. For example, such an active region may be implemented by stacking a first source/drain layer, a channel layer, and a second source/drain layer in sequence on the substrate. The respective layers may be contiguous to each other, or may have another semiconductor layer interposed therebetween, for example, a leakage suppression layer or an ON current enhancement layer (i.e., a semiconductor layer having a band gap greater than or less than that of adjacent layers). The first source/drain region may be substantially formed in the first source/drain layer, the second source/drain region may be substantially formed in the second source/drain layer, and the channel region may be substantially formed in the channel layer. For example, the source/drain regions may be implemented by doped regions in the source/drain layers. A gate stack may be formed to surround a periphery of the channel region.

According to an embodiment of the present disclosure, such a semiconductor device may be a conventional Field Effect Transistor (FET). In the case of FET, the first source/drain region and the second source/drain region (or the first source/drain layer and the second source/drain layer) may have the same conductivity type of doping (for example, both n-type doping or p-type doping). A conduction channel may be formed by the channel region between the source and drain regions at opposite ends of the channel region. Alternatively, such a semiconductor device may be a tunneling FET. In the case of tunneling FET, the first source/drain region and the second source/drain region (or the first source/drain layer and the second source/drain layer) may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conduction mechanisms, they both exhibit such an electrical property that the gate controls whether there is a conduction or not between the source and drain regions. Therefore, for both the conventional FET and the tunneling FET, descriptions are made by collectively using the terms "source/drain layer (source/drain region)" and "channel layer (channel region)", although there is no common "channel" in the tunneling FET.

According to an embodiment of the present disclosure, a body region is disposed in the active region, particularly in a portion of the active region facing the channel region. Specifically, the channel region may be a portion of the active region close to its peripheral surface, and the body region may be formed by a portion of the active region inside the channel region. The body region may be doped to form a well region, or may comprise a semiconductor material having a material property different from that of the channel region (so that a quantum well structure may be formed as described below). The well region and the channel region may have different doping properties (generally, the channel region is not intentionally doped or is lightly doped, and the well region may be heavily doped with respect to the channel region), so that there may be a doping interface therebetween. For example, there may be a steep change in doping distribution from the channel region to the well region, so that the well region may form an ultra-steep well structure with respect to the channel region. The channel region faces the gate stack, to have the channel or conduction path therein controlled by the gate stack to be on or off. The body region is located inside the channel region, and thus may affect the channel region (and thus a threshold voltage of the device). A bias may be applied to the body region to dynamically control the threshold voltage.

In order to configure the body region, the channel layer may comprise, for example, a first semiconductor material and a second semiconductor material formed around a periphery of the first semiconductor material. Thus, the body region may be substantially formed in the first semiconductor material, and the channel region may be substantially formed in the second semiconductor material. The body region may or may not be doped. Further, a gate dielectric in the gate stack, the channel region (or the second semiconductor material), and the body region (or the first semiconductor material) may form a quantum well structure. The first semiconductor material and the second semiconductor material may be formed and/or doped separately, and thus may have different doping properties and/or different material properties (for example, different energy band properties for the purpose of forming the quantum well) as desired in a relatively easier way.

The first semiconductor material may have its periphery recessed inwards with respect to those of the first and second source/drain layers, and the second semiconductor material may be formed in a recess formed by the periphery of the first semiconductor material with respect to those of the first and second source/drain layers. Thus, the channel region formed in the second semiconductor material may be self-aligned with the body region formed in the first semiconductor material.

Further, the channel layer, as a whole, may be recessed inwards with respect to the peripheries of the first and second source/drain layers. In this way, the formed gate stack may be embedded in the recess of the channel layer with respect to the first and second source/drain layers, to reduce or even avoid overlap with the source/drain regions, and thus contribute to reduced parasitic capacitance between the gate and the source/drain.

The second semiconductor material may form a heterojunction with respect to at least one of the first source/drain layer, the second source/drain layer, and the first semiconductor material. Due to this heterojunction, it is possible to improve the device performances, for example, carrier mobility. For an n-type device, a concentration of electrons in the second semiconductor material may be greater than that in the first semiconductor material when the device is ON; or for a p-type device, a concentration of holes in the second semiconductor material may be greater than that in the first semiconductor material when the device is ON. For example, for the n-type device, a conduction band energy level in the second semiconductor material is lower than that in the first semiconductor material; or for the p-type device, a valence band energy level in the second semiconductor material is higher than that in the first semiconductor material. With such an energy band configuration, carriers (electrons or holes) may be substantially confined in the second semiconductor material, i.e., the channel region.

According to an embodiment of the present disclosure, the first source/drain region and the second source/drain region may be formed respectively at portions of the first source/drain layer and the second source/drain layer close to their respective peripheral surfaces. The first source/drain region and the second source/drain region may be connected by the channel region (or the second semiconductor material). Doping of the source/drain regions may move partially into ends of the channel region (or the second semiconductor material) close to the respective source/drain regions. This helps reducing resistance between the source/drain regions and the channel region when the device is ON, thereby improving the device performances.

According to an embodiment of the present disclosure, a gate length may be determined by a thickness of the channel layer itself, rather than depending on etching timing as in the conventional art. The channel layer may be formed by, for example, epitaxial growth, and thus the thickness thereof can be well controlled. Therefore, the gate length can be well controlled.

The channel layer may comprise a single-crystalline semiconductor material, to improve the device performances. Certainly, the first and second source/drain layers may also comprise a single-crystalline semiconductor material. In this case, the single-crystalline semiconductor material of the channel layer and the single-crystalline semiconductor material of the source/drain layers may have the same crystal structure.

According to an embodiment of the present disclosure, the channel layer (including the first semiconductor material and the second semiconductor material) may comprise a semiconductor material different from those of the first and second source/drain layers. Thus, it facilitates processing the channel layer by, for example, selective etching, to cause the channel layer to be recessed with respect to the first source/drain layer and the second source/drain layer. Further, the first source/drain layer and the second source/drain layer may comprise the same semiconductor material.

For example, the first source/drain layer may be a semiconductor layer epitaxially grown on the substrate, the channel layer may be a semiconductor layer epitaxially grown on the first source/drain layer, and the second source/drain layer may be a semiconductor layer epitaxially grown on the channel layer. Since the respective layers are epitaxially grown, there may be a clear crystalline interface between at least some adjacent layers. Further, the respective layers may be doped separately, and then there may be a doping concentration interface between at least some adjacent layers.

According to an embodiment of the present disclosure, the active region of the device may be rectangular or square in the top view. The active region in this shape may be manufactured relatively easily and accurately by the cross Spacer Image Transfer (xSIT) technique proposed in the present disclosure.

Such a semiconductor device can be manufactured, for example, as follows. Specifically, a stack of a first source/drain layer, a preliminary channel layer, and a second source/drain layer may be disposed on a substrate. As described above, the first source/drain layer may be epitaxially grown on the substrate, the preliminary channel layer may be epitaxially grown on the first source/drain layer, and the second source/drain layer may be epitaxially grown on the preliminary channel layer, to form the stack. During the epitaxial growth, a thickness of each of the grown layers, particularly the preliminary channel layer, may be controlled.

For the first source/drain layer, the preliminary channel layer, and the second source/drain layer which are stacked, active regions may be defined therein. For example, the respective layers may be selectively etched in sequence into a desired shape. Generally, each of the active regions may have a pillar shape (for example, a hexahedral pillar having a square or rectangular cross section). According to an embodiment of the present disclosure, the active regions may be defined here using a mask layer in a form of grid. For example, the mask layer may comprise body portions at intersections of the grid and bridge portions between the respective body portions. The body portions may define positions and shapes of the respective active regions, and the bridge portions may contribute to support the pillar-shaped active regions during fabrication to reduce the risk of their collapse. For example, the pattern of the mask layer may be transferred into the underlying stack, and portions of the stack corresponding to the bridge portions may be removed to obtain separate pillar-shaped active regions. In order to facilitate connecting source/drain regions formed in the first source/drain layer in subsequent processes, the etching of the first source/drain layer may be directed only to an upper portion of the first source/drain layer, so that a lower portion of the first source/drain layer may extend beyond a periphery of the upper portion. A periphery of the preliminary channel layer may be recessed inwards with respect to those of the first and second source/drain layers to define a space in which a channel layer and a gate stack are to be accommodated. For example, this can be done by selective etching. Then, a channel layer (in which channel regions are to be formed) may be formed in a recess formed by the periphery of the preliminary channel layer with respect to those of the first source/drain layer and the second source/drain layer, and the gate stack may be formed to surround a periphery of the channel layer. The gate stack may be embedded in the recess described above.

The preliminary channel layer may be doped into a certain conductivity type to subsequently form a well region. For example, this can be done by in-situ doping while growing the preliminary channel layer, or by driving dopants into the preliminary channel layer. Certainly, the preliminary channel layer may be undoped, but have its material appropriately selected (according to, for example, its energy band property) to subsequently form a heterojunction or a well wall portion of a quantum well.

Source/drain regions may be formed in the first and second source/drain layers. For example, this can be done by doping the first and second source/drain layers. For example, ion implantation, plasma doping, or the like may be performed. According to a preferable embodiment, a position holder layer may be formed in the recess formed by the periphery of the preliminary channel layer with respect to those of the first and second source/drain layers, then a dopant source layer may formed on surfaces of the first and second source/drain layers, and dopants may be driven by, for example, annealing, from the dopant source layer into the first and second source/drain layers. Advantageously, the dopants may move into only portions of the first and second source/drain layers close to their respective peripheral surfaces. The position holder layer may prevent the dopants in the dopant source layer from moving into the preliminary channel layer. In addition, heat treatment may be performed to drive some dopants from the source/drain layers into the channel layer, particularly its ends.

According to an embodiment of the present disclosure, the mask layer in the form of grid may be formed by the xSIT technique. For example, a preliminary mask layer may be formed on the substrate. A plurality of first strip-shaped patterns extending in a first direction may be formed on the preliminary mask layer, and first spacers extending in the first direction may be formed on sidewalls of the plurality of first strip-shaped patterns. Similarly, a plurality of second strip-shaped patterns extending in a second direction crossing (for example, perpendicular to) the first direction may be formed on the preliminary mask layer having the first strip-shaped patterns and the first spacers formed thereon, and second spacers extending in the second direction may be formed on sidewalls of the plurality of second strip-shaped patterns. The body portions described above may be defined by intersection portions of (the first strip-shaped patterns+ the first spacers) and (the second strip-shaped patterns+the second spacers), and the bridge portions described above may be defined by portions of the first strip-shaped patterns or the second strip-shaped patterns extending between the respective intersection portions. For example, the first spacers may be selectively etched using the second strip-shaped patterns and the second spacers as a mask. Thus, portions of the first spacers at the intersection portions are left, while other portions of the first spacers are removed. The second spacers may then be removed. The remaining portions of the first strip-shaped patterns, the second strip-shaped patterns, and the first spacers form a grid pattern, which may be transferred into the preliminary mask layer to obtain the grid mask layer.

The technology of the present disclosure can be implemented in various ways, some of which are exemplified in the following with reference to the drawings.

Figure 1B:
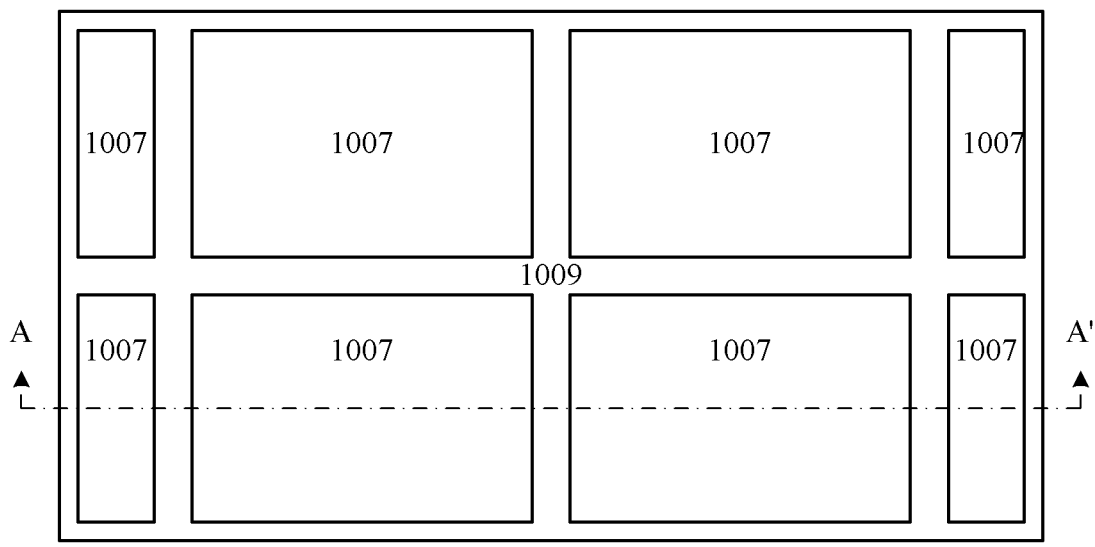

FIGS. 1(a) to 30 are schematic views showing a flow of manufacturing a semiconductor device according to an embodiment of the present disclosure As shown in FIGS. 1(a) and 1(b) (FIG. 1(a) is a sectional view, and FIG. 1(b) is a top view with line AA' indicating the location where the sectional view of FIG. 1(a) is taken), a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description. Here, a p-type silicon wafer is provided as the substrate 1001. In this example, a scenario where both an n-type device and a p-type device are formed on the substrate 1001 is described by way of example. Thus, the substrate 1001 may comprise a p-type device region in which the p-type device is to be formed and an n-type device region in which the n-type device is to be formed.

According to an embodiment of the present disclosure, a heterojunction structure may be advantageously formed. In order to improve the quality of other semiconductor material layers which are to be grown, a buffer layer 1003 may be formed on the substrate 1001 by, for example, epitaxial growth. In this example, the buffer layer 1003 may comprise $Si_{1-x}Ge_x$ (where x is between 0 and 1). The buffer layer 1003 is relaxed at least at the top thereof.

A preliminary channel layer 1005 and another semiconductor layer 1007 may be formed in sequence on the buffer layer 1003 by, for example, epitaxial growth. For example, the preliminary channel layer 1005 may comprise $Si_{1-y}Ge_y$ (where y is between 0 and 1), with a thickness of about 10-100 nm, and the other semiconductor layer 1007 may comprise $Si_{1-z}Ge_z$ (where z is between 0 and 1), with a thickness of about 20-50 nm. Here, the preliminary channel layer 1005 may comprise components which are different from those of the buffer layer 1003 and the other semiconductor layer 1007 (or y is different from x and z), in order to achieve etching selectivity. The buffer layer 1003 may have the same components as those of the other semiconductor layer 1007 (or x=z), or may have different components from those of the other semiconductor layer 1007.

Certainly, the materials for the respective semiconductor layers are not limited thereto. For example, the buffer layer 1003, the preliminary channel layer 1005, and the semiconductor layer 1007 each may comprise a group IV semiconductor material or a group III-V compound semiconductor material, for example, one of Ge, SiGeSn, GeSn, GaAs, InGaAs, InP, AlGaAs, InAlAs, InAs, InGa, InAlGa, GaN, InSb, InGaSb, or a combination thereof.

The preliminary channel layer 1005 may be doped to a certain extent to form well regions later. For example, such doping may be performed by ion implantation into the preliminary channel layer 1005 or in-situ doping while growing the preliminary channel layer 1005. If an n-type device is to be formed, p-type doping may be performed (using, for example, B or In impurities with a concentration of about $5E17$-$2E19$ cm$^{-3}$), or if a p-type device is to be formed, n-type doping may be performed (using, for example, As or P impurities with a concentration about $1E17$-$2E19$ cm$^{-3}$). In addition, in order to reduce the influence of doping in the well regions on the channel layer and improve the short channel effects of the device, the doping concentration in the well region may decrease as a distance to the gate stack decreases.

Further, a well region may be formed below the preliminary channel layer 1005 (for example, in the substrate 1001 and the buffer layer 1003). Since the substrate 1001 is a p-type silicon wafer, there is no need for a separate well region in the n-type device region. For the p-type device region, an n-type well region (shown by broken lines in the figure) may be formed by ion implantation.

Further, Shallow Trench Isolations (STI) 1009 may be formed on the substrate 1001 to define an extent of the respective active regions of the respective devices. As shown in the top view in FIG. 1(b), in this example, four device regions are shown. However, the present disclosure is not limited thereto, and there may be more or fewer device regions. In addition, body contact regions are provided beside the device regions, as will be described in further detail below.

Next, the active regions may be defined. Here, the active regions may be defined using a grid mask. As described above, such a grid mask may be manufactured by the xSIT technique.

Figure 2A:
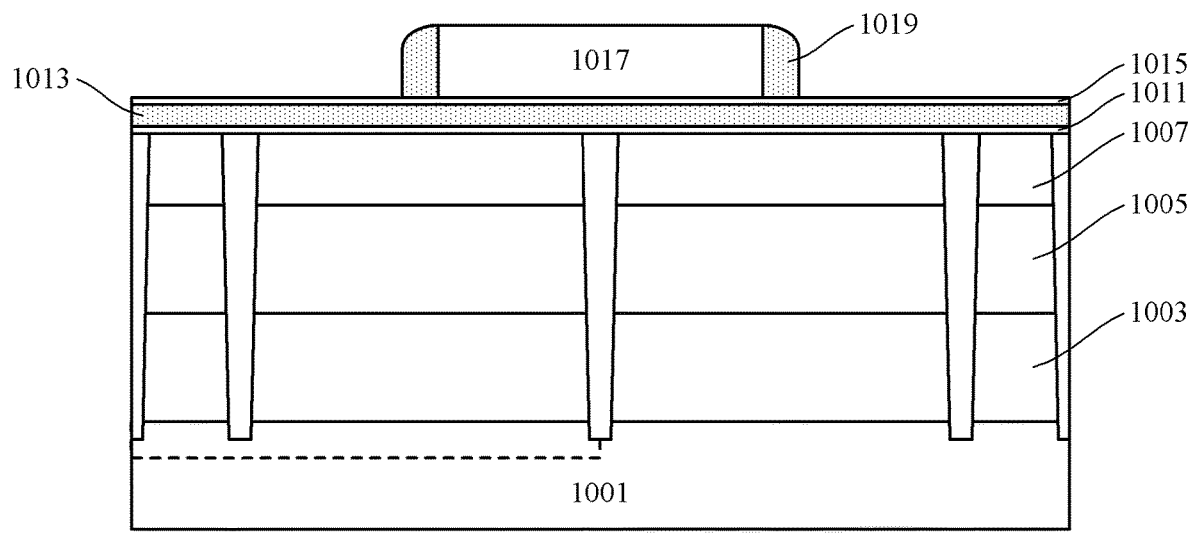
Figure 2B:
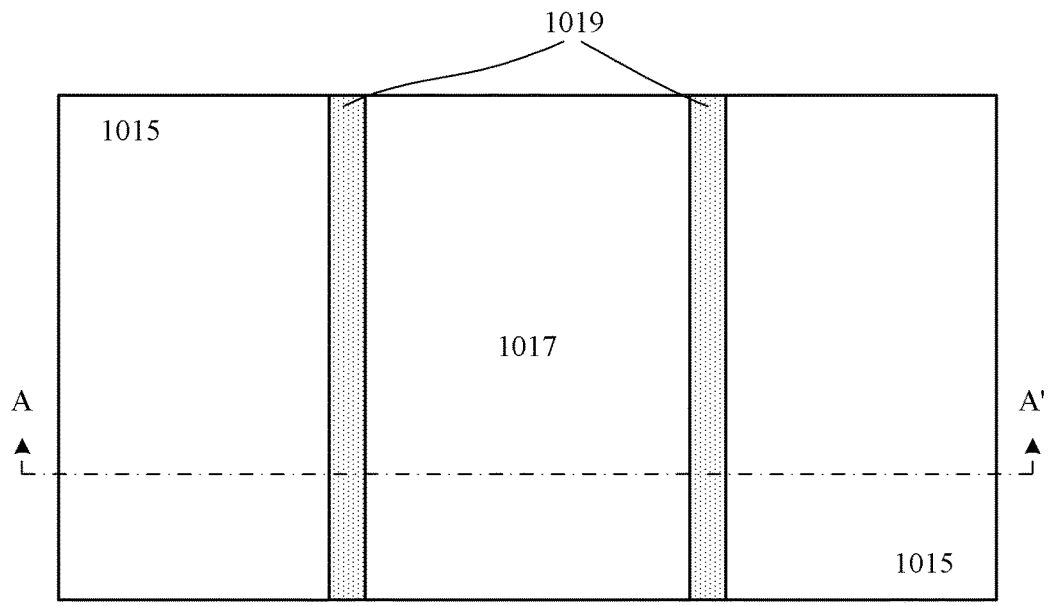

For example, as shown in FIGS. 2(a) and 2(b) (FIG. 2(a) is a sectional view, and FIG. 2(b) is a top view with line AA' indicating the location where the sectional view of FIG. 2(a) is taken), a preliminary mask layer may be formed on the structure shown in FIGS. 1(a) and 1(b). Here, the preliminary mask layer may comprise a stack of oxide 1011 (with a thickness of, for example, about 2-10 nm)-nitride 1013 (with a thickness of, for example, about 10-50 nm)-oxide 1015 (with a thickness of, for example, about 2-10 nm). Such a mask layer in a form of stack is common per se, in which the nitride layer 1013 mainly functions as a mask, and the oxide layers 1011 and 1015 mainly function as etching stopper or the like.

First strip-shaped patterns extending in a first direction (for example, a vertical direction in the figure) may be formed on the preliminary mask layer. To this end, an auxiliary pattern 1017 may be formed by, for example, deposition. For example, the auxiliary pattern 1017 may comprise amorphous silicon or polycrystalline silicon. The auxiliary pattern 1017 may be planarized by, for example, Chemical Mechanical Polishing (CMP). The auxiliary pattern 1017 may be patterned so that its sidewalls extend in the first direction and opposite sidewalls are in active regions of different devices respectively. The first strip-shaped patterns 1019 in a form of spacer may be formed on the sidewalls of the auxiliary pattern 1017 by a spacer formation process. The first strip-shaped patterns 1019 may define one dimension (length or width) of bridge portions of the grid mask. The spacers 1019 may comprise nitride, with a width of about 10-50 nm. For example, a nitride layer may be deposited in a substantially conformal manner and the deposited nitride is subjected to Reactive Ion Etching (ME) in a direction substantially perpendicular to a surface of the substrate. The RIE may be stopped at the oxide 1015 to remove horizontally extending portions of the nitride layer while leaving vertically extending portions thereof, so as to obtain the spacers or the first strip-shaped patterns 1019.

Figure 3A:
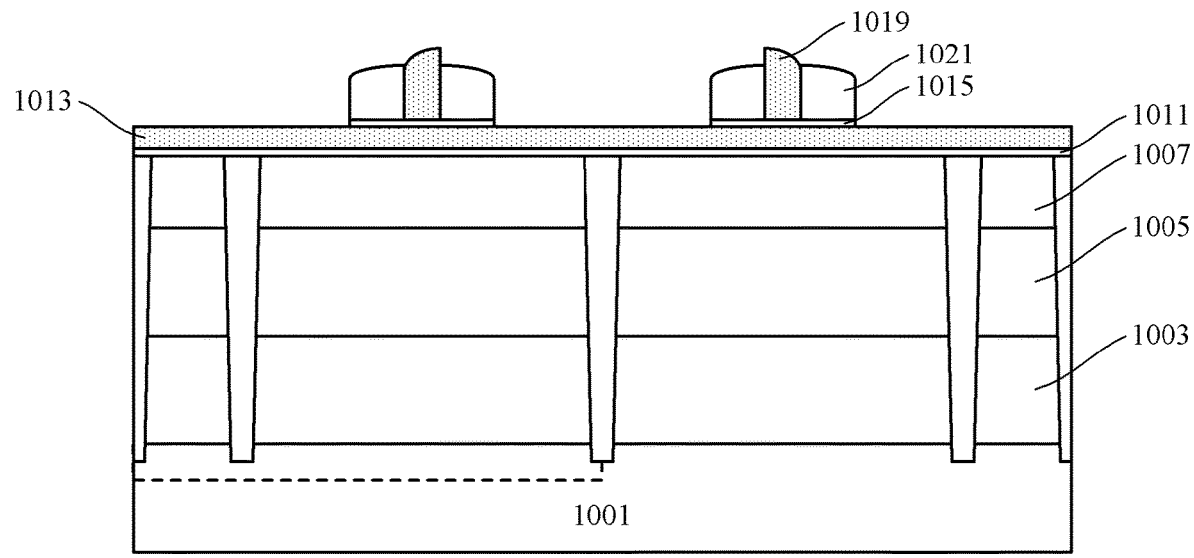
Figure 3B:
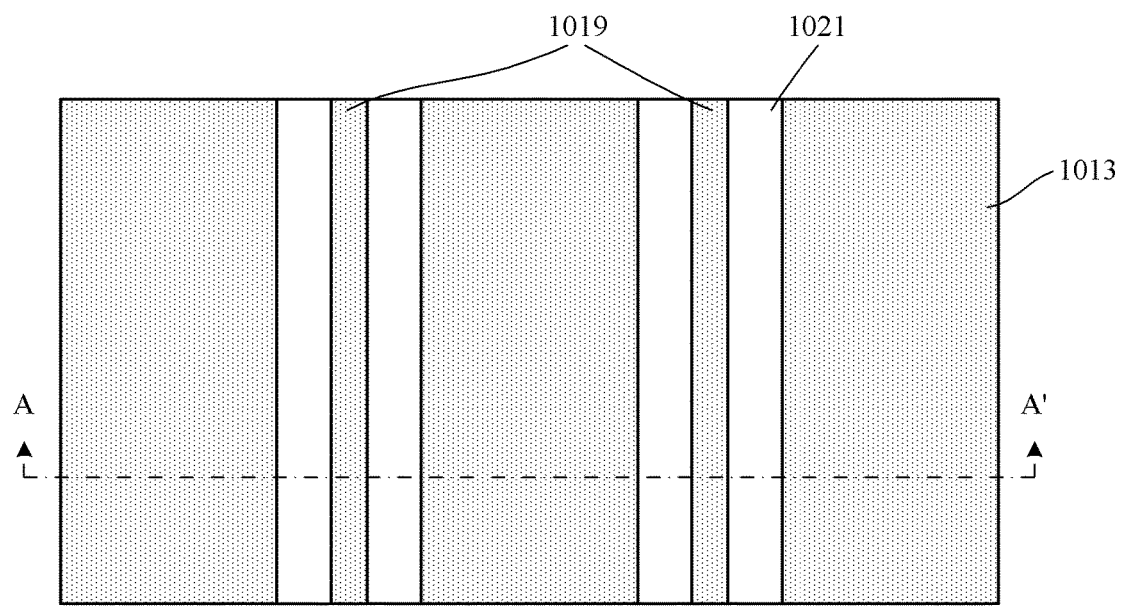
Figure 4A:
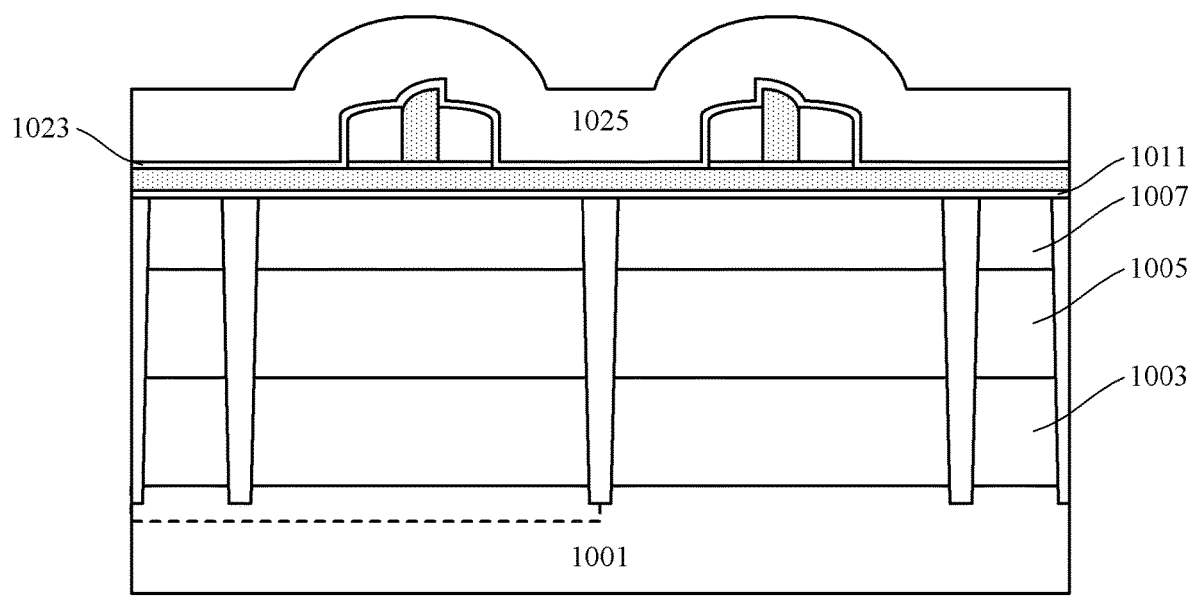
Figure 4B:
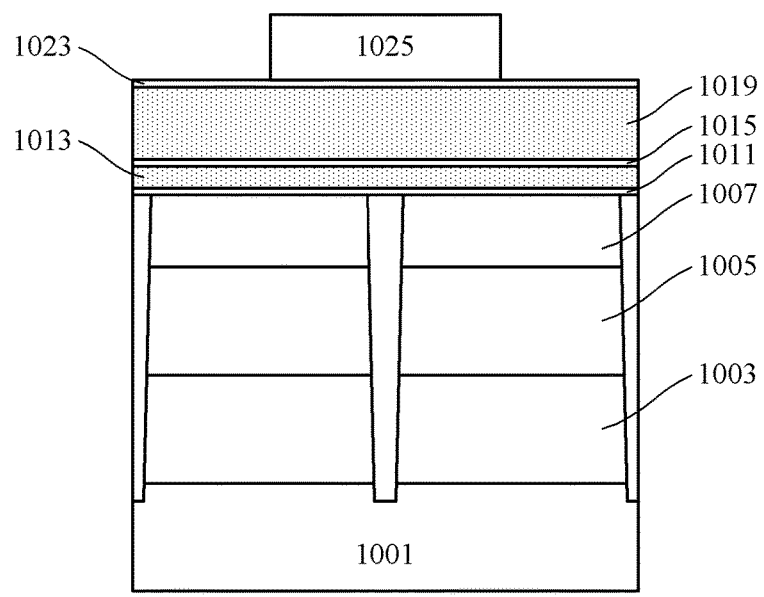
Figure 4C:
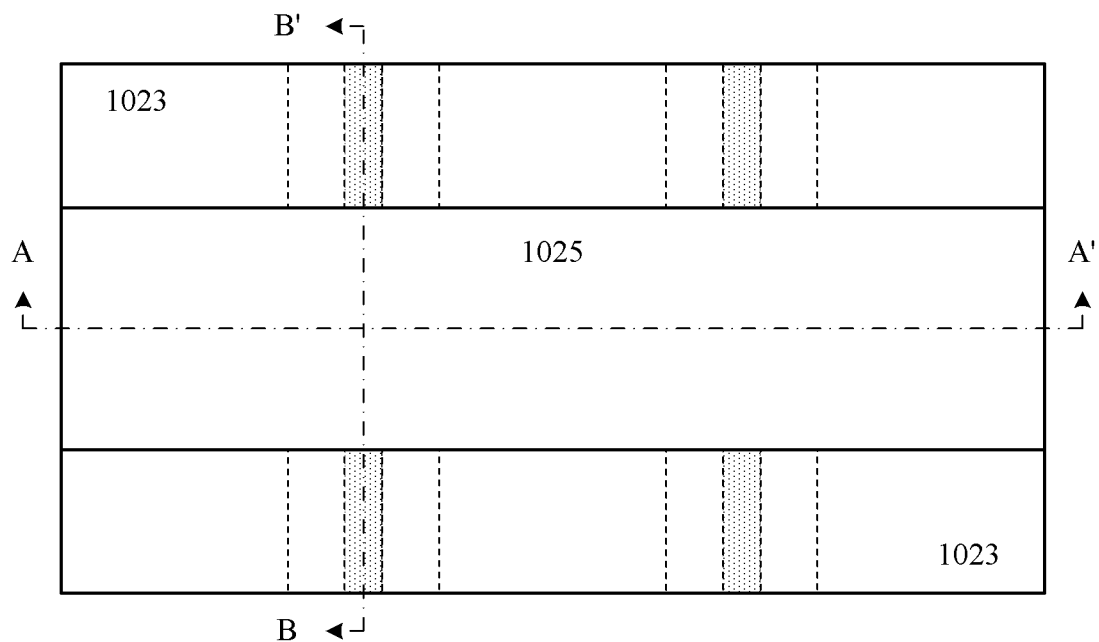

Then, as shown in FIGS. 3(*a*) and 3(*b*) (FIG. 3(*a*) is a sectional view, and FIG. 3(*b*) is a top view with line AA' indicating the location where the sectional view of FIG. 3(*a*) is taken), the auxiliary pattern 1017 may be removed by selective etching such as ME. Thus, the first strip-shaped patterns 1019 extending in the first direction are left on the preliminary mask layer. First spacers 1021 may be formed on sidewalls of the respective first strip-shaped patterns 1019 by a spacer formation process. For example, the first spacers 1021 may comprise oxide, with a width of about 10-50 nm. In the example in which the first spacers 1021 comprise oxide, portions of the oxide layer 1015 in the preliminary mask layer except for those remaining below the first strip-shaped patterns and the first spacers may be removed during the formation of the first spacers 1021. The first strip-shaped patterns 1019, together with the respective first spacers 1021 on opposite sides thereof, define one dimension (length or width) of body portions of the grid mask.

Then, the other dimension (width or length) of the body portions and the bridge portions of the grid mask may be defined in a similar manner.

To this end, second strip-shaped patterns extending in a second direction (for example, a horizontal direction in the figure) crossing the first direction may be formed on the preliminary mask layer. The second strip-shaped patterns can be formed in the same process as the first strip-shaped patterns. For example, as shown in FIGS. 4(*a*), 4(*b*) and 4(*c*) (FIGS. 4(*a*) and 4(*b*) are sectional views, and FIG. 4(*c*) is a top view with lines AA' and BB' indicating the locations where the sectional views of FIGS. 4(*a*) and 4(*b*) are taken, respectively), an auxiliary pattern 1025 may be formed on the structure shown in FIGS. 3(*a*) and 3(*b*) by, for example, deposition. For example, the auxiliary pattern 1025 may comprise amorphous silicon or polycrystalline silicon. The auxiliary pattern 1025 may be planarized by, for example, CMP. The auxiliary pattern 1025 may be patterned so that its sidewalls extend in the second direction and opposite sidewalls thereof are in active regions of different devices respectively.

In addition, a thin oxide layer 1023 may be formed by, for example, deposition, before the auxiliary pattern 1025 is formed, for the purpose of etching stop or the like.

Figure 5A:
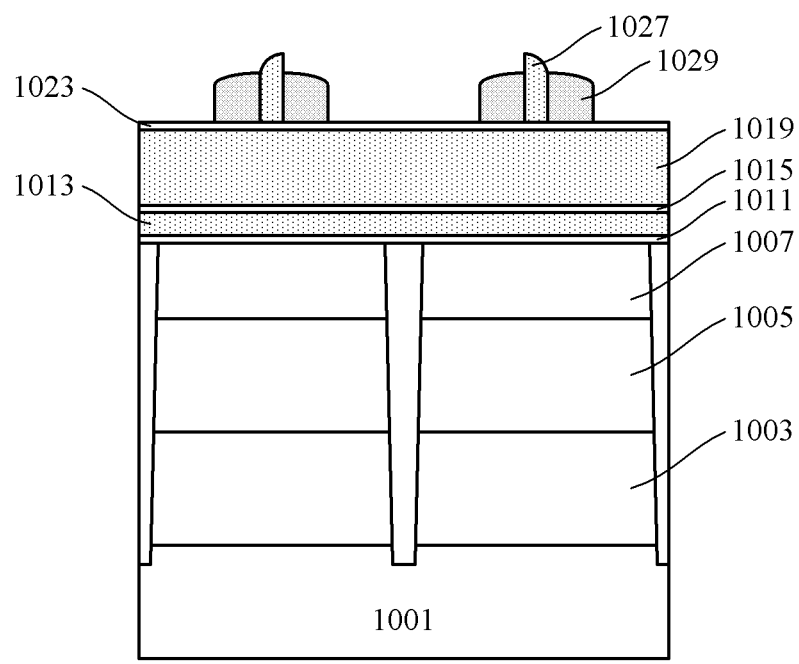
Figure 5B:
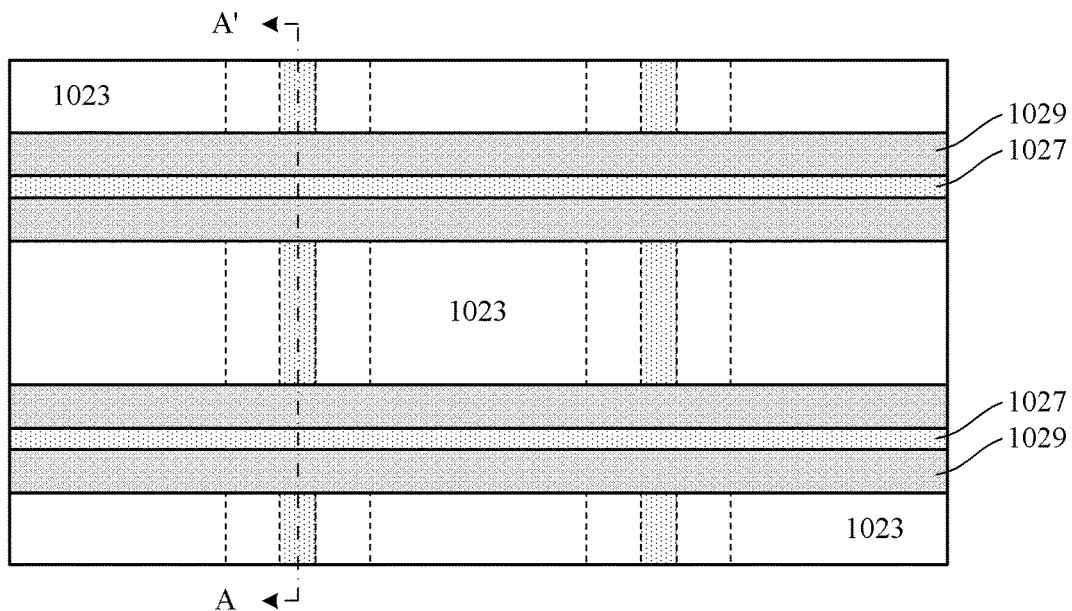
Figure 6A:
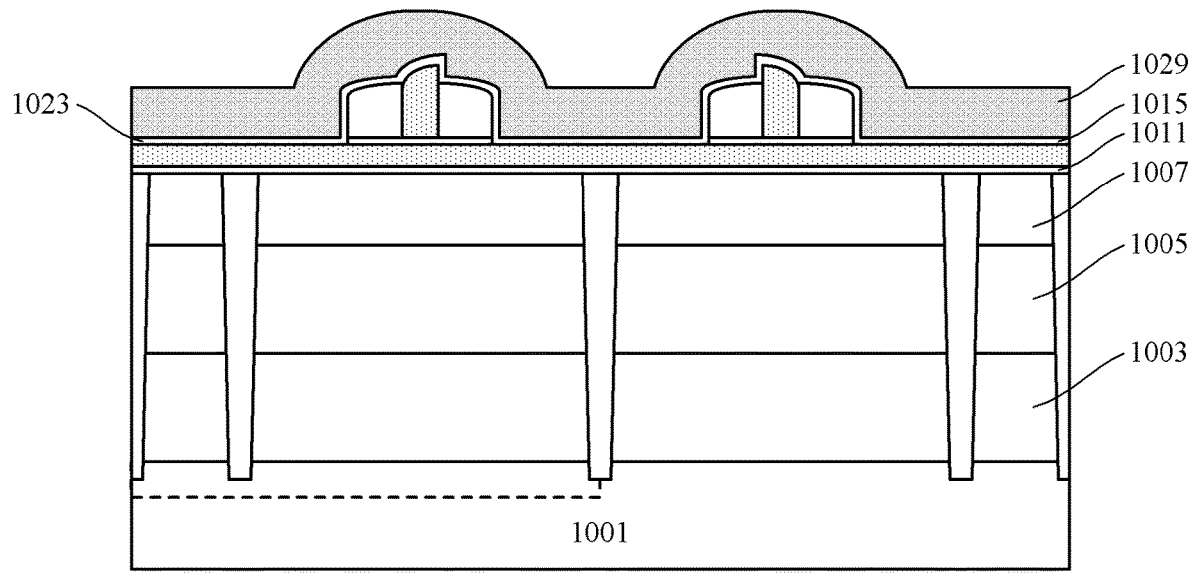
Figure 6B:
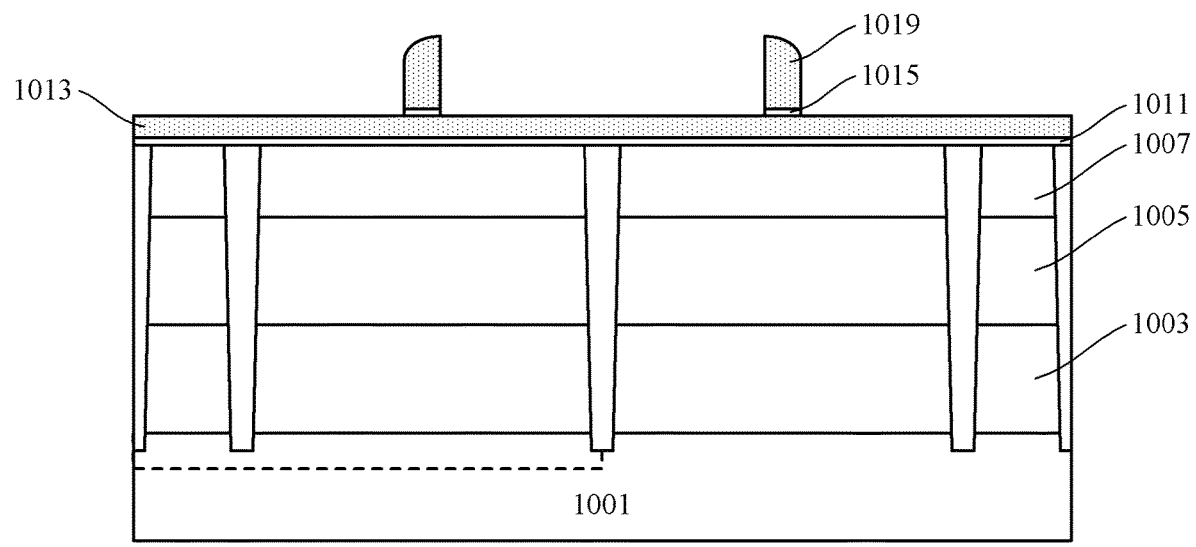
Figure 6C:
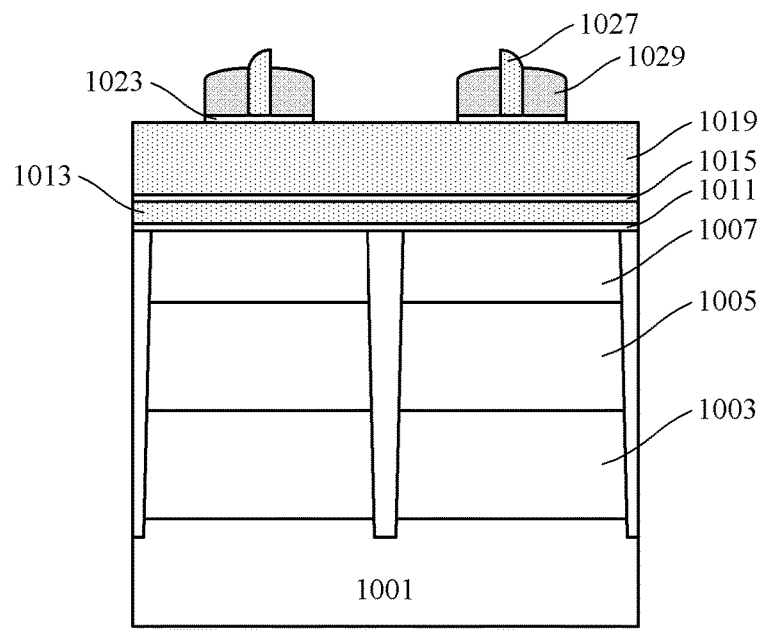
Figure 6D:
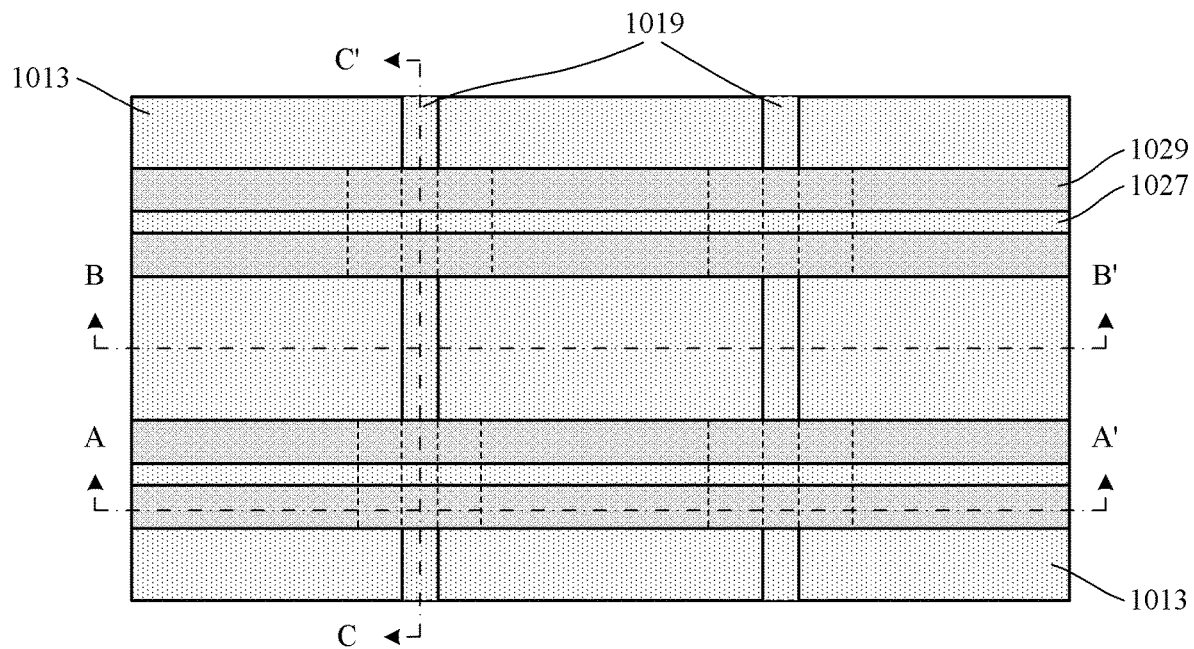
Figure 7A:
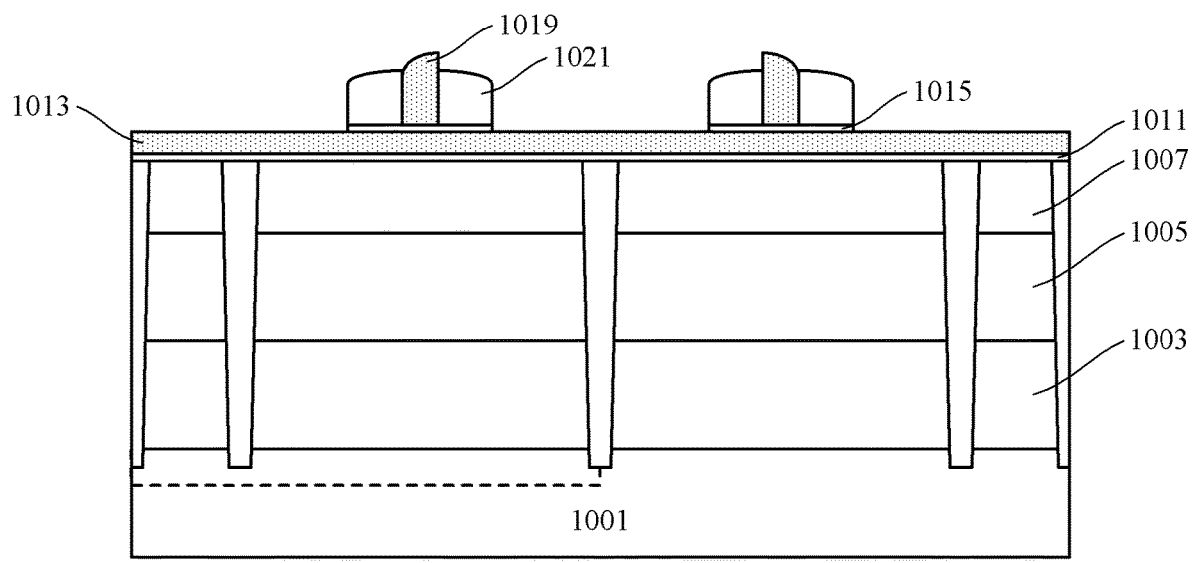
Figure 7B:
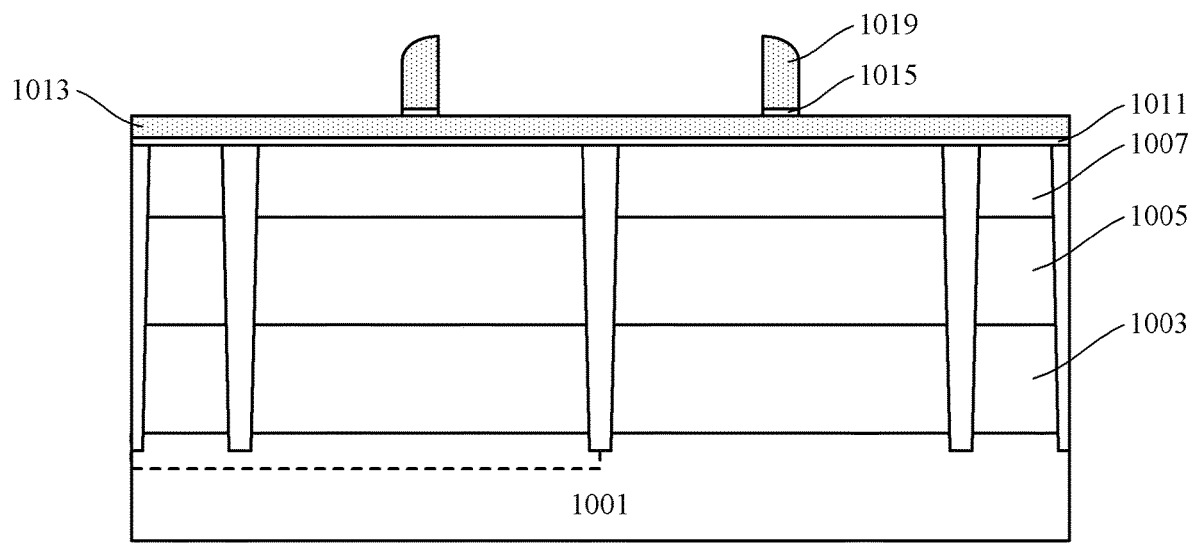
Figure 7C:
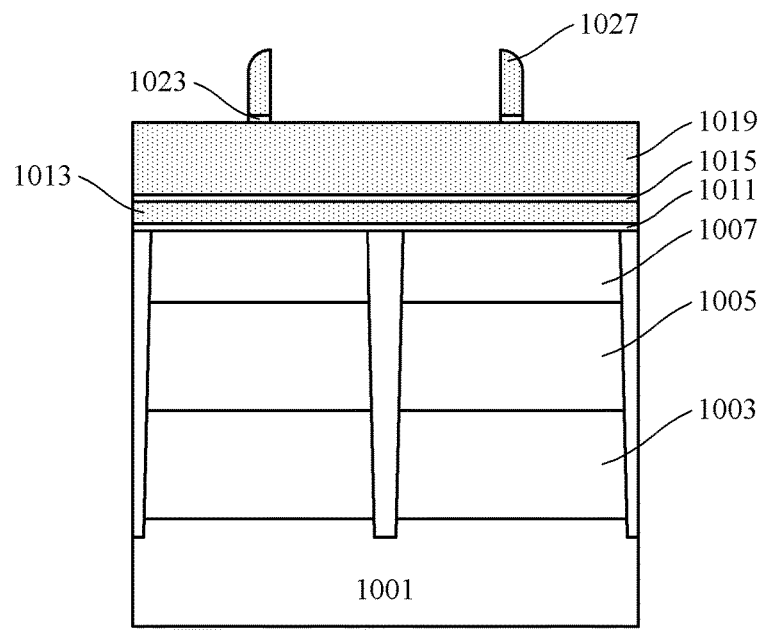
Figure 7D:
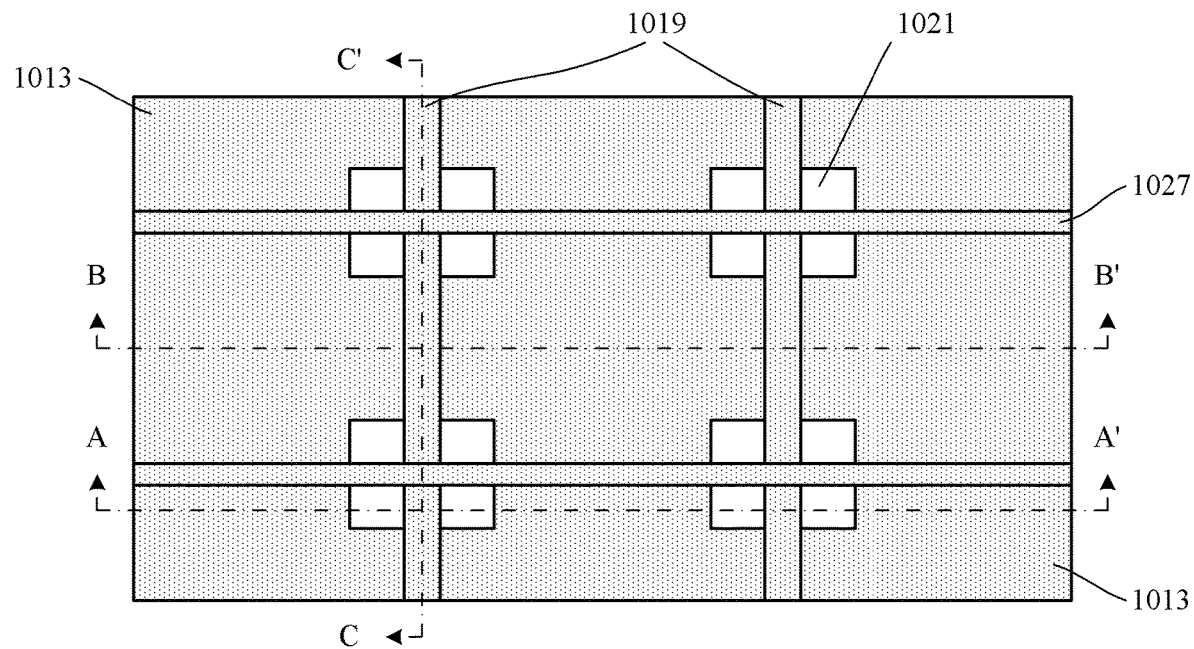

Then, as shown in FIGS. 5(*a*) and 5(*b*) (FIG. 5(*a*) is a sectional view, and FIG. 5(*b*) is a top view with line AA' indicating the location where the sectional view of FIG. 5(*a*) is taken), second strip-shaped patterns 1027 in a form of spacer may be formed on sidewalls of the auxiliary pattern 1025 by a spacer formation process. The second strip-shaped patterns 1027 may define the other dimension (width or length) of the bridge portions of the grid mask. The spacers 1027 may comprise nitride, with a width of about 10-50 nm. After that, the auxiliary pattern 1025 may be removed by selective etching such as RIE. Thus, the second strip-shaped patterns 1027 extending in the second direction are left on the preliminary mask layer. Second spacers 1029 may be formed on sidewalls of the second strip-shaped patterns 1027 by a spacer formation process. For example, the second spacers 1029 may comprise polycrystalline silicon or amorphous silicon, with a width of about 10-50 nm. The second strip-shaped patterns 1027, together with the respective second spacers 1029 on opposite sides thereof, define the other dimension (width or length) of the body portions of the grid mask.

Then, the first spacers may be selectively etched using the second strip-shaped patterns and the second spacers as a mask. For example, as shown in FIGS. 6(*a*)-6(*d*) (FIGS. 6(*a*)-6(*c*) are sectional views, and FIG. 6(*d*) is a top view with lines AA', BB' and CC' indicating the locations where the sectional views of FIGS. 6(*a*)-6(*c*) are taken respectively), the oxide layer 1023 may be removed to expose the underlying first spacers 1021, and the first spacers 1021 may be selectively etched by, for example, RIE. This can be done by one same RIE step because the first spacers 1021 also comprise oxide in this example. Thus, portions of the first spacers 1021 which intersect (the second strip-shaped patterns 1027+the second spacers 1029) are left, as shown by dashed boxes in FIG. 6(*d*). Then, as shown in FIGS. 7(*a*)-7(*d*) (FIGS. 7(*a*)-7(*c*) are sectional views, and FIG. 7(*d*) is a top view with lines AA', BB' and CC' indicating the locations where the sectional views of FIGS. 7(*a*)-7(*c*) are taken respectively), the second spacers 1029 may be removed by selective etching such as RIE.

In addition, portions of the oxide layer 1023 which were originally below the second spacers 1029 (as shown in FIG. 6(*c*)) may be exposed due to the removal of the second spacers 1029. In order to facilitate the subsequent patterning of the nitride layer 1013 in the preliminary mask layer, the exposed oxide layer 1023 may be further selectively etched by, for example, RIE, after the second spacers 1029 are removed, to remove the oxide layer 1023. The RIE may be stopped at the nitride layer to expose the underlying nitride layer 1013. Here, the RIE is performed to a small extent (since the oxide layer 1023 is thin), and thus has substantially no influence on the spacers 1021 of oxide.

As shown in the top view in FIG. 7(*d*), a grid pattern has been formed. The pattern may then be transferred into the preliminary mask layer to define the active regions.

As shown in the top view in FIG. 7(*d*), portions of the nitride layer 1013 in the preliminary mask layer except for those below the grid pattern are exposed. Thus, as shown in FIGS. 8(*a*)-8(*d*) (FIGS. 8(*a*)-8(*c*) are sectional views, and FIG. 8(*d*) is a top view with lines AA', BB' and CC' indicating the locations where the sectional views of FIGS. 8(*a*)-8(*c*) are taken respectively), the nitride layer 1013 in the preliminary mask layer may be patterned by, for example, RIE, using the pattern as a mask, to transfer the pattern into the nitride layer 1013. The RIE may be stopped at the underlying oxide layer 1011. In this example, it is assumed that heights of the first pattern 1019 and the second pattern 1027 (which also comprise nitride) are greater than a thickness of the nitride layer 1013, and thus, after the nitride layer 1013 is subjected to the ME, some portions of the first pattern 1019 and the second pattern 1027 may remain, and are labeled by 1019' and 1027', respectively.

Then, the patterns above the preliminary mask layer may be removed, and the preliminary mask layer having the grid pattern transferred thereon is left, which is then a mask layer for defining the active regions.

Figure 8A:
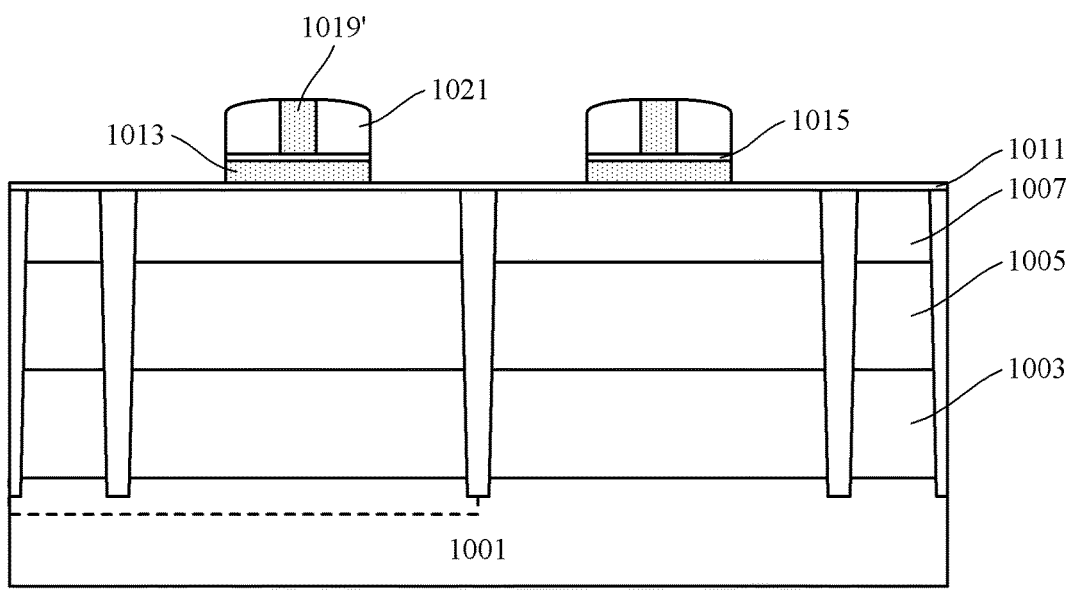
Figure 8B:
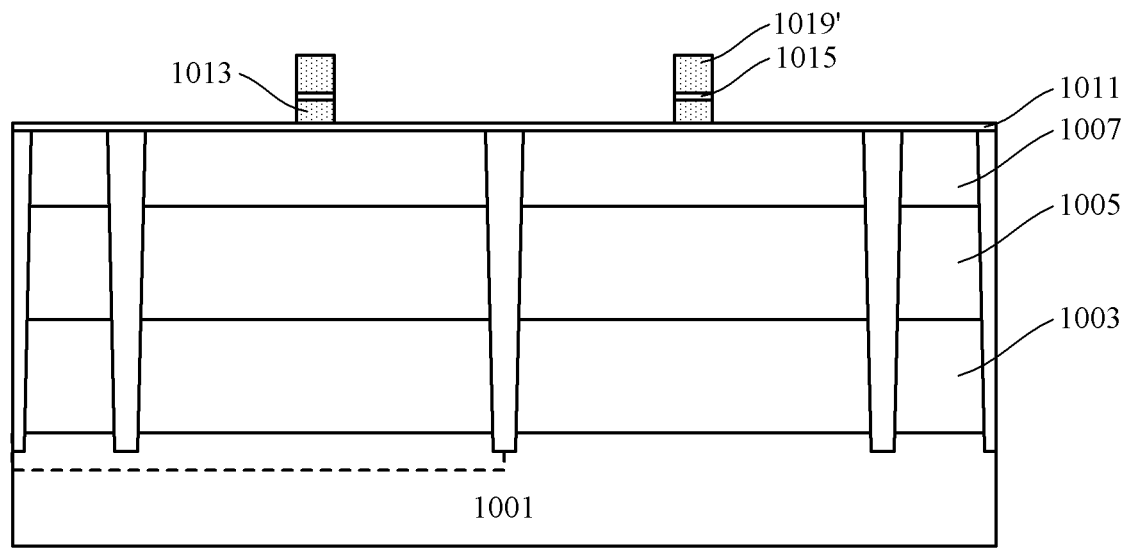
Figure 8C:
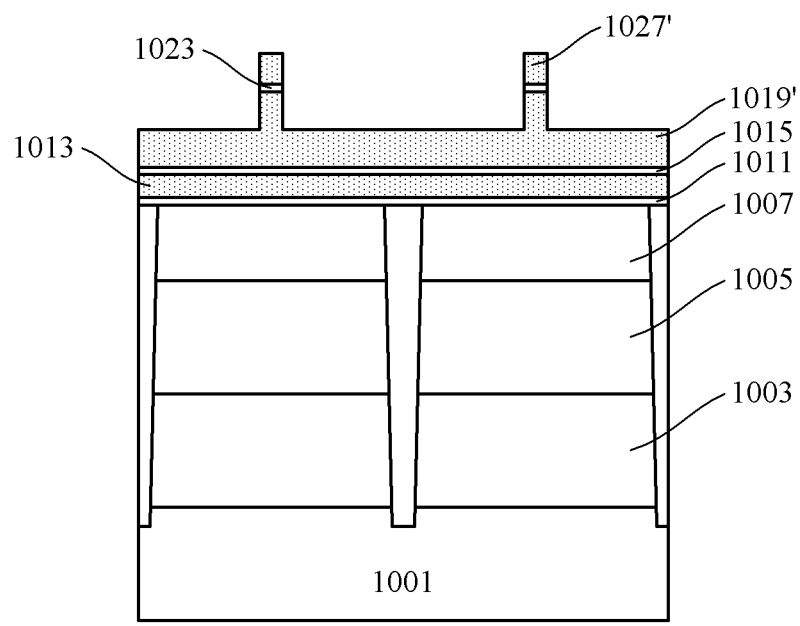
Figure 8D:
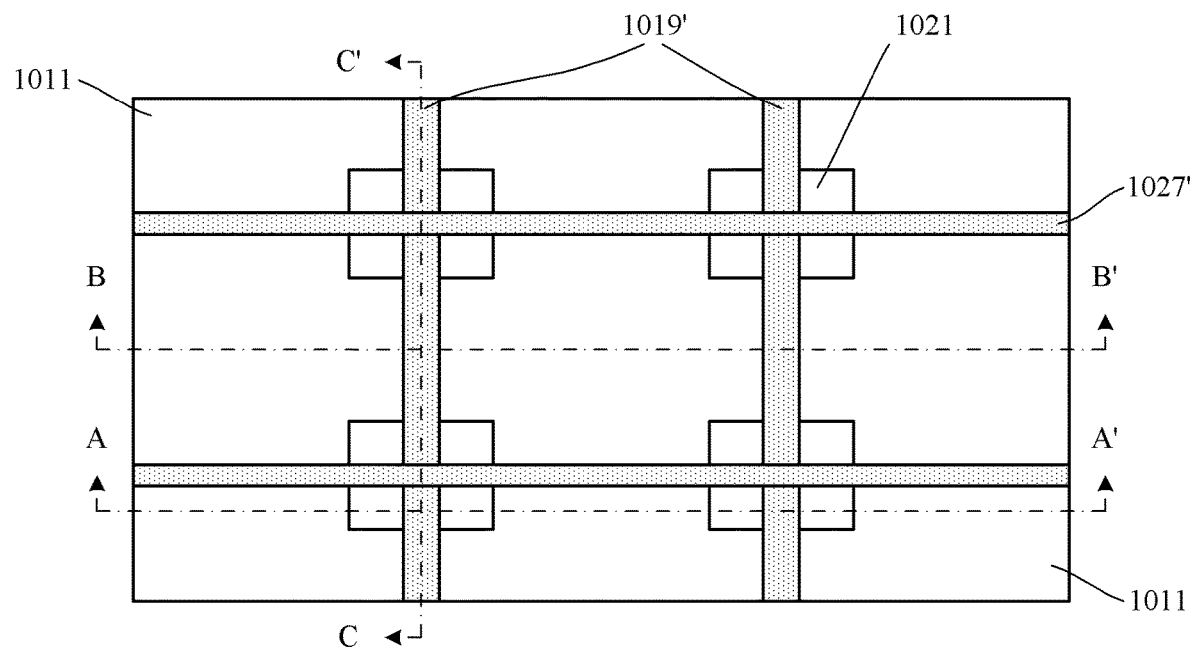
Figure 9A:
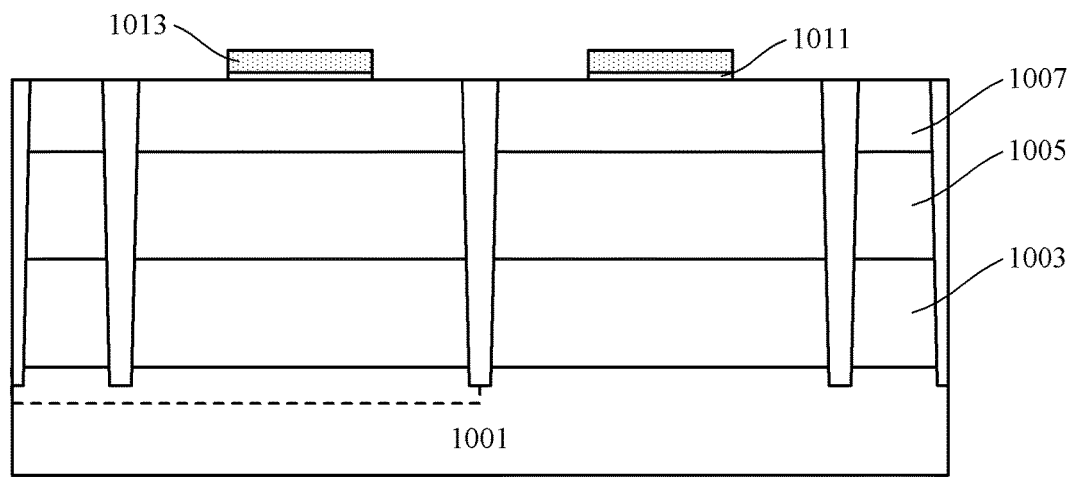
Figure 9B:
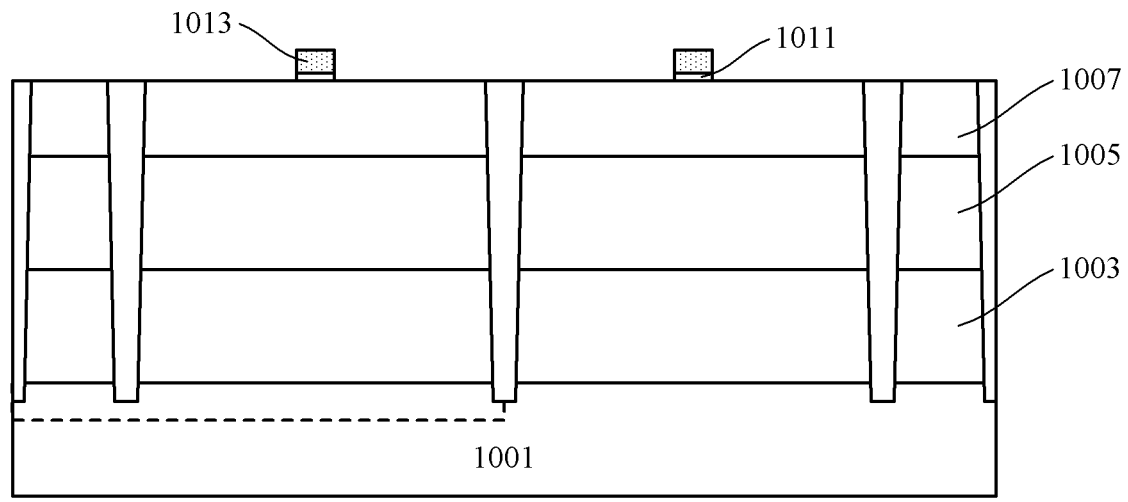
Figure 9C:
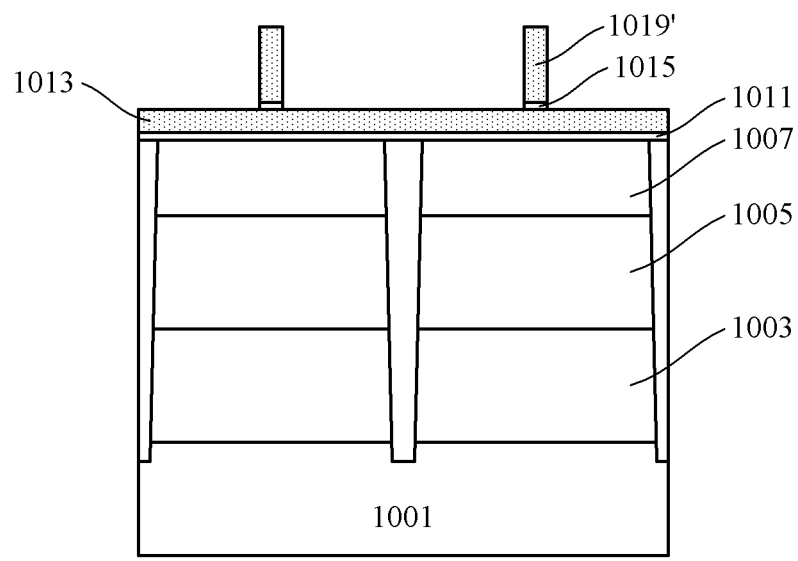
Figure 9D:
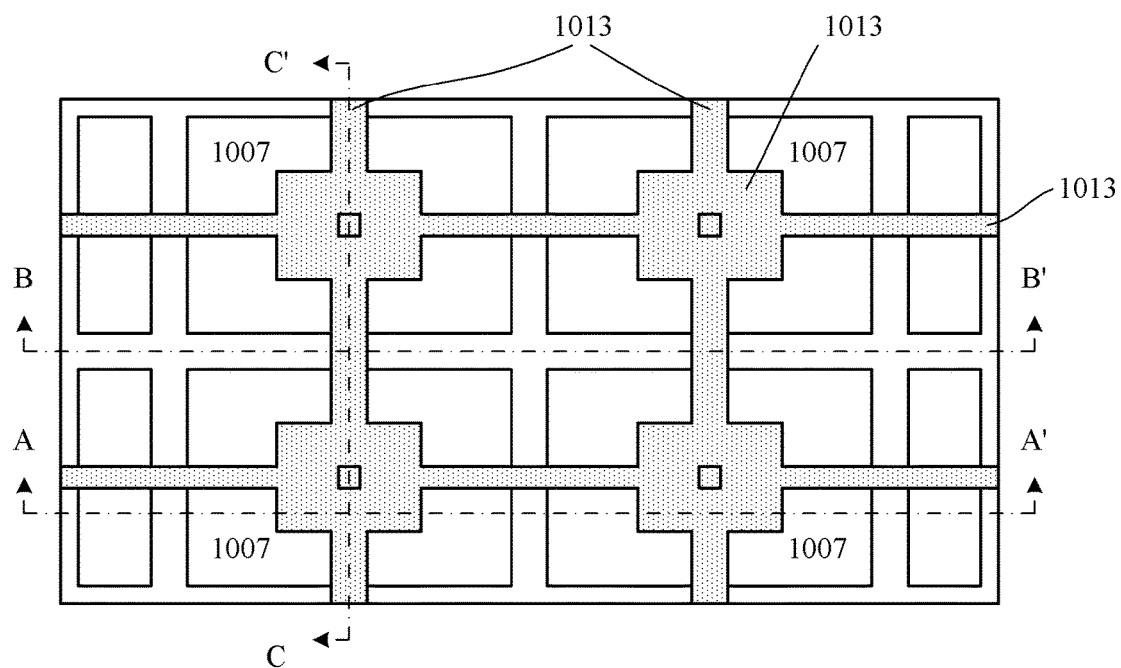

As shown in FIGS. 9(a)-9(d) (FIGS. 9(a)-9(c) are sectional views, and FIG. 9(d) is a top view with lines AA', BB' and CC' indicating the locations where the sectional views of FIGS. 9(a)-9(c) are taken respectively), the nitride may be selectively etched by, for example, RIE, so that the second spacers 1027' of nitride and portions of the first spacers 1019' of nitride except for those intersecting the respective second spacers 1027' (since there is the oxide layer 1023 on the top of the portions of the first spacers 1019' intersecting the respective second spacers 1027' as shown in FIG. 8(c)) may be removed. Then, the oxide may be selectively etched by, for example, RIE, so that the spacers 1021 of oxide may be removed and a surface of the semiconductor layer 1007 is exposed. As shown in FIG. 9(d), the nitride layer 1013 is left in a grid shape. Here, some portions of the spacers 1019' (as described above, portions of the first spacers 1019 which intersect the second spacers 1027) may remain. The remaining portions of the spacers 1019', each in a needle shape, do not affect the progress of subsequent processes and are difficult to survive in various etching steps such as RIE, and thus will not be shown in the following figures.

As shown in the top view of FIG. 9(d), the grid mask layer 1013 is formed. In the grid mask, the body portions (portions corresponding to the intersection portions in a shape of rectangle or square as described above) are wider than the bridge portions between the respective body portions (portions corresponding to the first strip-shaped patterns or the second strip-shaped patterns between the respective body portions). Note that the grid pattern is not necessarily symmetrical. The active regions may then be defined using the mask layer.

Figure 10A:
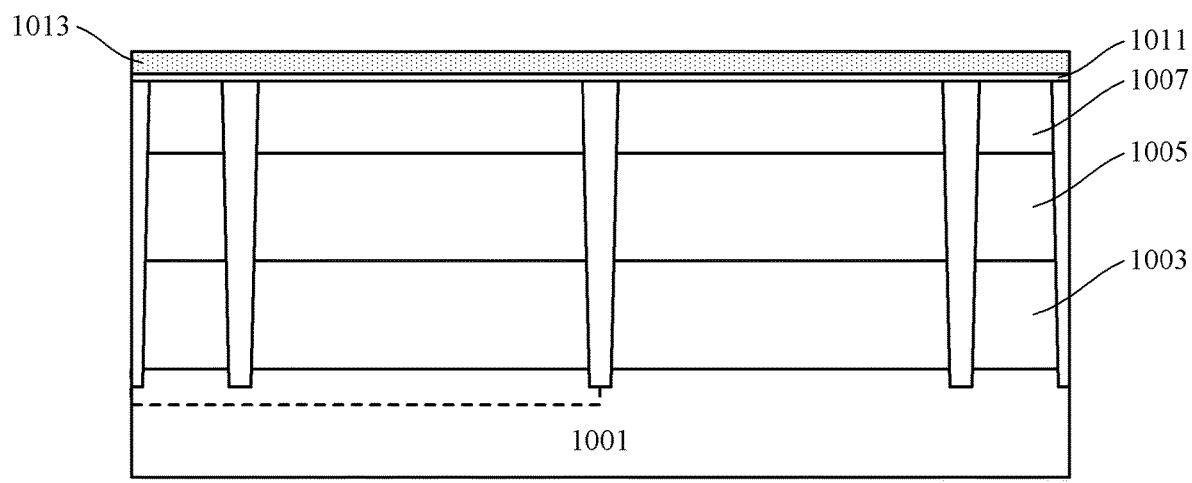
Figure 10B:
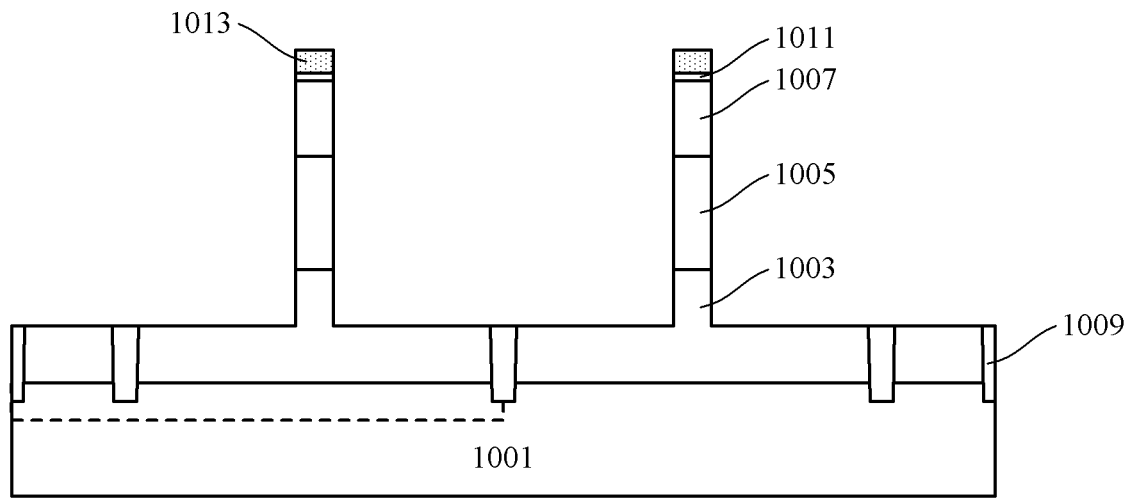
Figure 10C:
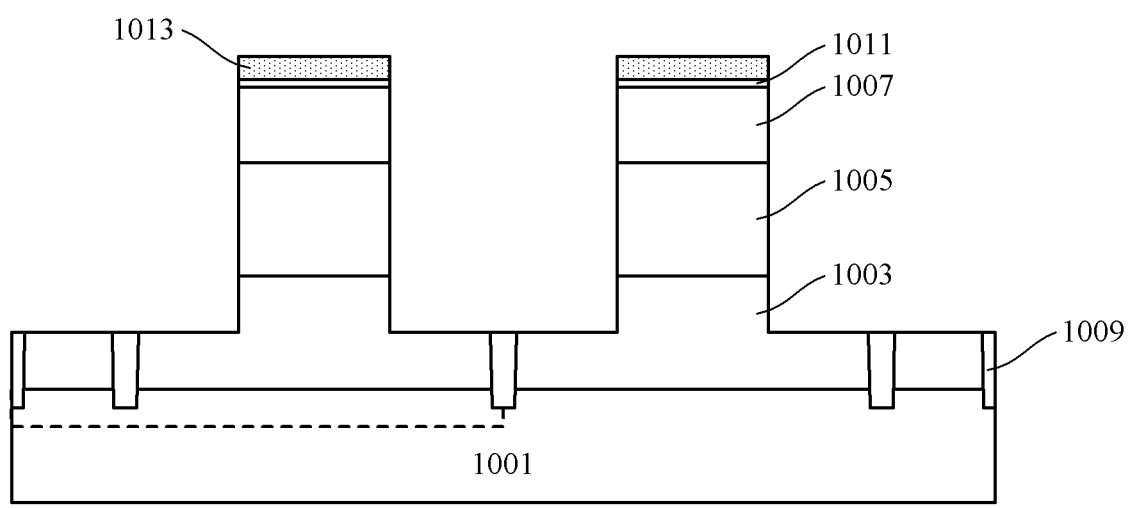
Figure 10D:
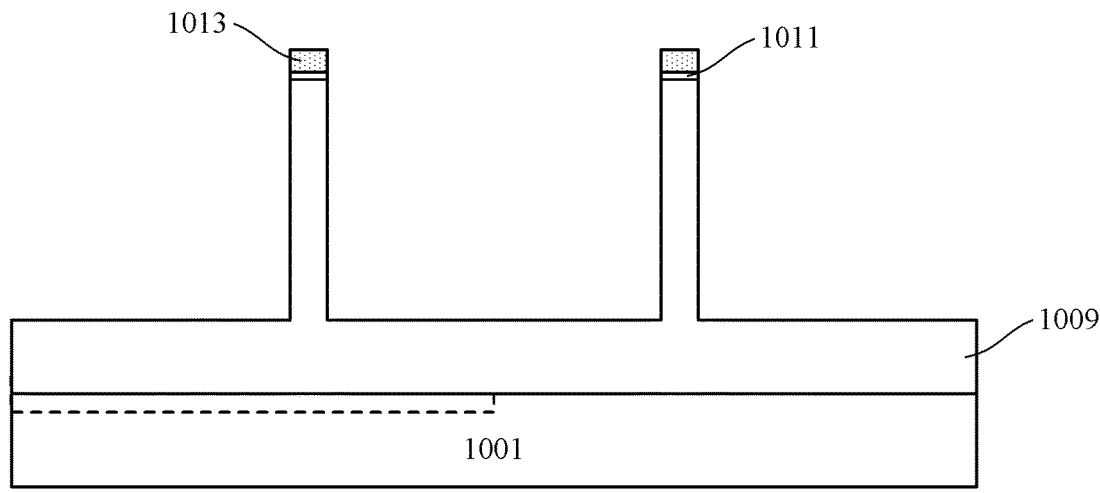
Figure 10E:
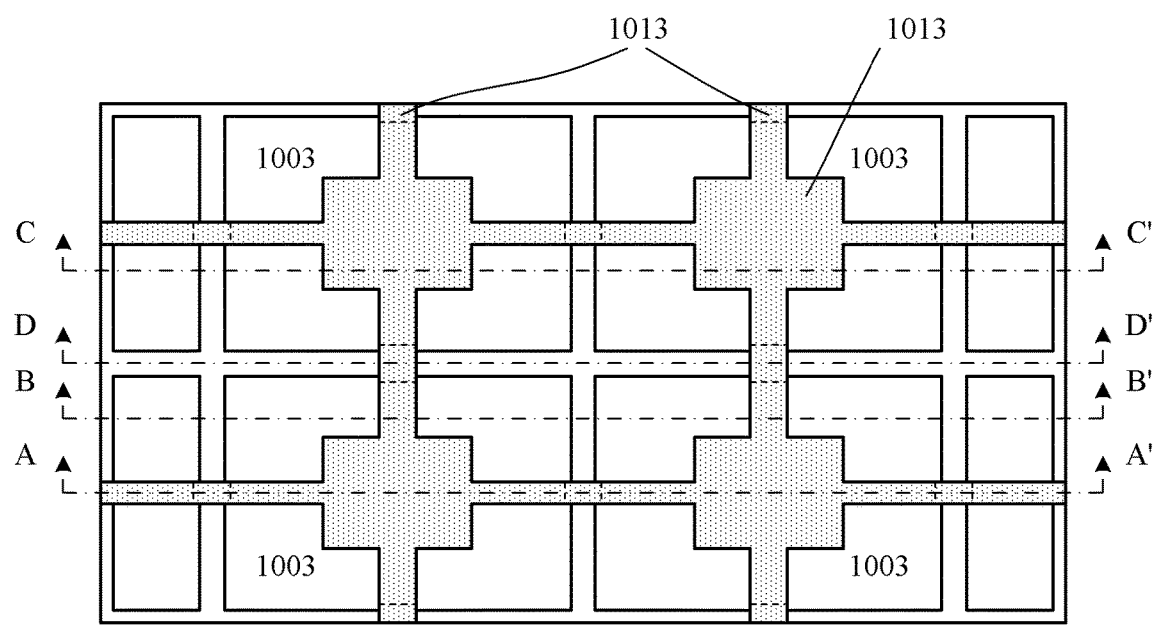

As shown in FIGS. 10(a)-10(e) (FIGS. 10(a)-10(d) are sectional views, and FIG. 10(e) is a top view with lines AA', BB', CC' and DD' indicating the locations where the sectional views of FIGS. 10(a)-10(d) are taken respectively), the semiconductor layer 1007, the preliminary channel layer 1005, and the buffer layer 1003 may be selectively etched in sequence by, for example, RIE, using the mask layer as a mask. The etching proceeds into the buffer layer 1003, but does not proceed to a bottom surface of the buffer layer 1003. Thus, pillar-shaped stacks (corresponding to the body portions of the mask layer) of the semiconductor layer 1007, the preliminary channel layer 1005, and the buffer layer 1003 are left in the respective device regions defined by the STIs 1009. The RIE may be performed in, for example, a direction substantially perpendicular to the substrate surface, so that the pillars are also substantially perpendicular to the substrate surface. In addition, there are also bridge portions (corresponding to the bridge portions of the mask layer) which extend outwards from respective sides of the respective pillar-shaped stacks. These bridge portions contribute to structural support. In addition, the exposed STIs 1009 may be further selectively etched by, for example, RIE, to reduce their heights to a level close to a surface of the etched buffer layer 1003.

Figure 11A:
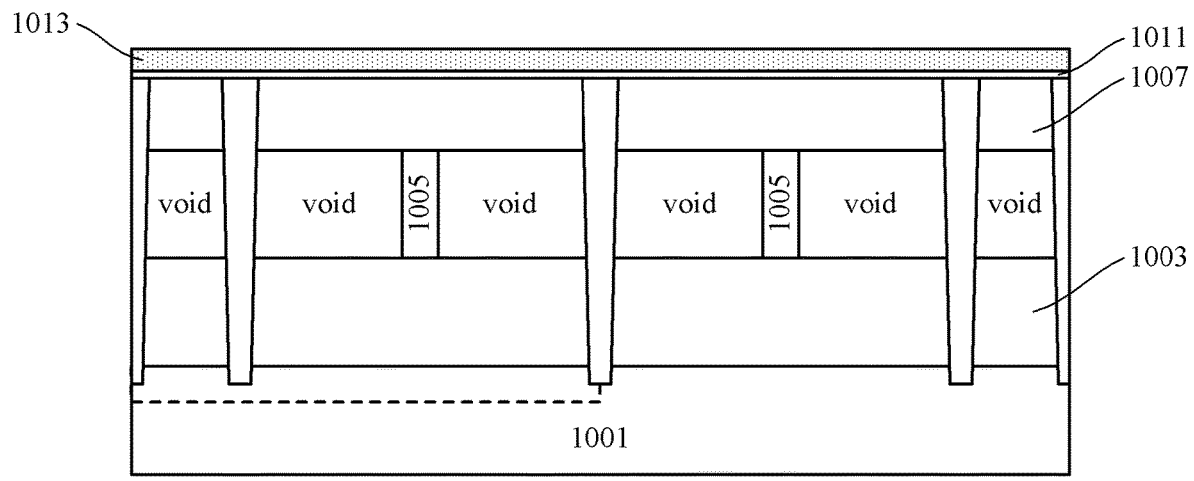
Figure 11B:
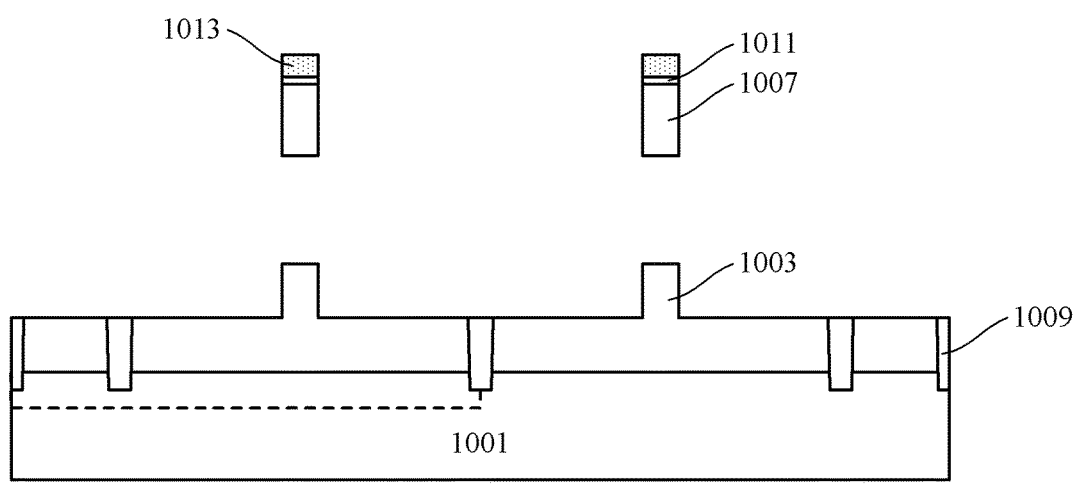
Figure 11C:
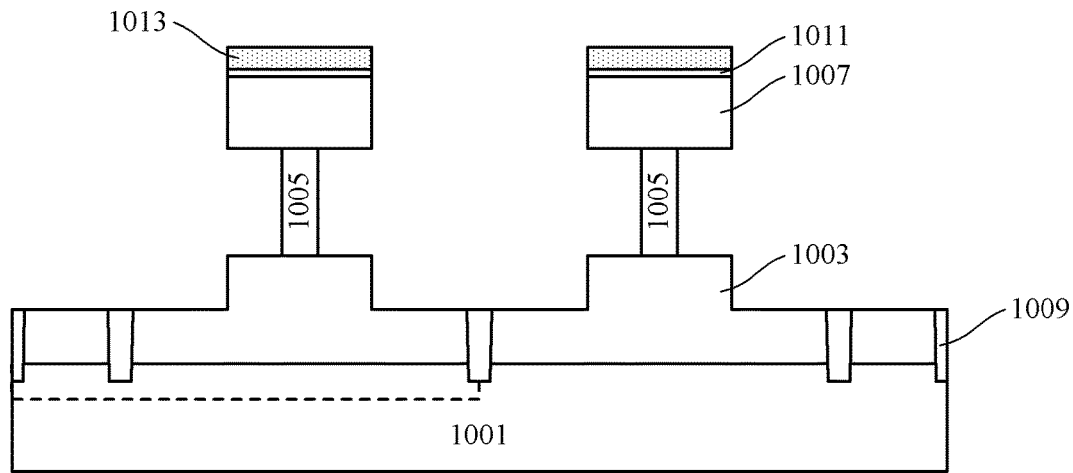

Then, as shown in FIGS. 11(a)-11(c) (FIGS. 11(a)-11(c) correspond to the cross sections along lines AA', BB' and CC' in FIG. 10(e) respectively), a periphery of the preliminary channel layer 1005 may be recessed with respect to those of the buffer layer 1003 and the semiconductor layer 1007 (in this example, in a lateral direction substantially parallel to the substrate surface). For example, this may be done by further selectively etching the preliminary channel layer 1005 with respect to the buffer layer 1003 and the semiconductor layer 1007. This selective etching may be performed by Atomic Layer Etching (ALE), digital etching or the like. Here, the etching is performed to such a sufficient extent that portions of the preliminary channel layer 1005 corresponding to the bridge portions are removed. Thus, separation of the channel layer between the respective devices is achieved. As a result, portions of the preliminary channel layer 1005 corresponding to the body portions may be left (but having their respective peripheries retracted with respect to those of the respective body portions of the mask layer), which is in a shape of substantial square or rectangle, with a size of 5-50 nm.

If the preliminary channel layer 1005 is undoped during the formation of the preliminary channel layer 1005 described above, the preliminary channel layer 1005 may be doped here. For example, a dopant source layer may be formed on the structure shown in FIGS. 11(a)-11(c) along a surface thereof, and dopants in the dopant source layer may be driven into the preliminary channel layer 1005 by annealing (certainly, the dopants may also move into the buffer layer 1003 and the semiconductor layer 1007, which may then be further doped by source/drain doping to have a desired conductivity type and a desired concentration). Then, the dopant source layer may be removed. This method of driving dopants has an effect of reducing fluctuations in threshold among different devices across the substrate because a total number of dopant atoms driven into the preliminary channel layer 1007 may be substantially the same among the different devices.

In a recess formed by the preliminary channel layer 1005 with respect to upper portions of the buffer layer 1003 and the semiconductor layer 1007, a channel layer in which channel regions are to be formed may be formed later. The channel layer may form the active regions of the respective devices together with the buffer layer 1003, the preliminary channel layer 1005, and the semiconductor layer 1007 which are formed previously (here, the preliminary channel layer 1005 may in fact function as body regions). In order to prevent subsequent operations of forming the source/drain regions (doping operations) from unnecessarily affecting the channel layer, here the source/drain regions may be formed before the formation of the channel layer.

Figure 12A:
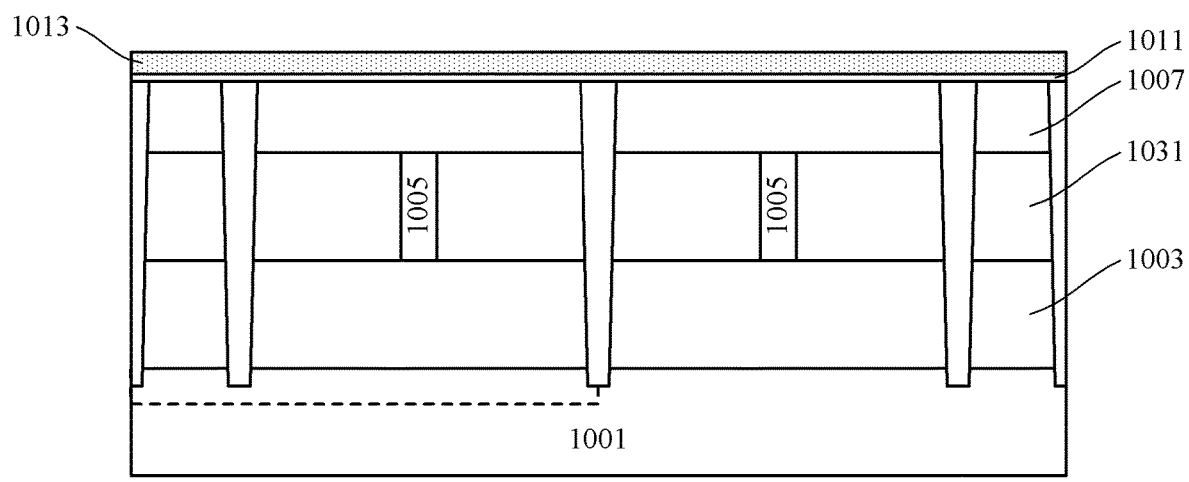
Figure 12B:
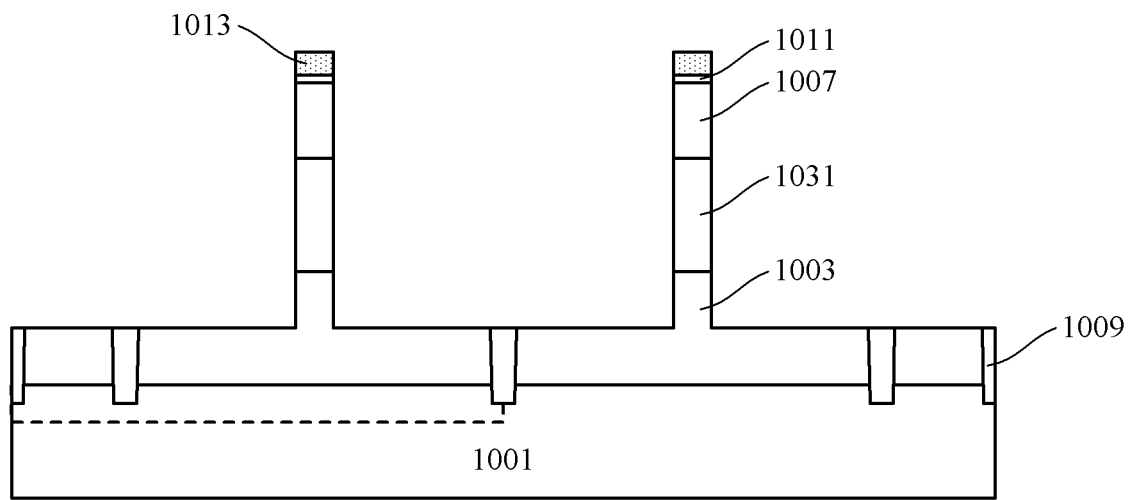
Figure 12C:
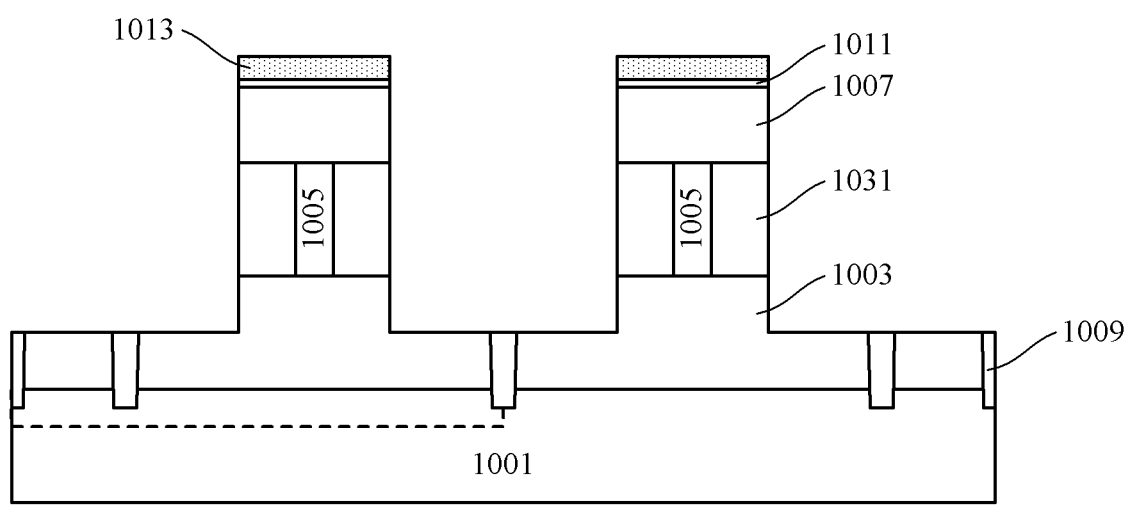

In addition, in order to prevent the subsequent processes from affecting the preliminary channel layer 1005 or leaving unnecessary materials in the recess and thus affects on the progress of the subsequent processes, the recess may be filled with a material layer to hold the space in the recess (and thus, this material layer may be referred to as a "position holder layer"). For example, this may be done by depositing oxynitride on the structure shown in FIGS. 11(a)-11(c) and then etching back the deposited oxynitride by, for example, RIE. The RIE may be performed in a direction substantially perpendicular to the substrate surface, and the oxynitride may be left below the mask layer to be embedded in the recess, resulting in the position holder layer 1031 as shown in FIGS. 12(a)-12(c). In this case, the recess described above may be substantially filled up with the position holder layer 1007.

Figure 13A:
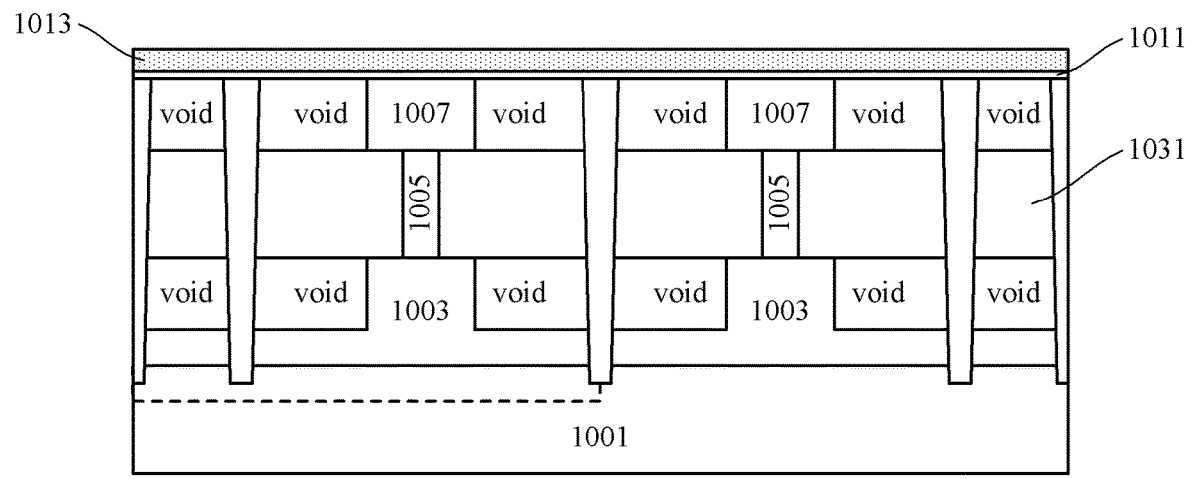
Figure 13B:
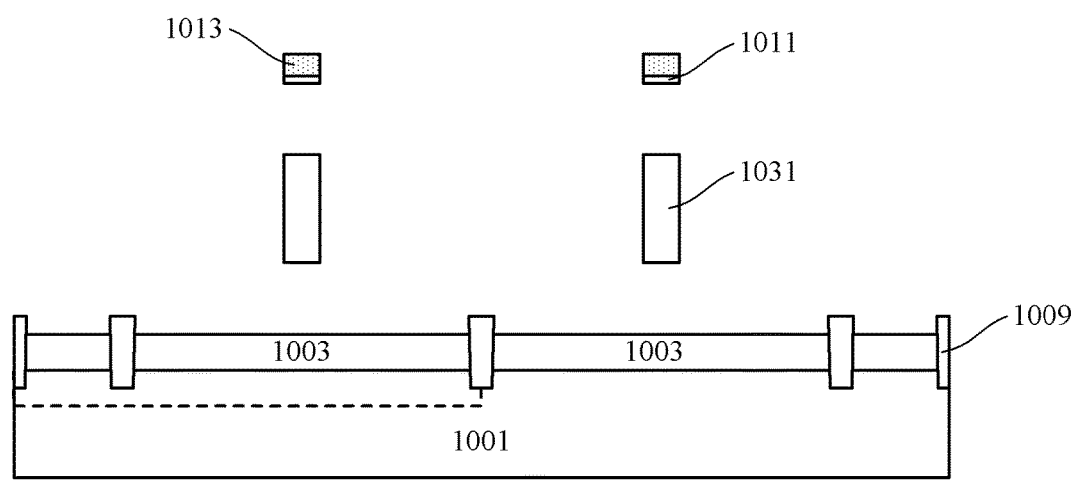
Figure 13C:
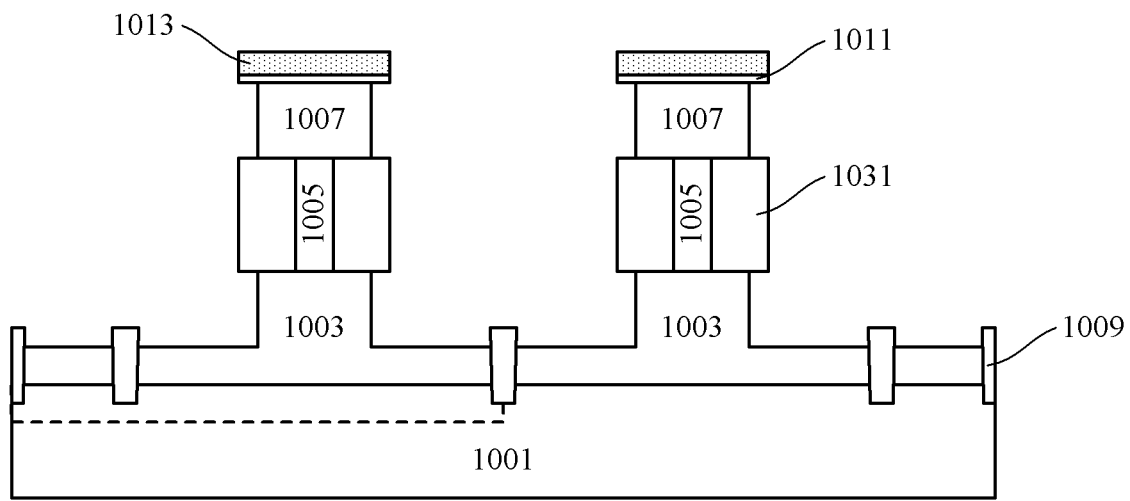

After that, the source/drain layers may be separated among the respective devices. As shown in FIGS. 13(a)-13(c), this may be done by further selectively etching the buffer layer 1003 and the semiconductor layer 1007 with respect to the preliminary channel layer 1005. This selective etching may be performed by ALE, digital etching or the like. Here, the etching is performed to such a sufficient extent that portions of the buffer layer 1003 and the semiconductor layer 1007 corresponding to the bridge portions are removed. Thus, separation of the source/drain layers between the respective devices is achieved. As a result, portions of the buffer layer 1003 and the semiconductor layer 1007 corresponding to the body portions may be left (but having their respective peripheries retracted with respect to those of the respective body portions of the mask layer), which is in a shape of substantial square or rectangle. Here, a degree of retraction of the buffer layer 1003 and the semiconductor layer 1007 may be less than that of the preliminary channel layer 1005, so that the preliminary channel layer 1005 is still recessed with respect to the buffer layer 1003 and the semiconductor layer 1007.

Next, source/drain regions may be formed in the buffer layer 1003 and the semiconductor layer 1007. The source/drain regions may be formed by doping the buffer layer 1003 and the semiconductor layer 1007. For example, this can be done as follows.

Figure 14:
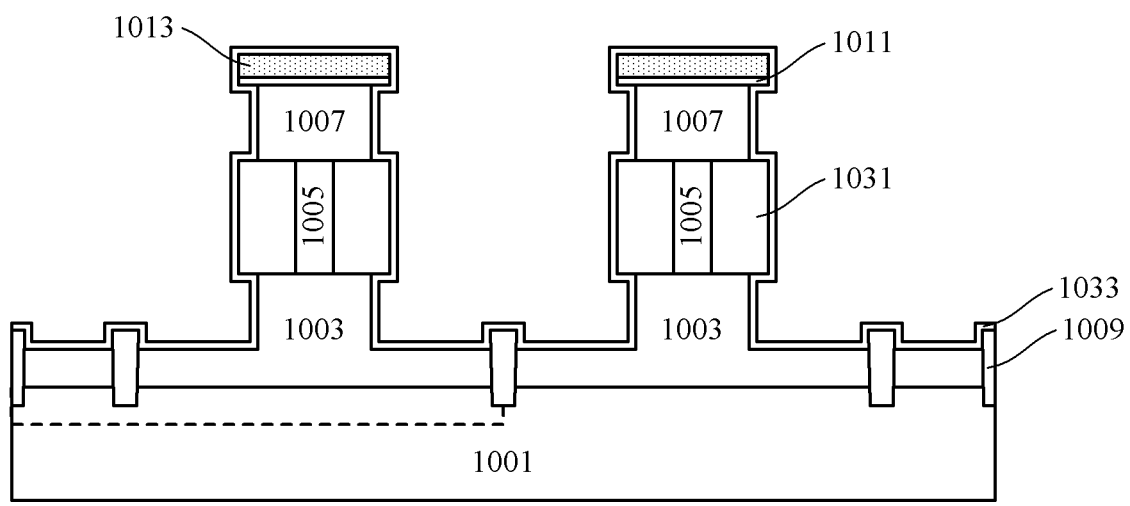

Specifically, as shown in FIG. 14 (FIG. 14 corresponds to the cross section along line CC' in FIG. 10(e)), a p-type dopant source layer 1033 may be formed on the structure shown in FIGS. 13(a)-13(c). For example, the p-type dopant source layer 1033 may comprise oxide, such as silicon oxide, containing p-type dopants such as B. Here, the dopant source layer 1033 may be a thin film, with a thickness of, for example, about 2-10 nm, so as to be deposited on a surface of the structure shown in FIGS. 13(a)-13(c) by, for example, Chemical Vapor Deposition (CVD) or Atomic Layer Deposition (ALD) or the like in a substantially conformal manner.

Figure 15:
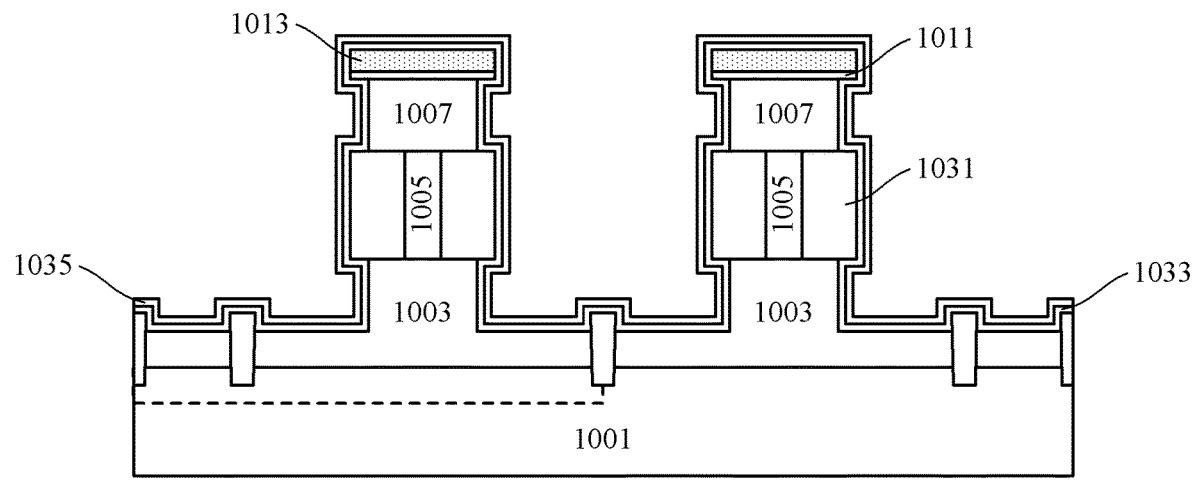

Further, in order to avoid cross-contamination with an n-type dopant source layer which is to be formed, a diffusion barrier layer 1035 may be formed on the p-type dopant source layer 1033, as shown in FIG. 15. For example, the diffusion barrier layer 1035 may comprise nitride, oxynitride, oxide, or the like, with a thickness of about 0.5-5 nm.

Figure 16:
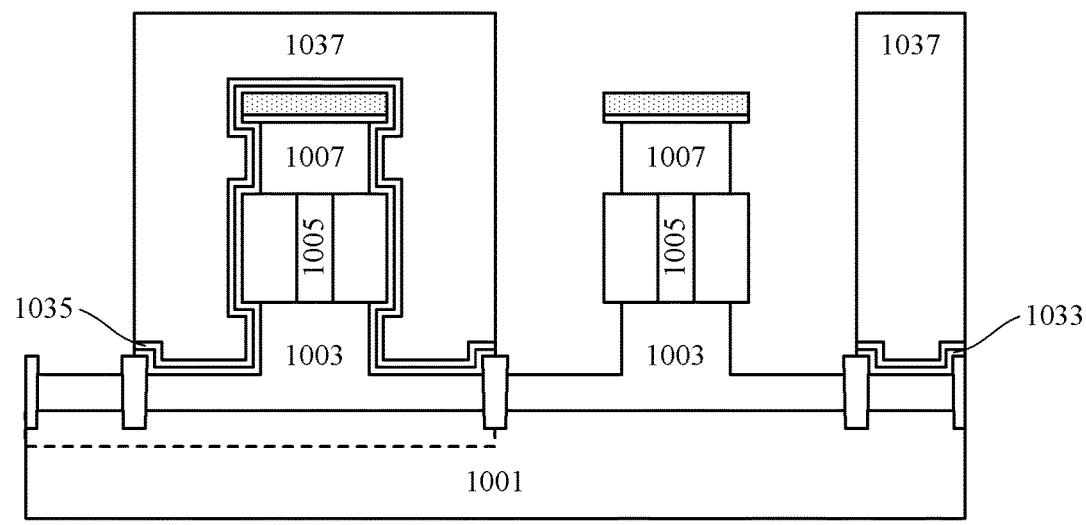

Then, the p-type dopant source layer 1033 (and the diffusion barrier layer 1035) may be patterned (by, for example, photolithography) using photoresist 1037, as shown in FIG. 16, to be left in regions where p-type doping is required. In this example, the p-type dopant source layer 1033 may be left in the p-type device region (because the source/drain layers therein require p-type doping) and a portion of the n-type device region where a body contact is to be formed (if any, because a p-type body contact region may be formed for the n-type device). Then, the photoresist 1037 may be removed.

Figure 17:
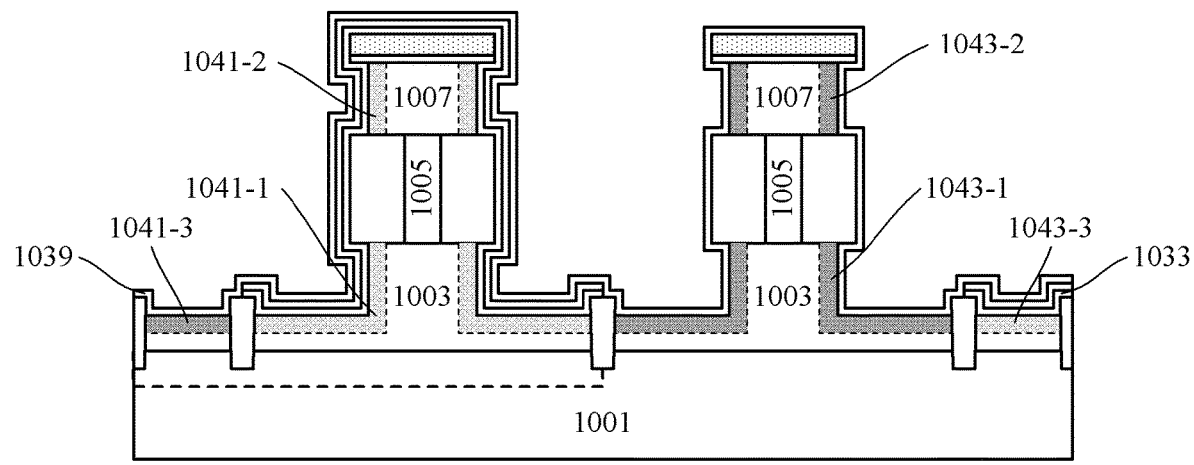

Next, as shown in FIG. 17, an n-type dopant source layer 1039 may be formed on the structure shown in FIG. 16. For example, the n-type dopant source layer 1039 may comprise oxide containing n-type dopants such as As or P, with a thickness of about 2-10 nm. The n-type dopant source layer 1039 may be formed in the same manner as the p-type dopant source layer 1033. The n-type dopant source layer 1039 may cover regions where n-type doping is required, such as the n-type device region (because the source/drain layers therein require n-type doping) and a portion of the p-type device region where a body contact is to be formed (if any, because an n-type body contact region may be formed for the p-type device).

Optionally, another diffusion barrier layer may be formed on the n-type dopant source layer 1039 to suppress outward diffusion or cross-contamination.

Next, dopants included in the dopant source layers 1033 and 1039 may be driven into the active regions by, for example, annealing at about 800-1100° C., so that doped regions are formed therein, as indicated by shadowed portions in the figure. More specifically, in the p-type device region, one of the source/drain regions for the p-type device 1041-1 may be formed in the buffer layer 1003 and the other of the source/drain regions for the p-type device 1041-2 may be formed in the semiconductor layer 1007. Further, a body contact region 1041-3 may also be formed in the p-type device region. Similarly, in the n-type device region, one of the source/drain regions for the n-type device 1043-1 may be formed in the buffer layer 1003 and the other of the source/drain regions for the n-type device 1043-2 may be formed in the semiconductor layer 1007. Further, a body contact region 1043-3 may also be formed in the n-type device region. Here, an extent to which the dopants move into the active regions may be controlled so that the dopants are distributed substantially only at portions of the buffer layer 1003 and the semiconductor layer 1007 close to their respective surfaces. After that, the dopant source layers and the diffusion barrier layers may be removed.

In the above example, the source/drain regions are formed by driving the dopants from the dopant source layers into the respective active regions. However, the present disclosure is not limited thereto. For example, the source/drain regions may be formed by ion implantation, plasma doping (for example, conformal doping along a surface of the structure), or the like. Certainly, this can be done separately for the region where p-type doping is required and the region where n-type doping is required. When one of the regions is being processed, the other region may be masked with, for example, photoresist. Such localized processing is common in CMOS processes.

In the above example, the p-type dopant source layer 1033 is formed before the formation of the n-type dopant source layer 1039. However, the present disclosure is not limited thereto and their orders may be interchanged.

In this example, the dopant source layers each comprise portions which extend along a horizontal surface of the buffer layer 1003, so that doped regions formed in the buffer layer 1003 extend beyond peripheries of the respective active regions above the respective doped regions. Thus, it is possible to electrically connect to the source/drain regions formed in the buffer layer 1003 in a relatively easy way through the respective doped regions in the subsequent processes.

In this example, doping of the same conductivity type is performed on the buffer layer 1003 and the semiconductor layer 1007, and thus source/drain regions of the same conductivity type are obtained. However, the present disclosure is not limited thereto. For example, different conductivity types of doping may be performed on the buffer layer 1003 and the semiconductor layer 1007, and thus source/drain regions of different conductivity types may be obtained (in this case, a tunneling FET may be formed). For example, after a dopant source layer of one conductivity type is formed in the p-type device region and the n-type device region respectively, as shown in FIG. 17, a shielding layer (of, for example, oxynitride) may be formed and then etched back, so that the shielding layer may have its top surface at a level between a top surface and a bottom surface of the preliminary channel layer 1005, so as to shield portions of the dopant source layer formed on sidewalls of the buffer layer 1003 while exposing remaining portions of the dopant source layer formed on sidewalls of the semiconductor layer 1007. Then, the exposed portions of the dopant source layer (and the diffusion barrier layer) on the sidewalls of the semiconductor layer 1007 may be removed, and a further dopant source layer of another conductivity type may be formed on the sidewalls of the semiconductor layer 1007 (the above steps described in connection with FIGS. 14-17 may be repeated, but with a dopant source layer of an opposite conductivity type).

Here, in order to reduce the contact resistance, silicidation may be further performed. For example, a layer of NiPt (with a Pt content of about 1-10%) may be deposited on the structure shown in FIG. 17 (with the dopant source layers and the diffusion barrier layers removed), and then annealing may be performed at a temperature of about 200-600° C., so that NiPt reacts with SiGe to produce a layer (not shown) of silicide (SiNiPt here). After that, residual NiPt which is unreacted may be removed.

Figure 18A:
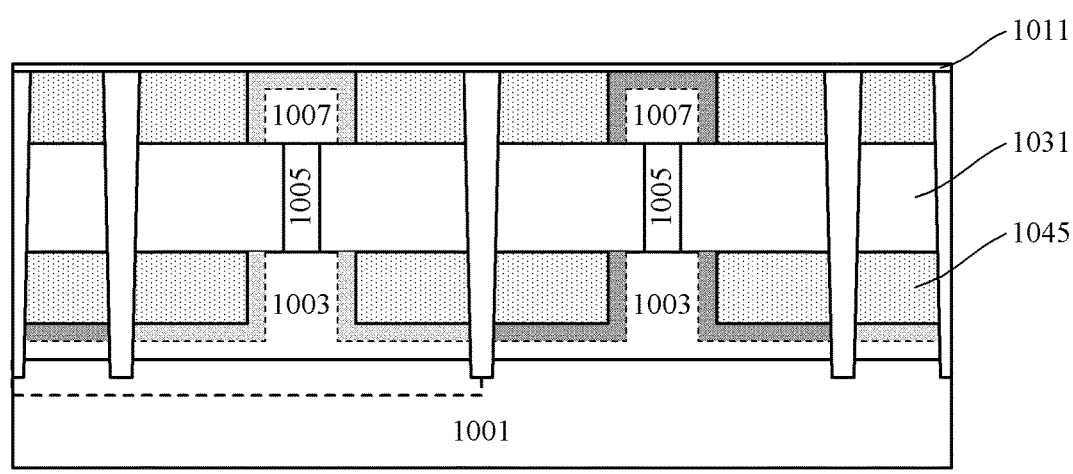
Figure 18B:
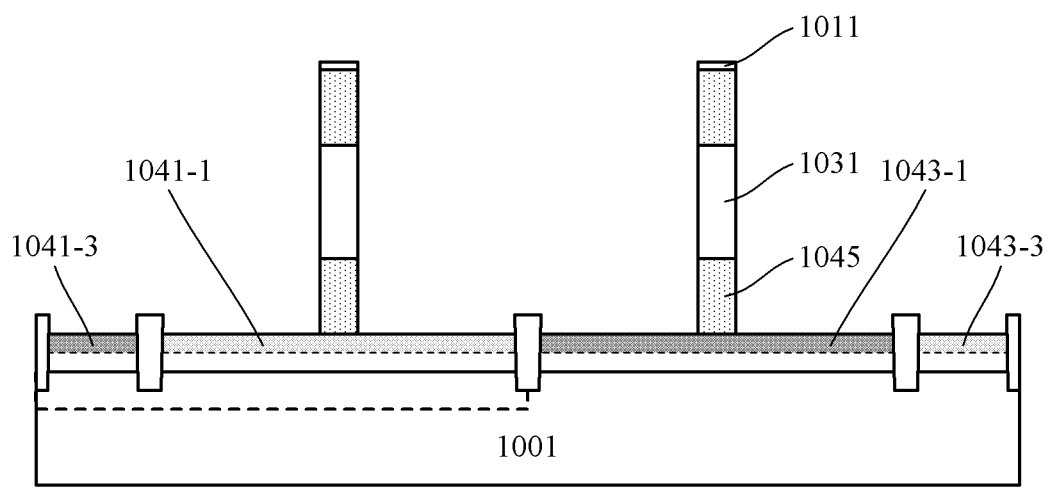
Figure 18C:
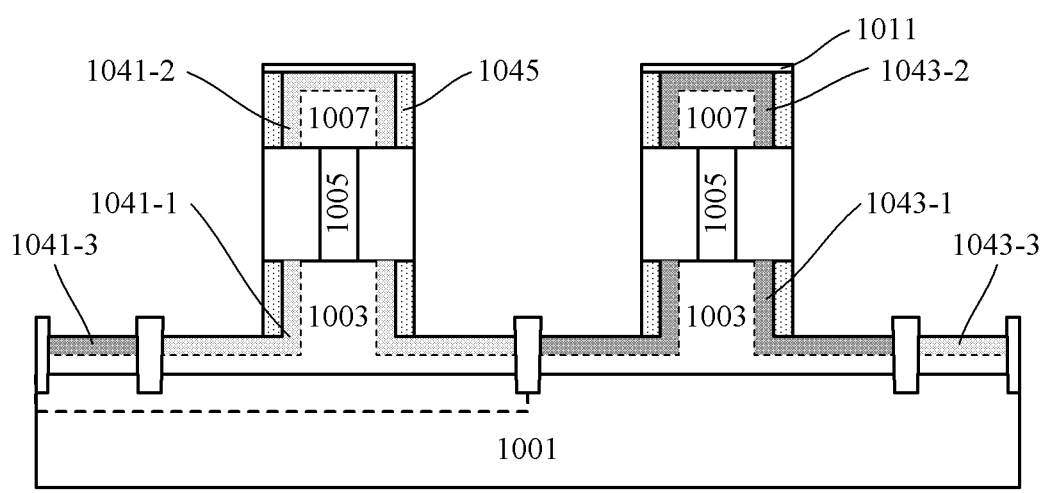

Next, a channel layer may be formed on surfaces of the preliminary channel layer 1005. The position holder layer 1031 needs to be removed before the formation of the channel layer, but the removal of the position holder layer 1031 is disadvantageous for structural stability because the respective active regions are currently connected to each other by the position holder layer 1031 for certain structural strength. Thus, another position holder layer may be formed around the peripheries of the buffer layer 1003 and the semiconductor layer 1007. For example, as shown in FIGS. 18(*a*)-18(*c*) (FIGS. 18(*a*)-18(*c*) correspond to the cross-sections along lines AA', BB' and CC' in FIG. 10(*e*) respectively), nitride may be deposited on the structure shown in FIG. 17 (with the dopant source layers and the diffusion barrier layers removed), and then the deposited nitride may be etched back by, for example, RIE (by which, the nitride layer 1013 in the mask layer may be removed). The RIE may be performed in a direction substantially perpendicular to the substrate surface, and the nitride may remain below the mask layer to form a position holder layer 1045. Thus, the active regions may be connected to each other by the position holder layer 1045 for structural support. Further, the position holder layer 1045 may shield some surfaces of the buffer layer 1003 and the semiconductor layer 1007 to prevent the channel layer from being unnecessarily grown on these surfaces.

In addition, since the semiconductor layer 1007 has its top shielded by the mask layer, there may be no source/drain region currently formed on a top surface of the semiconductor layer 1007. In order to facilitate making contacts later, the top surface of the semiconductor layer 1007 may be further doped to form source/drain regions. For example, the top surface of the semiconductor layer 1007 may be doped by ion implantation. For the p-type device, p-type impurities such as B, $BF_2$ or In may be implanted therein, with a concentration of about 1E19-2E20 $cm^{-3}$; and for the n-type device, n-type impurities such as As or P may be implanted therein, with a concentration of about 1E19-2E21 $cm^{-3}$. These doped regions constitute the source/drain regions together with those formed previously.

Here, the channel layer may be optimized for the p-type device and the n-type device respectively. To this end, the p-type device region and the n-type device region may be processed separately.

Figure 19A:
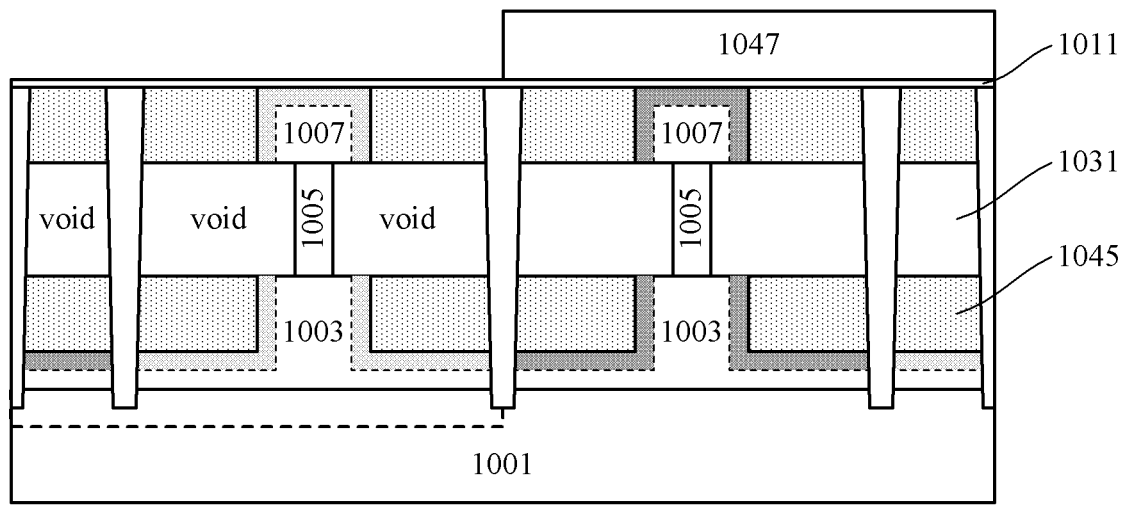
Figure 19B:
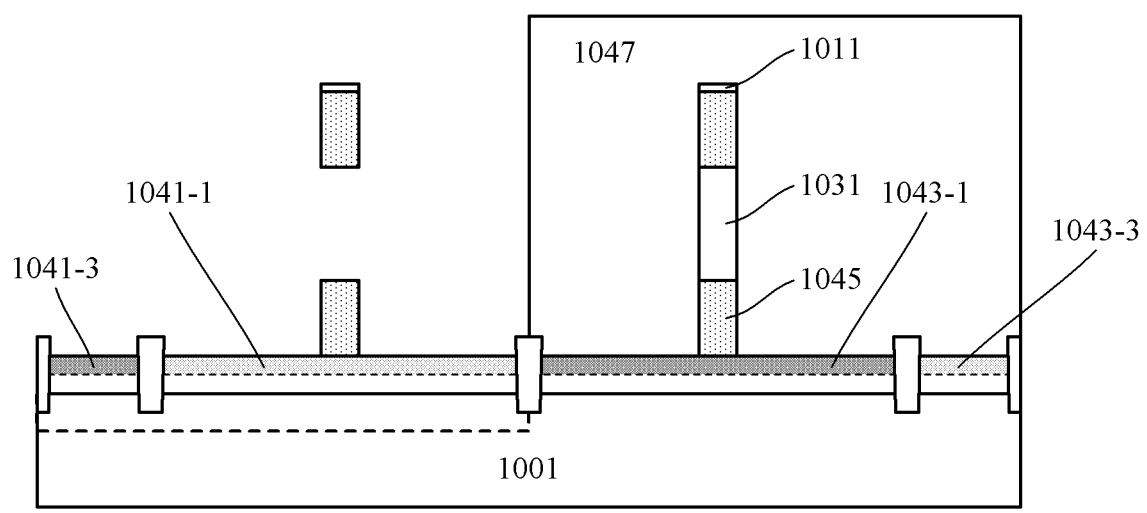
Figure 19C:
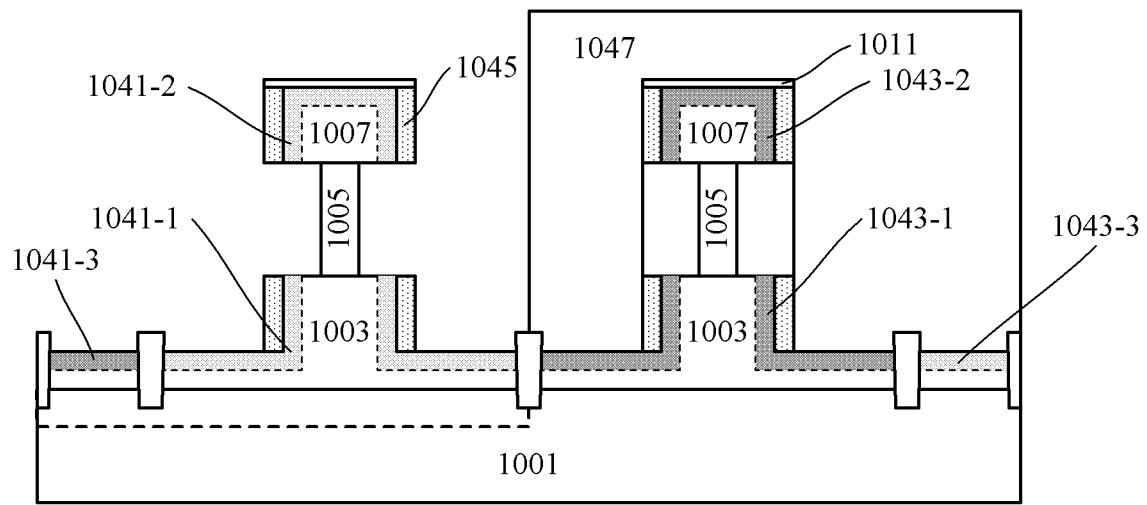

As shown in FIGS. 19(*a*)-19(*c*), the n-type device region may be shielded by photoresist 1047 while the p-type device region being exposed. In the exposed p-type device region, the position holder layer 1031 may be removed by selective etching, and sidewalls of the preliminary channel layer 1005 are thus exposed.

Figure 20A:
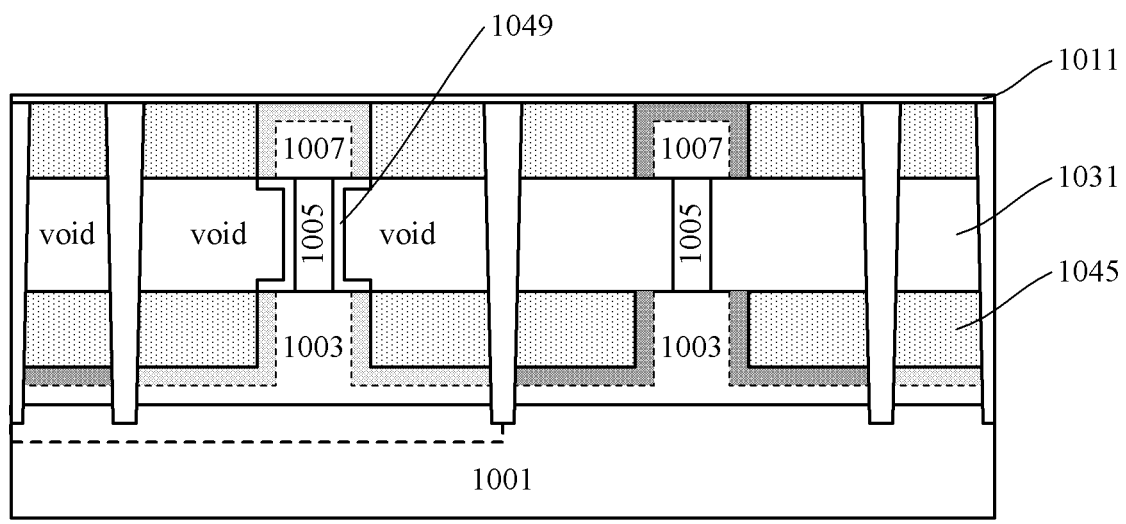
Figure 20B:
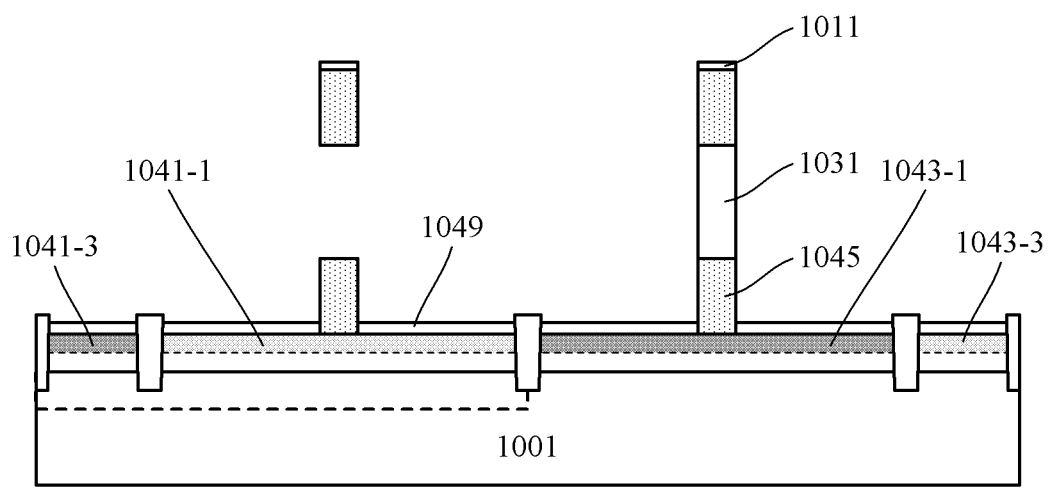
Figure 20C:
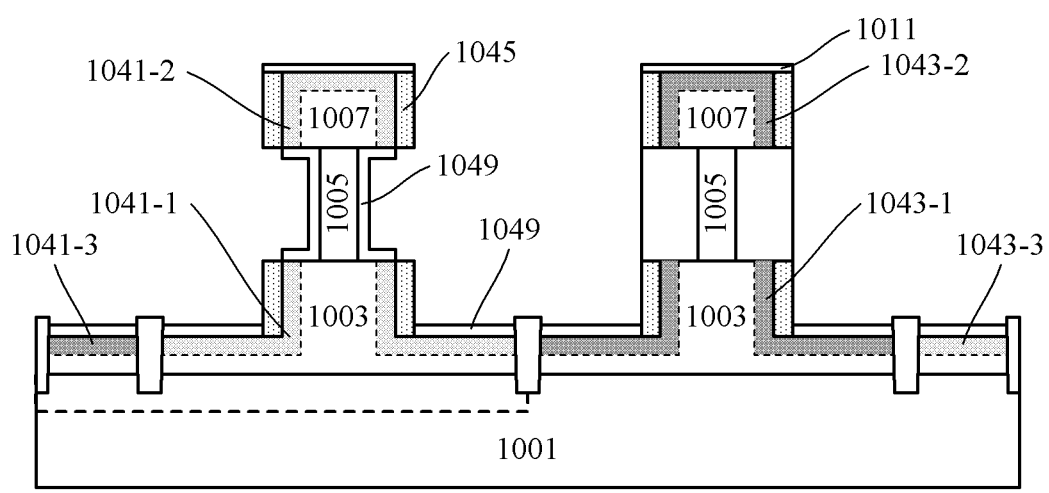

Then, as shown in FIGS. 20(*a*)-20(*c*), a channel layer 1049 may be formed on the sidewalls of the preliminary channel layer 1005 by, for example, selective epitaxial growth. The channel layer 1049 may have a substantially uniform thickness, for example, about 2-10 nm, or it may be faced. In the case of epitaxial growth, there may be a clear crystalline interface between the respective semiconductor layers. Certainly, the channel layer 1049 may also be grown on the exposed surface of the buffer layer 1003.

The material for the channel layer 1049 may be selected, so that it facilitates the device performances. For example, the channel layer 1049 may comprise a semiconductor material which is beneficial for enhancing an ON current of the device and/or reducing an OFF current of the device. For example, for the p-type device, a concentration of holes in the channel layer 1049 may be greater than that in the preliminary channel layer 1005 when the device is ON. In addition, the channel layer 1049 may form a heterojunction together with at least one of the buffer layer 1003, the preliminary channel layer 1005, and the semiconductor layer 1007. The material of the channel layer 1049 may be selected variously. For example, the channel layer 1049 may comprise a group IV semiconductor material or a group III-V compound semiconductor material, for example, one of SiGe, Ge, SiGeSn, GeSn, GaAs, InGaAs, InP, AlGaAs, InAlAs, InAs, InGa, InAlGa, GaN, InSb, InGaSb, or a combination thereof.

In this example (in which the buffer layer 1003 comprises $Si_{1-x}Ge_x$, the preliminary channel layer 1005 comprises $Si_{1-y}Ge_y$, and the semiconductor layer 1007 comprises $Si_{1-z}Ge_z$), the channel layer 1049 may comprise $Si_{1-cp}Ge_{cp}$ (where cp is between 0 and 1, and cp≥y). A large cp is beneficial for the improvement of the device performances. This layer of $Si_{1-cp}Ge_{cp}$ has the following advantages. Firstly, it may form a quantum well, to substantially confine carriers in the thin channel layer, which results in enhanced carrier mobility and thus improved device performances. Further, the doped preliminary channel layer 1005 or the well region may also facilitate confining the carriers in the thin channel layer. Advantageously, a concentration of Ge in the channel layer 1049 may be non-uniform, for example, relatively small at the beginning of the growth to reduce defects, and then gradually increasing. Thus, the concentration of Ge in the channel layer 1049 may gradually increase from its surface on the side close to the first semiconductor material towards its surface on the side away from the first semiconductor material.

The channel layer 1049 may be deposited or grown in a low temperature process at, for example, less than 800° C., to reduce diffusion of the dopants in the preliminary channel layer 1005 or the well region into this layer. This may form an ultra-steep doping distribution between the channel layer 1049 and the preliminary channel layer 1005 and thus there may be a doping interface therebetween. That is, the preliminary channel layer 1005 may form an ultra-steep well structure with respect to the channel layer 1049.

Figure 21A:
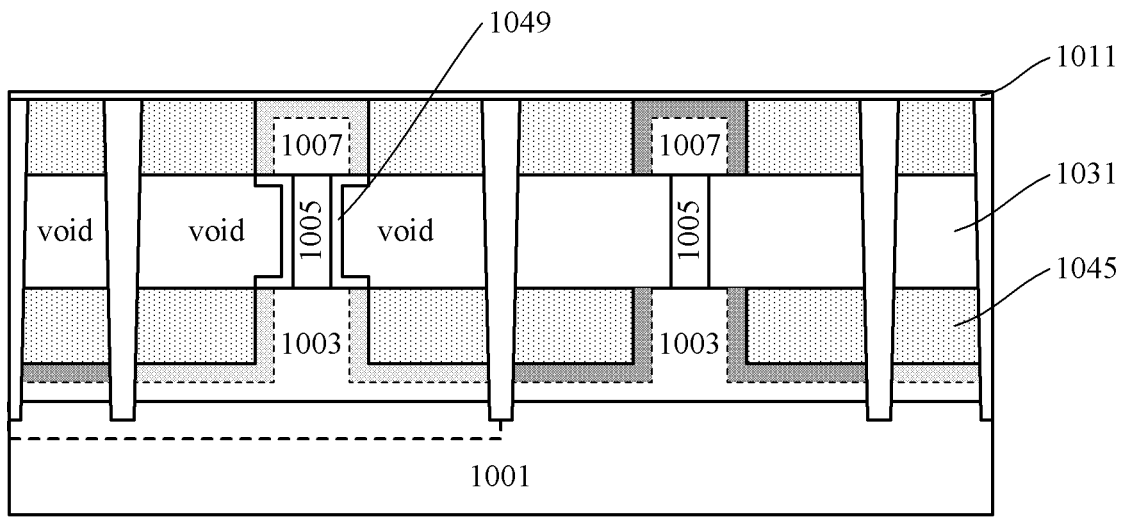
Figure 21B:
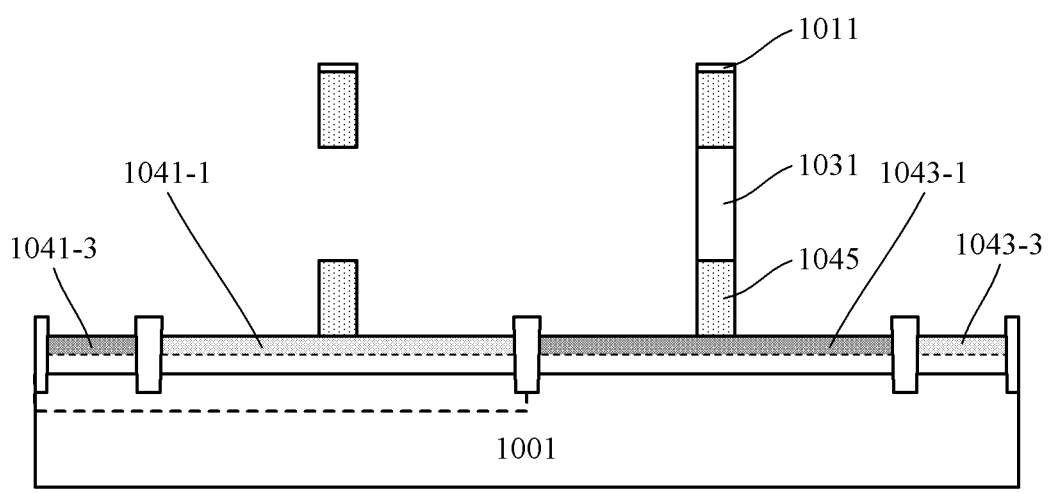
Figure 21C:
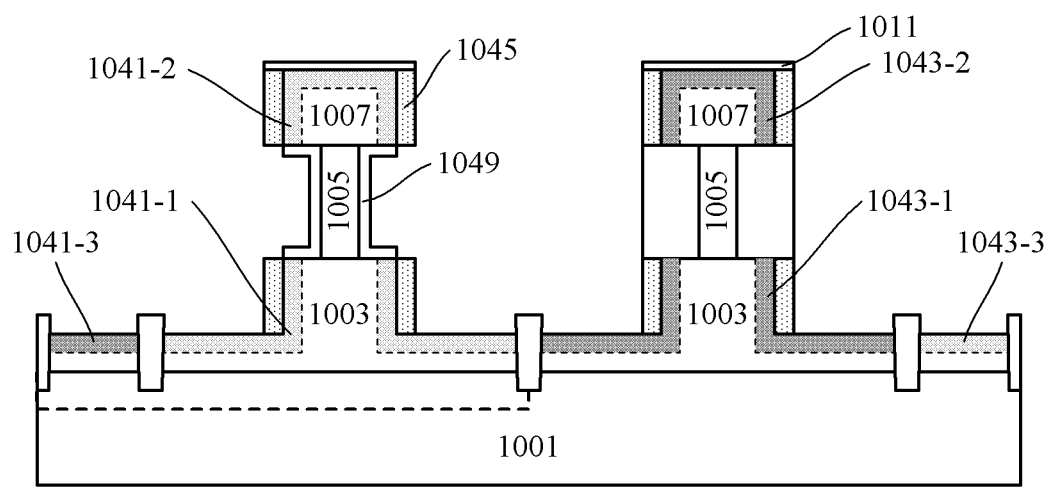

Then, portions of the channel layer 1049 which are grown on the surface of the buffer layer 1003 may be removed. As shown in FIGS. 21(*a*)-21(*c*), the channel layer 1049 may be selectively etched by, for example, RIE. The RIE may be performed in a direction substantially perpendicular to the substrate surface. Thus, the portions of the channel layer 1049 which are grown on the surface of the buffer layer 1003 may be removed, and portions of the channel layer 1049 which are grown on the sidewalls of the preliminary channel layer 1005 may be substantially unaffected by being recessed inward.

In order to avoid possible leakage between the silicide formed on the surfaces of the source/drain regions and the channel layer, ends of the channel layer 1049 may be relatively recessed with respect to the surfaces of the source/drain regions. For example, the channel layer 1049 may be etched back (by, for example, ALE), so that the channel layer 1049 has its ends retracted to a certain extent and have respective dielectric spacers (for example, low-k dielectric spacers of, for example, oxide, oxynitride, or the like) formed therein. Thus, the dielectric spacers may surround the respective ends of the channel layer 1049 and cause the ends of the channel layer 1049 to be disconnected from the silicide formed on the respective surfaces of the source/drain regions (without Schottky contact). Alternatively, spaces left after the back-etching of the channel layer 1049 may not be filled with other materials, and instead may remain empty. Thus, gas spacers or air gaps may be formed. Certainly, the ends of the channel layer 1049 may still remain abutting the respective source/drain regions to reduce the resistance between the source/drain regions and the respective channel regions.

Figure 22A:
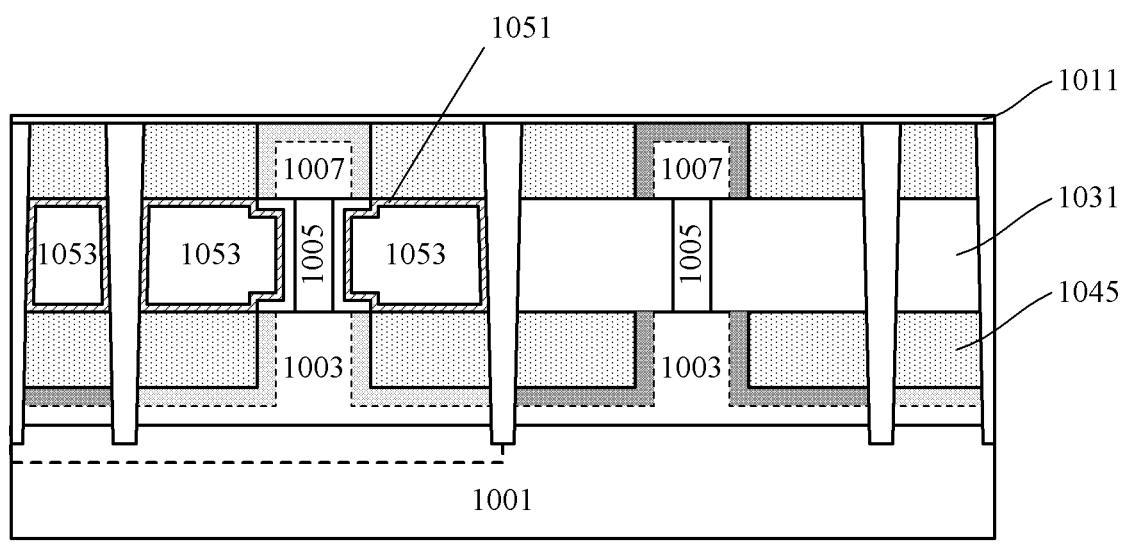
Figure 22B:
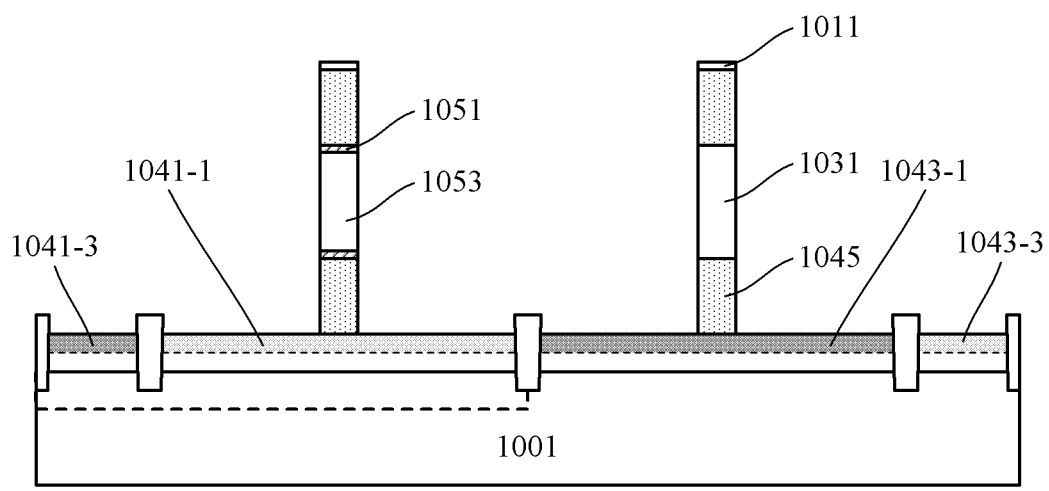
Figure 22C:
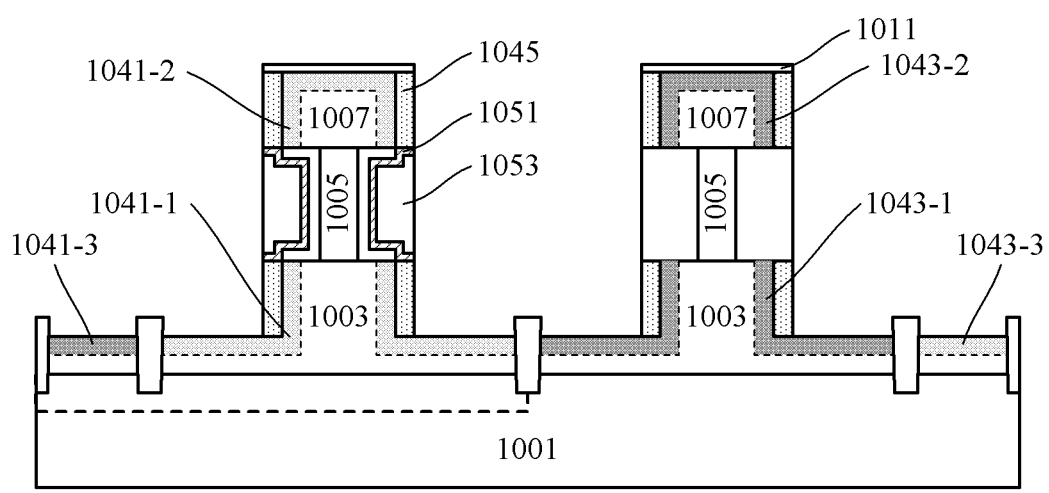

Then, as shown in FIGS. 22(*a*)-22(*c*), a gate stack may be formed to surround a periphery of the channel layer 1049. Specifically, a gate dielectric layer 1051 and a gate conductor layer 1053 for the p-type device may be deposited in sequence on the structure shown in FIGS. 21(*a*)-21(*c*), and then etched back. Thus, the gate stack is formed to surround the periphery of the channel layer and also include extending portions corresponding to the respective bridge portions. For example, the gate dielectric layer 1051 may comprise a high-k gate dielectric such as $HfO_2$, and the gate conductor layer 1053 may comprise a metal gate conductor. In addition, a work function adjustment layer may be further formed between the gate dielectric layer 1051 and the gate conductor layer 1053. An interfacial layer of, for example, oxide, may be further formed before the formation of the gate dielectric layer 1051.

Figure 23A:
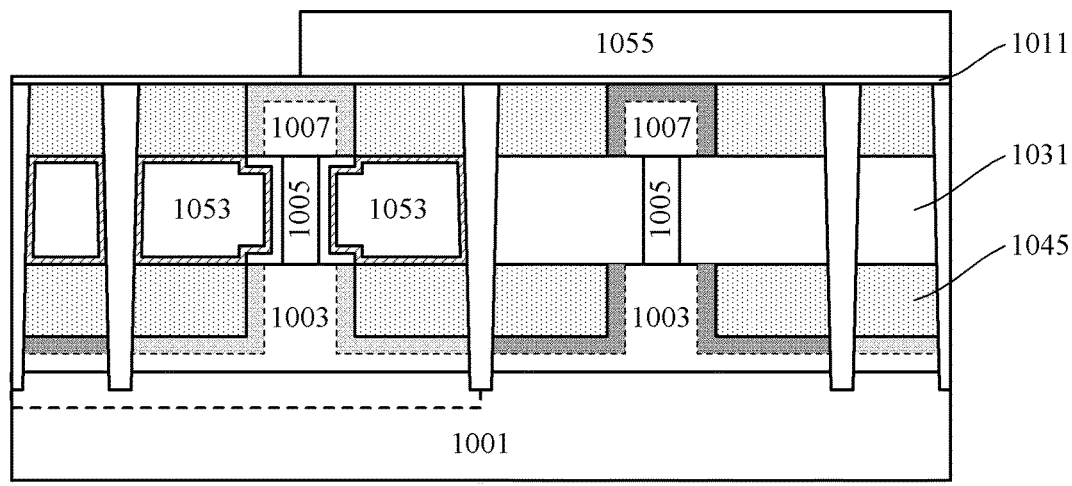
Figure 23B:
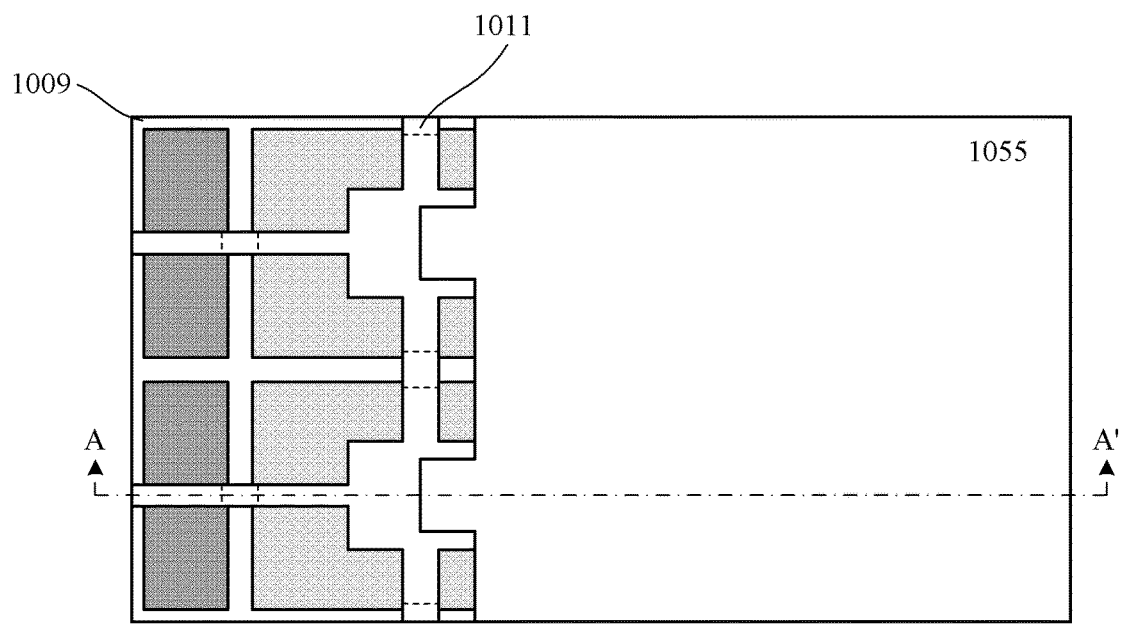
Figure 24A:
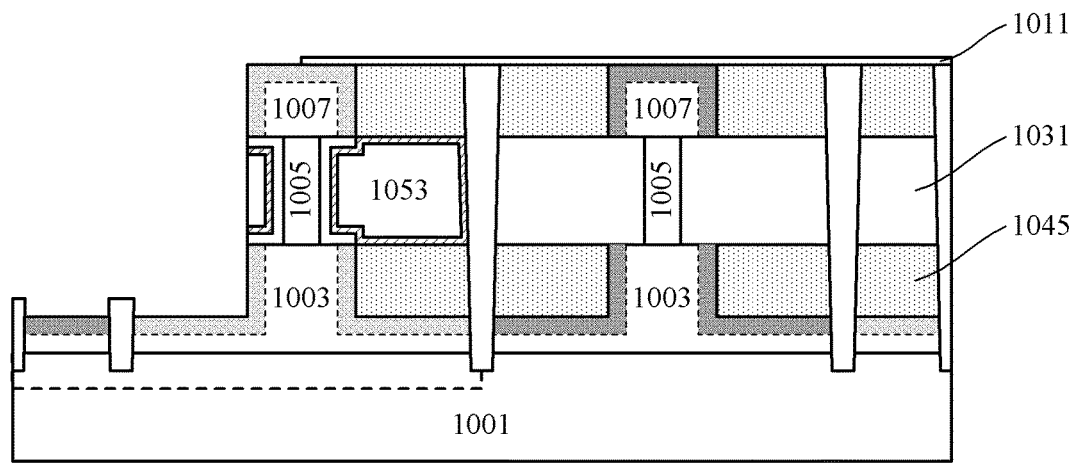
Figure 24B:
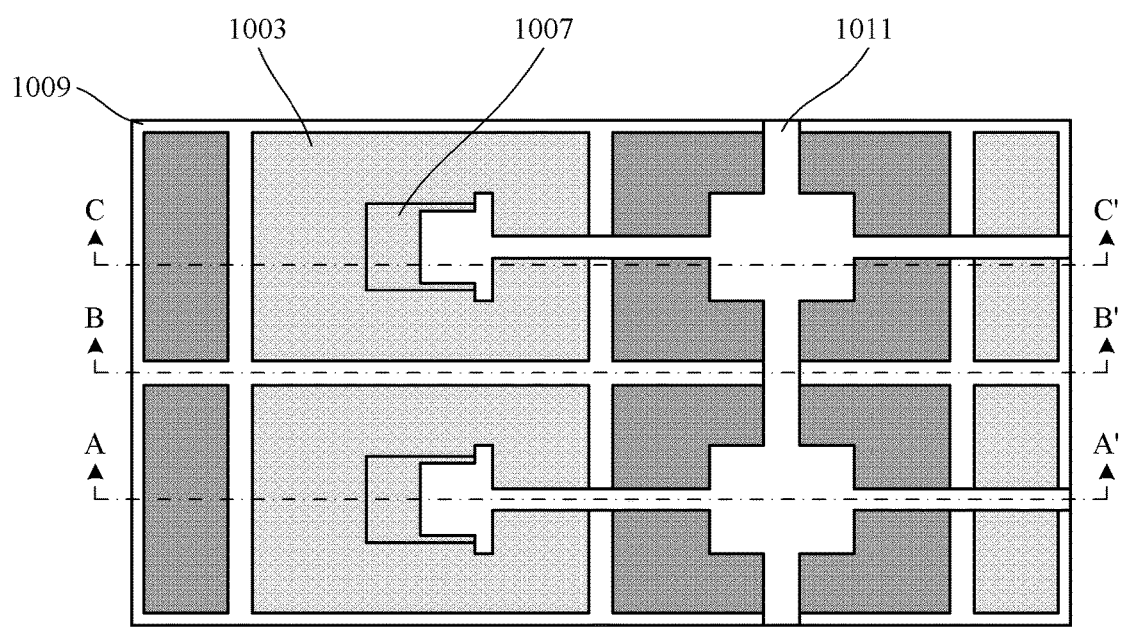

The extending portions of the gate stack and the position holder layer 1045 connecting the respective active regions may also be at least partially removed. Since the device has been completely manufactured in the p-type device region, there is no need for the bridge portions in this region to maintain structural strength. For example, as shown in FIGS. 23(*a*) and 23(*b*) (FIG. 23(*a*) is a sectional view, and FIG. 23(*b*) is a top view with line AA' indicating the location where the sectional view of FIG. 23(*a*) is taken), the n-type device region may be shielded by photoresist 1055. Here, in order to facilitate subsequent manufacturing of the contact to the gate stack, the photoresist 1055 may further shield at least one of the bridge portions for each p-type device (each p-type device currently has four bridge portions extending outwards from four sides thereof, respectively). As shown in the top view in FIG. 23(*b*), in this example, the photoresist 1055 shields the bridge portions on the right side of the respective p-type devices. Then, as shown in FIGS. 24(*a*) and 24(*b*) (FIG. 24(*a*) is a sectional view, and FIG. 24(*b*) is a top view with line AA' indicating the location where the sectional view of FIG. 24(*a*) is taken), the position holder layer 1045 (exposed by firstly selectively etching the oxide layer 1011 in the mask layer) and the gate stack may be selectively etched by, for example, RIE using the photoresist 1055 as a mask. Thus, in the p-type device region, the respective active regions of the devices are no longer connected to each other, and the gate stack for each of the devices comprises one extending portion. Then, the photoresist 1055 may be removed.

Figure 25A:
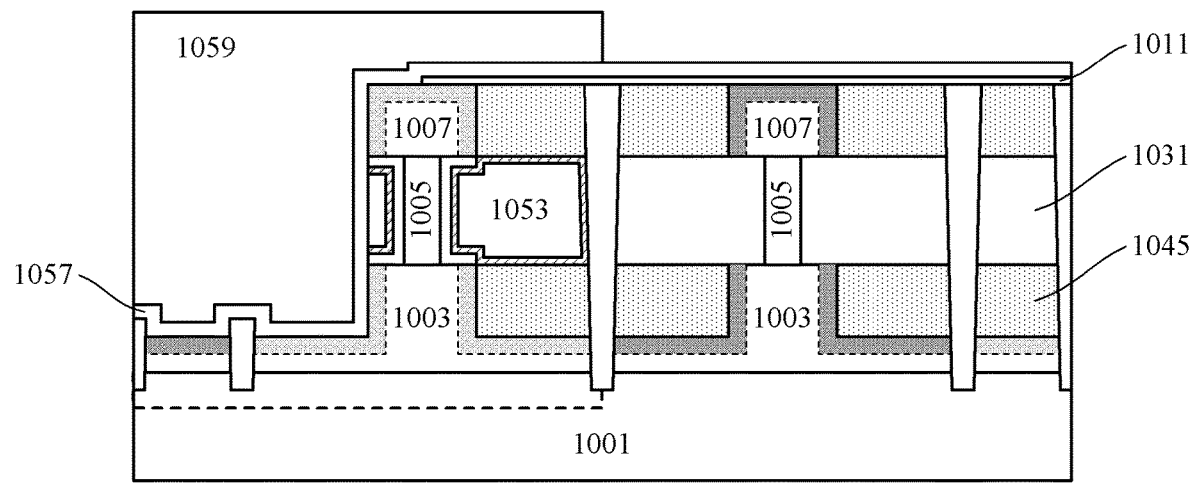
Figure 25B:
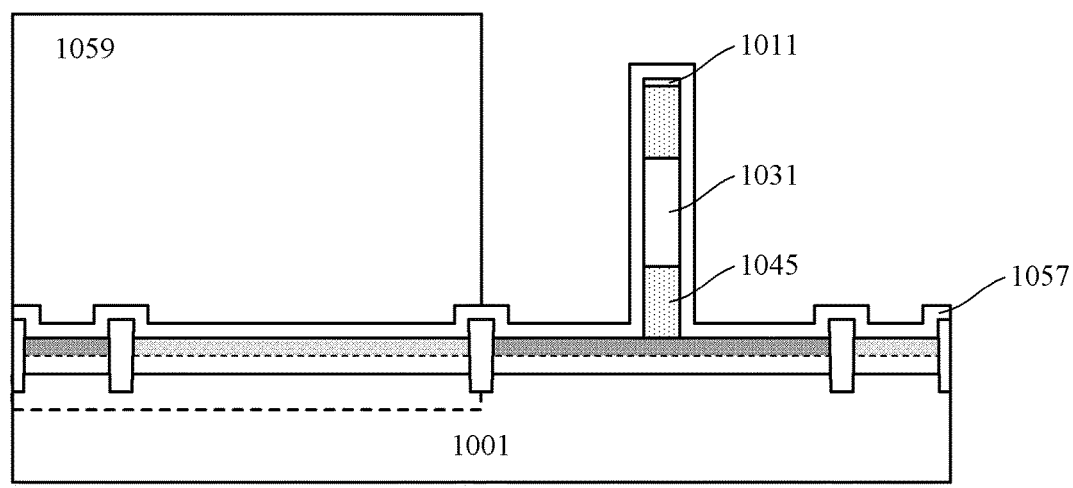
Figure 25C:
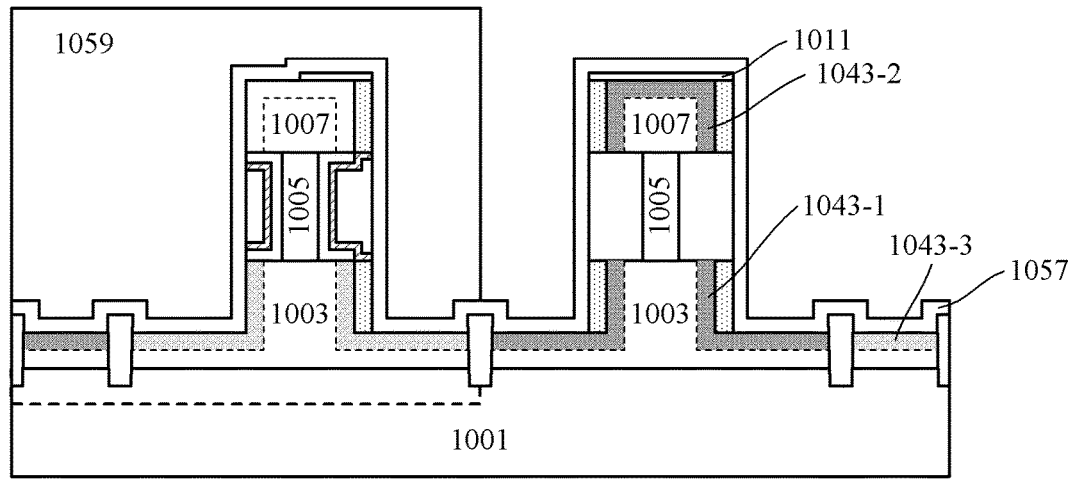
Figure 26A:
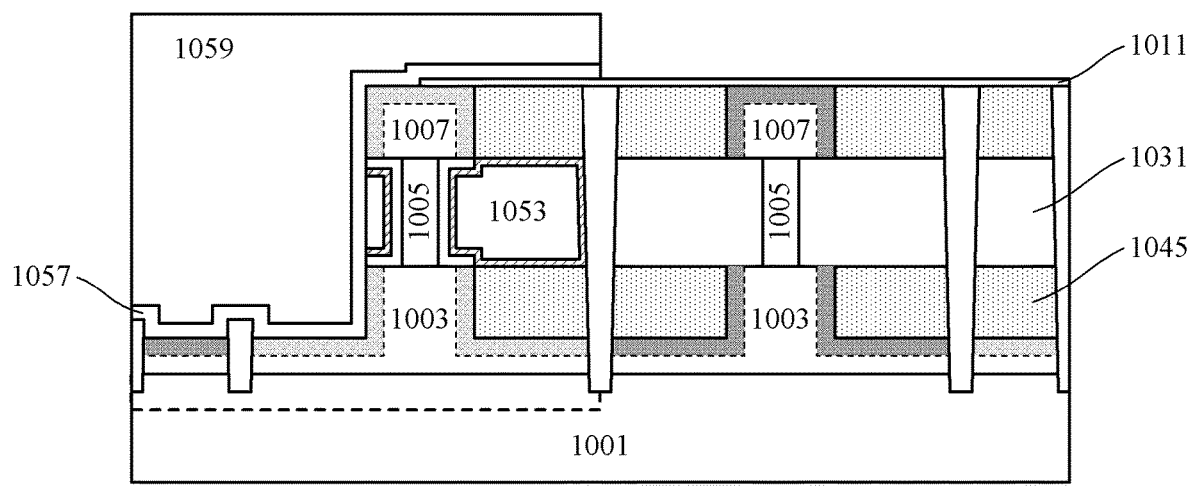
Figure 26B:
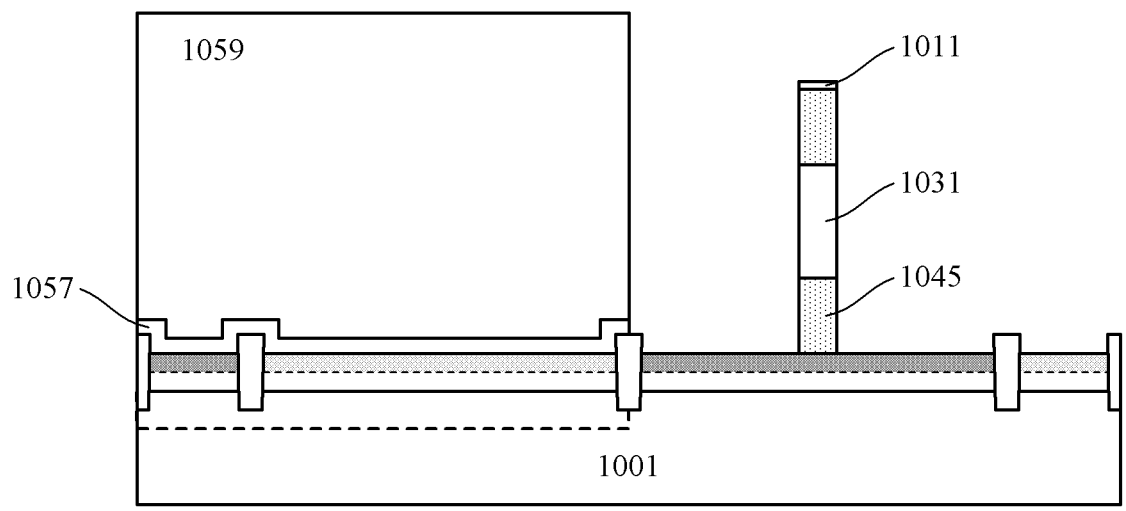
Figure 26C:
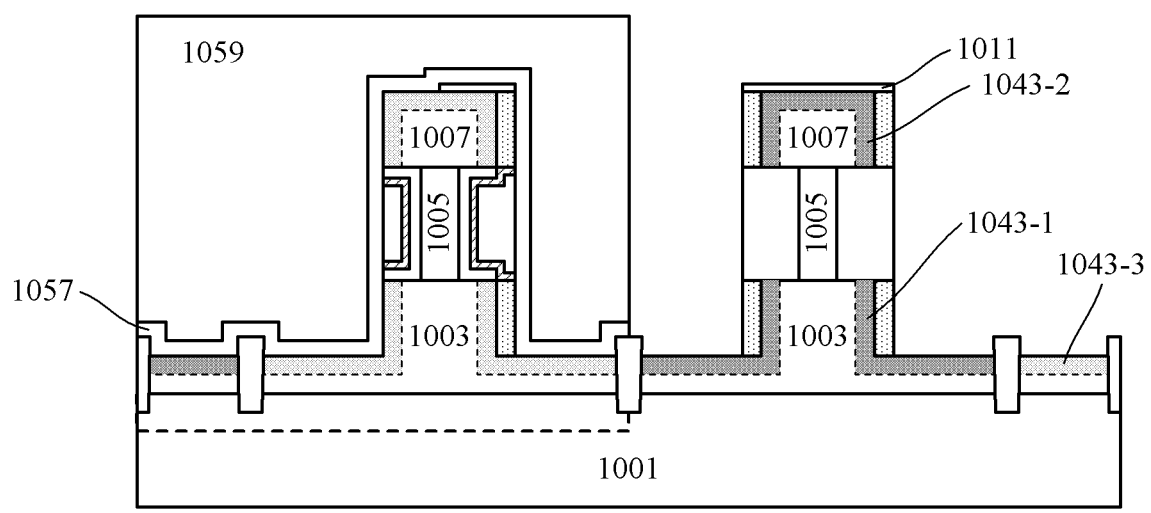

In addition, a liner may be formed in the p-type device region for the purpose of protection, etching stop, or the like. For example, as shown in FIGS. 25(*a*)-25(*c*) (FIGS. 25(*a*)-25(*c*) correspond to the cross-sections along lines AA', BB', and CC' in FIG. 10(*e*) respectively), a nitride layer 1057 (with a thickness of, for example, about 5-50 nm) may be deposited on the structure shown in FIGS. 24(*a*) and 24(*b*) (a thin oxide layer may be optionally formed to act as an etching stopper layer before the deposition of nitride). Photoresist 1059 may be formed on the nitride layer 1057 to shield the p-type device region while exposing the n-type device region. Then, as shown in FIGS. 26(*a*)-26(*c*), the nitride layer 1057 may be selectively etched by, for example, RIE, using the photoresist 1059 as a mask to obtain the liner. Then, the photoresist 1059 may be removed.

Here, the liner 1057 may be stressed to further improve the device performances. For example, for the p-type device, the liner 1057 may be tensile stressed to create compressive stress in the channel layer.

Figure 27A:
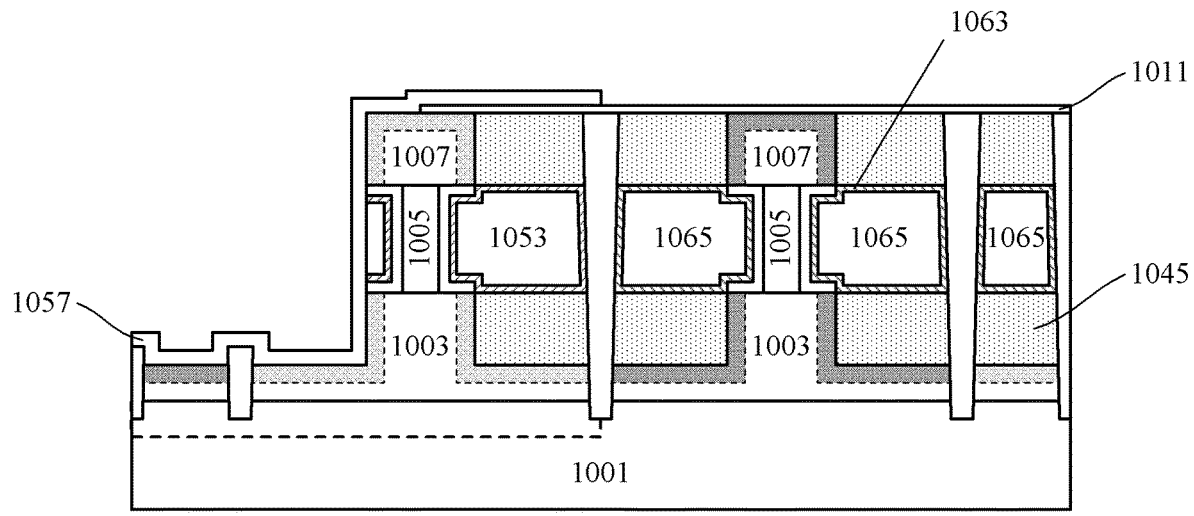
Figure 27B:
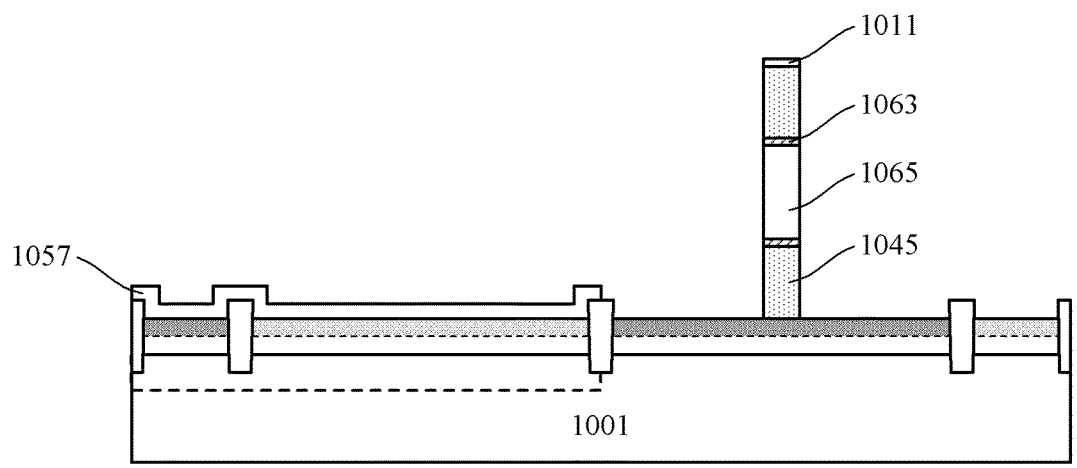
Figure 27C:
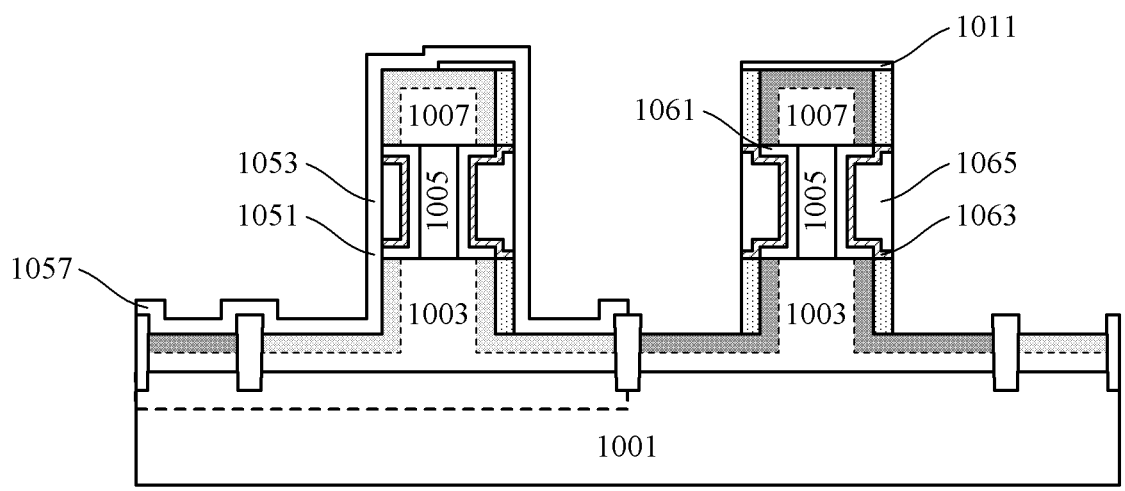

After that, the same processing may be performed for the n-type device region. As shown in FIGS. 27(*a*)-27(*c*), as described above, in the n-type device region, the position holder layer 1031 may be removed to expose the sidewalls of the preliminary channel layer 1005, a channel layer 1061 for the n-type device may be grown on the sidewalls of the preliminary channel layer 1005, and a gate stack (including a gate dielectric layer 1063 and a gate conductor layer 1065) for the n-type device may be formed to surround the channel layer 1061.

The material for the channel layer 1061 may be selected, so that it facilitates the device performances. For example, the channel layer 1061 may comprise a semiconductor material which is beneficial for enhancing the ON current of the device and/or reducing the OFF current of the device. For example, for the n-type device, a concentration of electrons in the channel layer 1061 may be greater than that in the preliminary channel layer 1005 when the device is ON. In addition, the channel layer 1061 may form a heterojunction together with at least one of the buffer layer 1003, the preliminary channel layer 1005, and the semiconductor layer 1007. The material of the channel layer 1061 may be selected variously. For example, the channel layer 1061 may comprise a group IV semiconductor material or a group III-V compound semiconductor material, for example, one of SiGe, Ge, SiGeSn, GeSn, GaAs, InGaAs, InP, AlGaAs, InAlAs, InAs, InGa, InAlGa, GaN, InSb, InGaSb, or a combination thereof.

In this example (in which the buffer layer 1003 comprises $Si_{1-x}Ge_x$, the preliminary channel layer 1005 comprises $Si_{1-y}Ge_y$, and the semiconductor layer 1007 comprises $Si_{1-z}Ge_z$), the channel layer 1061 may comprise $Si_{1-cn}Ge_{cn}$ (where cn is between 0 and 1, and cn≤y). A concentration of Ge in the channel layer 1061 may be non-uniform, for example, relatively large at the beginning of growth to reduce defects, and then gradually decreasing. Thus, the concentration of Ge in the channel layer 1061 may gradually decrease from its surface on the side close to the first semiconductor material towards its surface on the side away from the first semiconductor material.

Figure 28A:
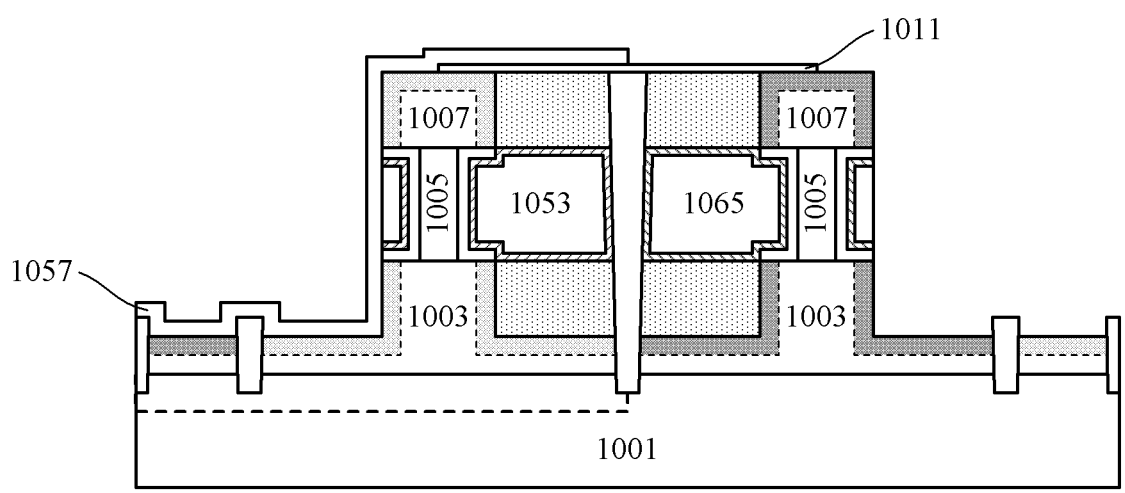
Figure 28B:
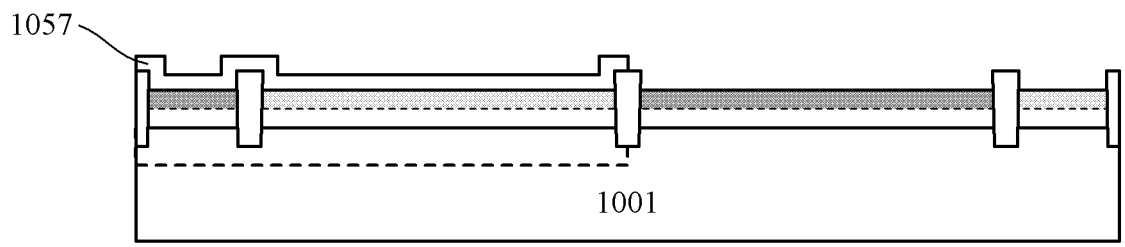
Figure 28C:
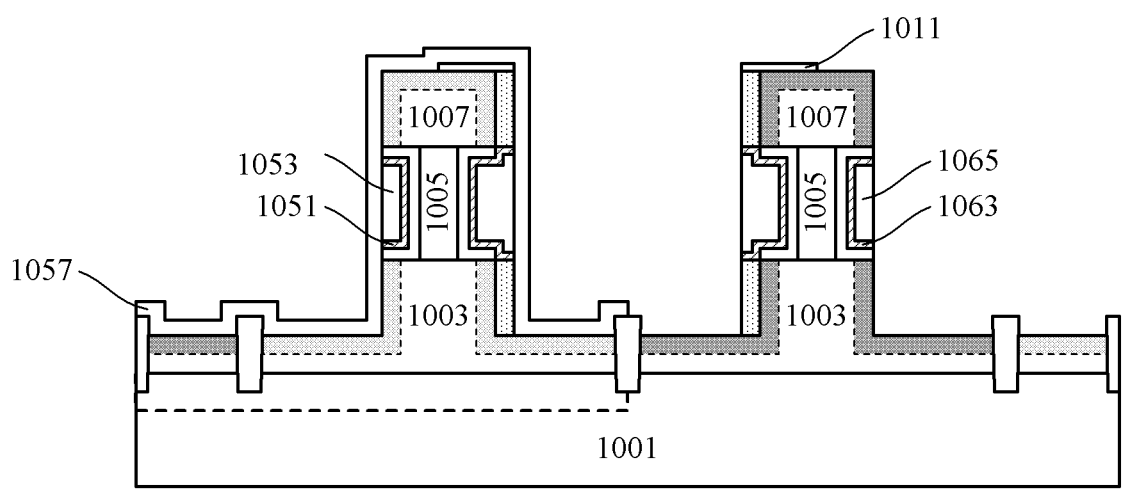

Then, in the n-type device region, extending portions of the gate stack and the position holder layer 1045 connecting the respective active regions may also be at least partially removed. As shown in FIGS. 28(*a*)-28(*c*), as described above, in the n-type device region, the respective active regions of the devices may not be connected to each other, and the gate stack for each of the devices comprises one extending portion.

Figure 29A:
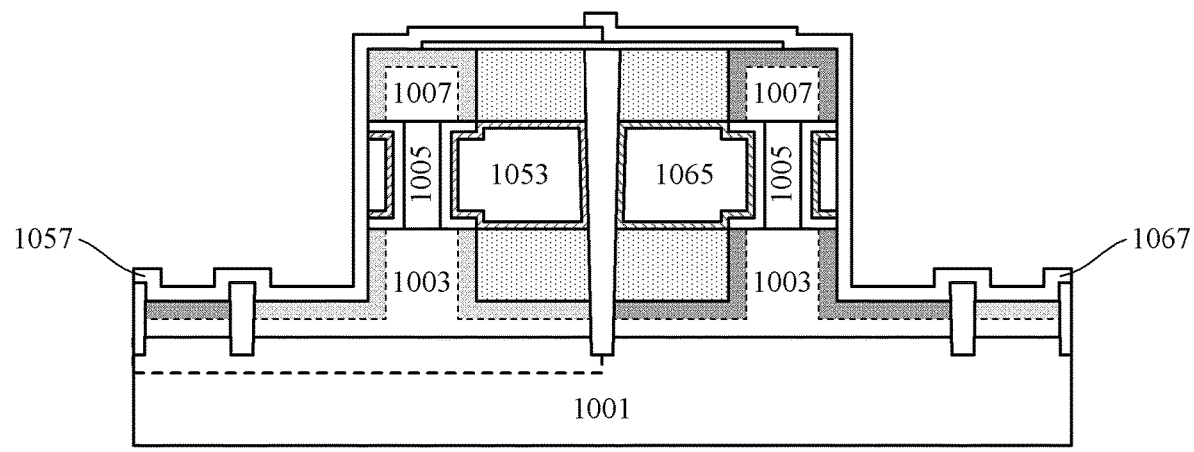
Figure 29B:
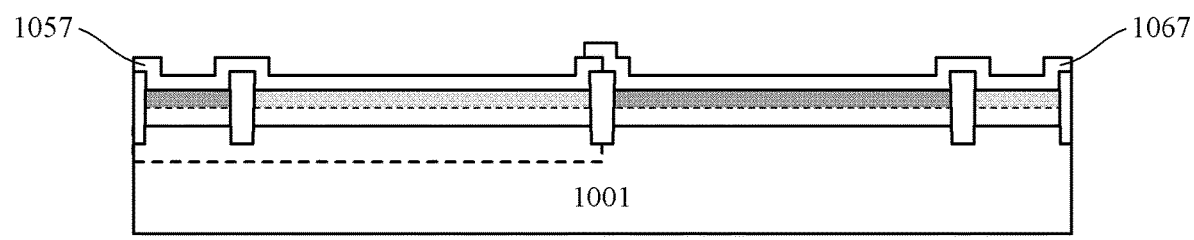
Figure 29C:
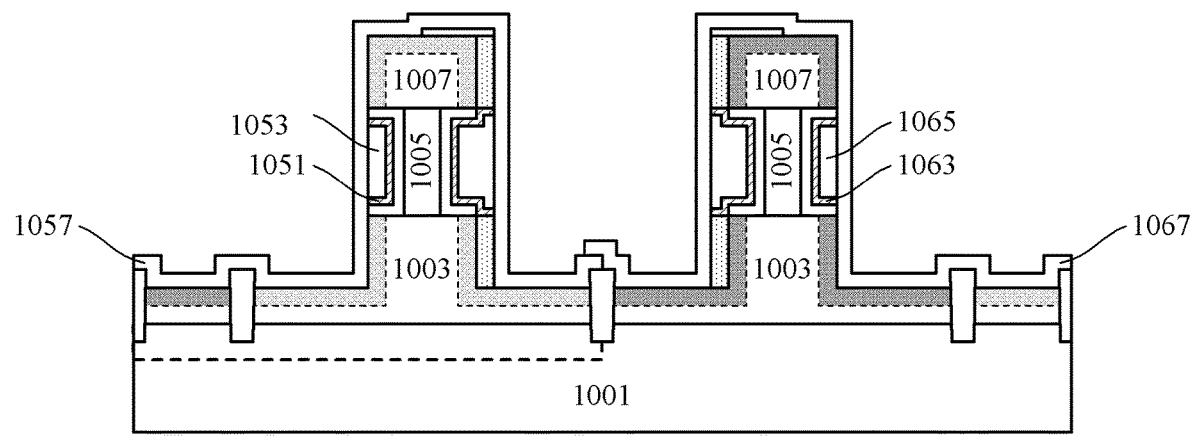

Similarly, as shown in FIGS. 29(*a*)-29(*c*), a liner 1067 may be formed in the n-type device region. The liner 1067 may also be stressed. For example, for the n-type device, the liner 1067 may be compressive stressed to generate tensile stress in the channel layer.

Figure 30:
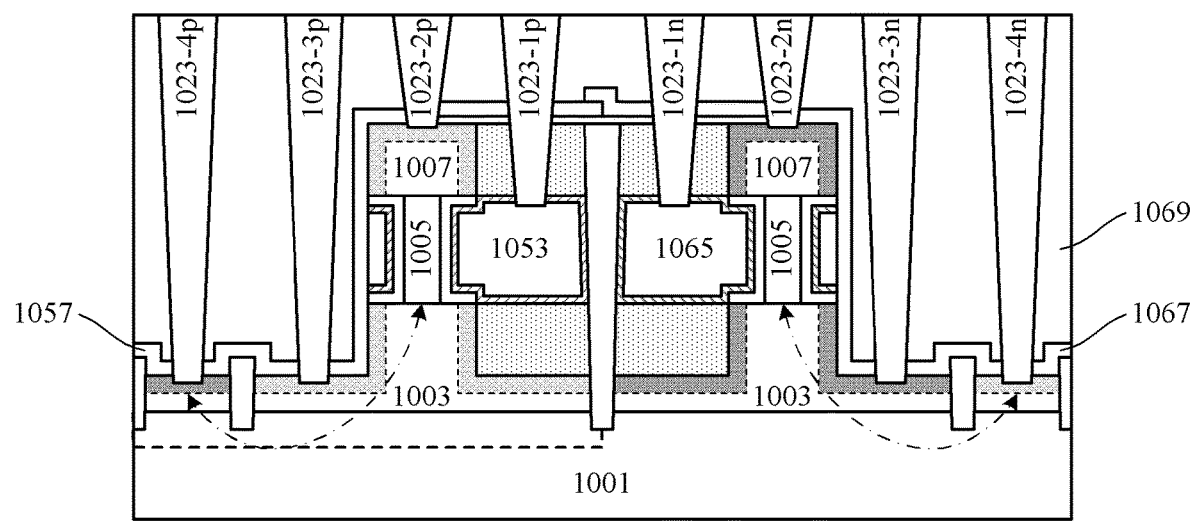

Then, as shown in FIG. 30 (FIG. 30 corresponds to the cross section along line AA' in FIG. 10(*e*)), an interlayer dielectric layer 1069 may be formed on the structure shown in FIGS. 29(*a*)-29(*c*). For example, oxide may be deposited and planarized by, for example, CMP, to form the interlayer dielectric layer 1069. In the interlayer dielectric layer 1069 at the p-type device region, a contact 1023-1*p* to the gate conductor layer 1053, a contact 1023-2*p* to the source/drain region 1041-2, and a contact 1023-3*p* to the source/drain region 1041 may be formed, and a contact 1023-4*p* to the well region (via the body contact region 1041-3) may be formed. Similarly, in the n-type device region, a contact 1023-1*n* to the gate conductor layer 1065, a contact 1023-2*n* to the source/drain region 1043-2, and a contact 1023-3*n* to the source/drain region 1043-1 may be formed, and a contact 1023-4*n* to the p-type substrate 1001 (via the body contact region 1043-3) may be formed. These contacts may be formed by etching the interlayer dielectric layer 1069 and the stressed liners to form holes therein, and filling a conductive material such as metal (for example, tungsten) in the holes. A barrier layer of, for example, TiN, may be formed on inner walls of the contact holes before the metal is filled.

In etching the contact holes, the etching of the interlayer dielectric layer 1069 may be stopped at the liners 1057 and 1067, and then the liners of a substantially uniform thickness may be etched. Since the contacts to the source/drain regions and the contacts to the gate conductor layers have different heights, it is difficult to etch the contact holes. In this embodiment, however, the stop of the etching of the contact holes may be relatively easily controlled due to the presence of the liners.

Since the gate conductor layers 1053/1065 extend beyond the peripheries of the respective active regions (by the extending portions corresponding to the bridge portions of the mask), the contacts 1023-1*p*/1023-1*n* thereto may be easily formed. In addition, since the doped regions in the buffer layer 1003 extend beyond the respective active regions and there is no gate conductor layer above at least a portion of the doped regions, the contacts 1023-3*p*/1023-3*n* thereto may be easily formed.

As shown by dashed-dotted arrows in the figure, a bias may be applied to the preliminary channel layer 1005 via the body contact region 1041-3/1043-3, the respective well region in the substrate 1001, and the buffer layer 1031 (particularly portions thereof other than the source/drain regions), to change a threshold voltage of the device. According to another embodiment, holes may be formed in the semiconductor layer 1007 to form electrical contacts to the respective body regions in the preliminary channel layer 1005.

In order to facilitate applying the bias, portions of the buffer layer 1003 and/or the semiconductor layer 1007 other than the source/drain regions may have some doping (for example, the same type of doping as that of the body region). Such doping may be performed by, for example, ion implantation or in-situ doping during growth. For the source/drain regions, doping may still be performed in the above manner, so that the source/drain regions are doped into a desired conductivity type and a desired doping concentration. Thus, the preliminary channel layer 1005 or the body regions therein may form ohmic contact with the portions of the buffer layer 1003 and/or the semiconductor layer 1007 other than the source/drain regions. Certainly, the portions of the buffer layer 1003 and/or the semiconductor layer 1007 other than the source/drain regions may be undoped, as long as the corresponding intrinsic semiconductor has a relatively high concentration of electrons or holes.

As shown in FIG. 30, the device according to the present embodiment is obtained. The p-type devices and the n-type devices are shown here. It will be appreciated by those skilled in the art that more or fewer devices may be formed or devices of the same conductivity type may be formed.

Each of the devices comprises the pillar-shaped (in this example, a hexahedral pillar having a square or rectangular cross-section) active region. The active region may comprise the buffer layer 1003, the preliminary channel layer 1005, the channel layer, and the semiconductor layer 1007. The source/drain regions may be formed at upper and lower portions of the active region. In this example, the source/drain regions may be substantially formed in the buffer layer 1003 and the semiconductor layer 1007, respectively. The channel region may be substantially formed in the channel layer. The source/drain regions may be connected by the channel region.

The preliminary channel layer 1005 inside the channel layer may form the body region. The body region may or may not be doped (in the case of doping, the body region may also be referred to the well region). In addition, the body region may form a heterojunction structure together with at least one of its adjacent semiconductor layers, for example, at least one of the channel layer, the buffer layer 1003, and the semiconductor layer 1007, which contributes to improve the device performances. In addition, the body region may also form a quantum well structure together with the channel layer and the gate dielectric layer in the gate stack, which contributes to substantially confine the carriers in the channel layer, thereby improving the device performances.

FIGS. 31 to 37 are schematic views showing some stages in a flow of manufacturing a semiconductor device according to another embodiment of the present disclosure. Hereinafter, the descriptions will focus on differences of the present embodiment from the above embodiments.

In the above embodiments, once the first or second strip-shaped patterns have been formed on the sidewalls of the auxiliary pattern, the auxiliary pattern is removed, and the first or second spacers are formed on opposite sidewalls of the respective first or second strip-shaped patterns. The present disclosure is not limited thereto. For example, the first or second spacers may be formed on sidewalls on one side of the respective first or second patterns with the auxiliary pattern remaining.

Figure 31:
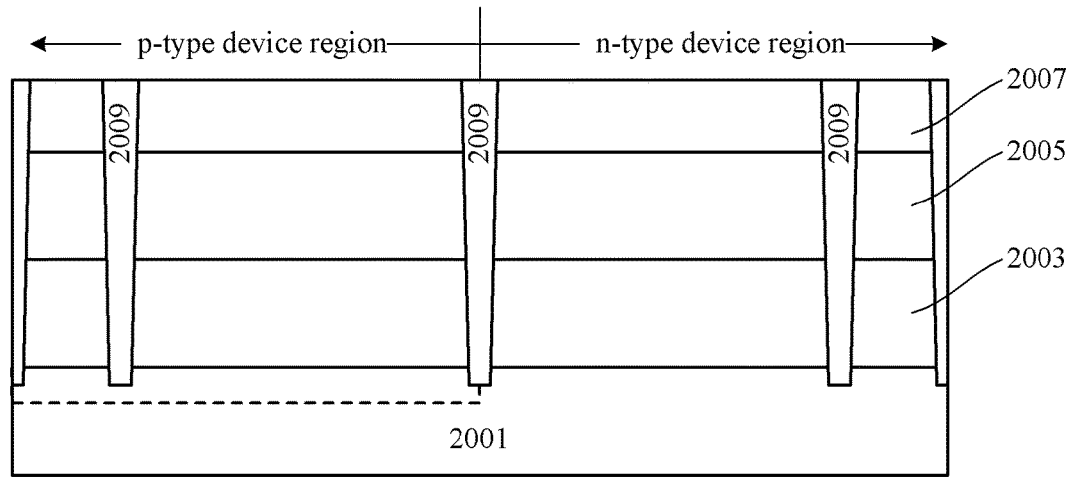
FIGS. 31 to 37 are schematic views showing some stages in a flow of manufacturing a semiconductor device according to another embodiment of the present disclosure.

As shown in FIG. 31, a substrate 2001 may be provided, and a stack of a buffer layer 2003, a preliminary channel layer 2005, and another semiconductor layer 2007 may be disposed on the substrate 2001. For details of these layers, reference can be made to the descriptions above in connection with FIGS. 1(*a*) and 1(*b*). In addition, active regions may be defined by respective STIs 2009.

Figure 32A:
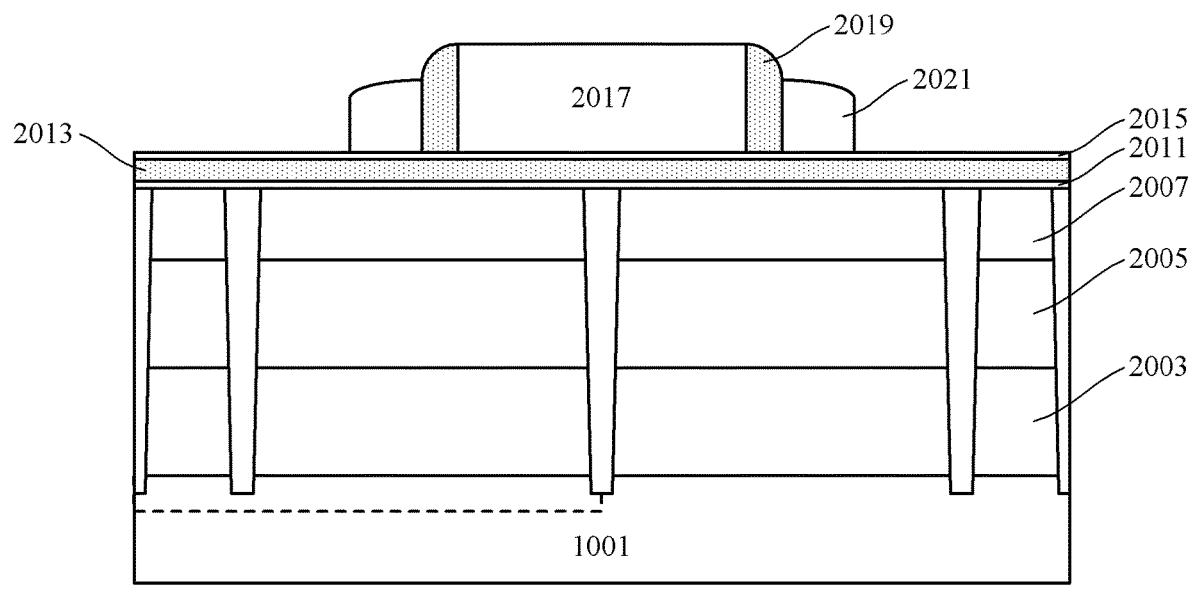
Figure 32B:
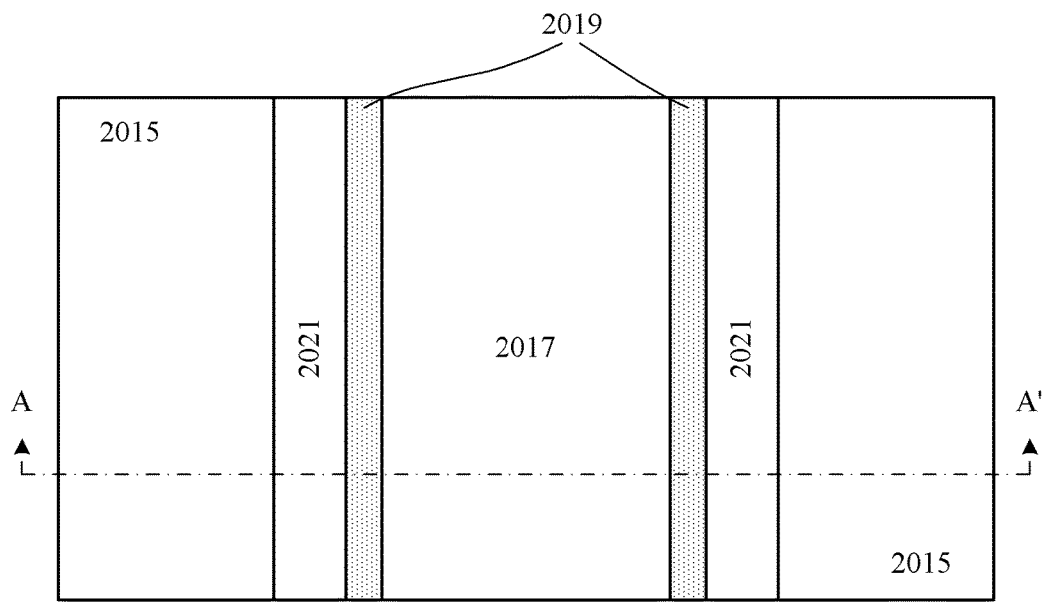

Next, as shown in FIGS. 32(*a*) and 32(*b*) (FIG. 32(*a*) is a sectional view, and FIG. 32(*b*) is a top view with line AA' indicating the location where the sectional view of FIG. 32(*a*) is taken), a preliminary mask layer may be formed on the structure shown in FIG. 31. Here, the preliminary mask layer may comprise a stack of oxide 2011-nitride 2013-oxide 2015.

First strip-shaped patterns extending in a first direction (for example, a vertical direction in the figure) may be formed on the preliminary mask layer. To this end, an auxiliary pattern 2017 of, for example, polycrystalline silicon or amorphous silicon, may be formed by, for example, deposition. The first strip-shaped patterns 2019 in a form of spacer may be formed on sidewalls of the auxiliary pattern 2017 by a spacer formation process. For details of these material layers, reference can be made to the above descriptions in connection with FIGS. 2(a) and 2(b).

Unlike the above embodiments, the auxiliary pattern 2017 is not removed here, and the first spacers 2021 may be formed directly on sidewalls of the first strip-shaped patterns 2019. Since sidewalls on one side of the first strip-shaped patterns 2019 facing the auxiliary pattern 2017 are covered by the auxiliary pattern 2017, the first spacers 2021 are formed on sidewalls on only one side of the first strip-shaped patterns 2019 facing away from the auxiliary pattern 2017. For example, the first spacers 2021 may comprise oxynitride, with a width of about 5-50 nm.

Figure 33A:
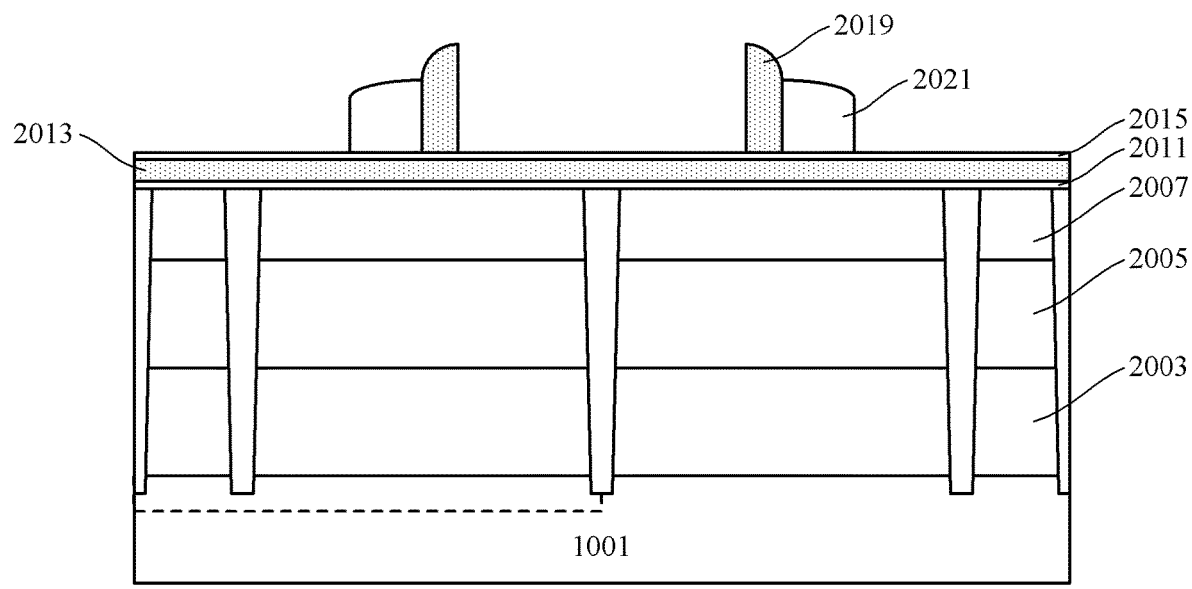
Figure 33B:
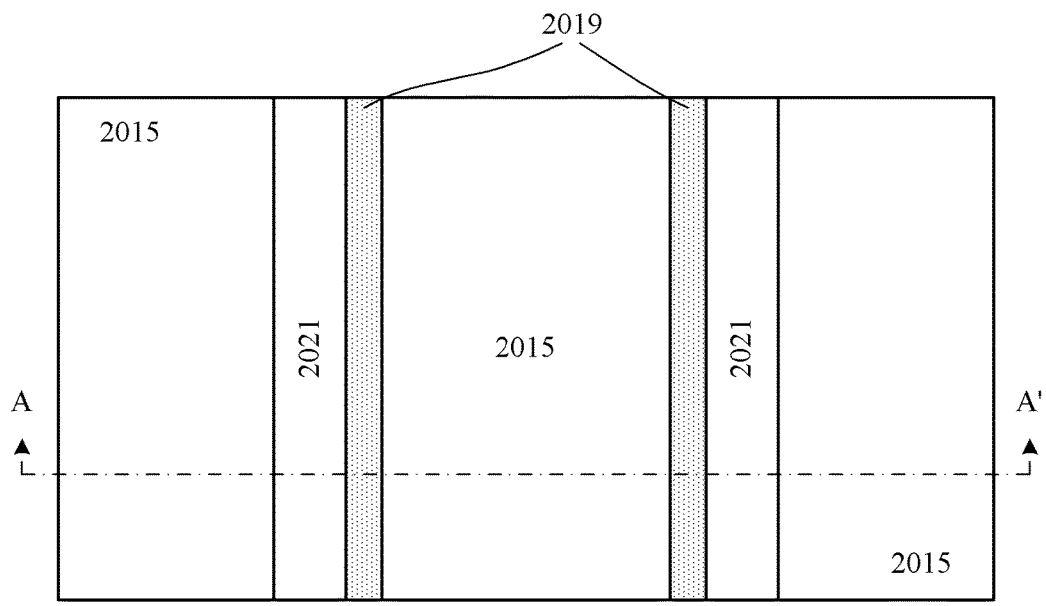

Then, as shown in FIGS. 33(a) and 33(b) (FIG. 33(a) is a sectional view, and FIG. 33(b) is a top view with line AA' indicating the location where the sectional view of FIG. 33(a) is taken), the auxiliary pattern 2017 may be removed by selective etching such as RIE.

Then, second strip-shaped patterns and second spacers extending in a second direction (for example, a horizontal direction in the figure) may be formed in a similar manner.

Figure 34A:
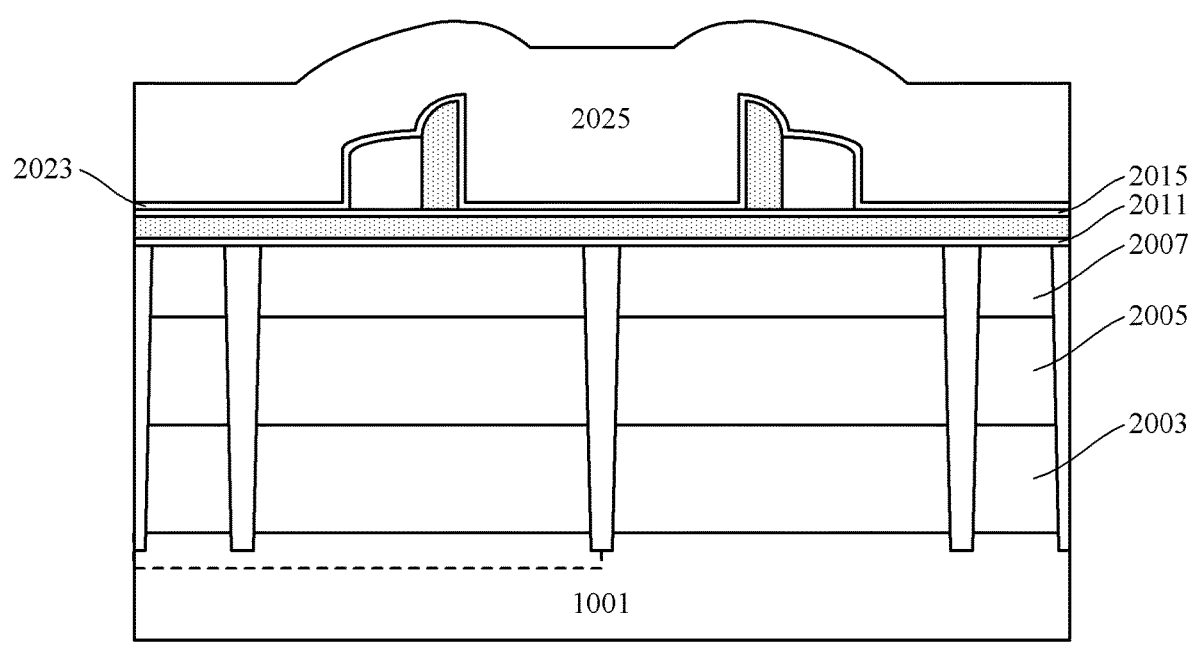
Figure 34B:
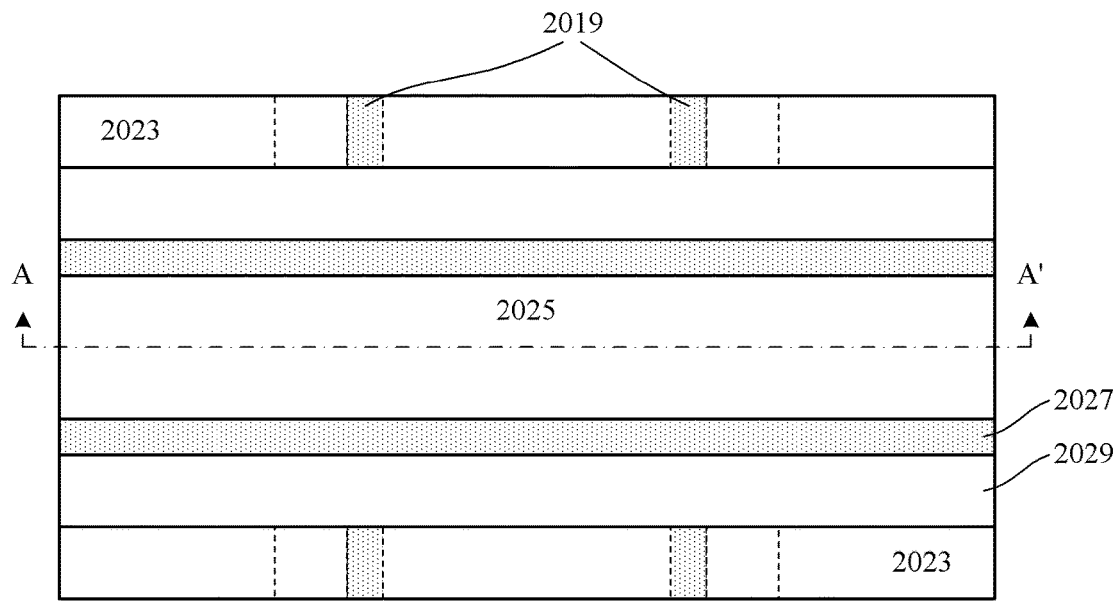

As shown in FIGS. 34(a) and 34(b) (FIG. 34(a) is a sectional view, and FIG. 34(b) is a top view with line AA' indicating the location where the sectional view of FIG. 34(a) is taken), an auxiliary pattern 2025 of, for example, polycrystalline silicon or amorphous silicon, may be formed by, for example, deposition on the structure shown in FIGS. 33(a) and 33(b). The auxiliary pattern 2025 may have a thickness approaching or exceeding ½ of an interval between the respective first spacers 2019 to avoid unnecessary spacers from occurring in a subsequent spacer formation process (i.e., there are no steep sidewalls between the respective first spacers 2019, on which spacers may be formed). Alternatively, the auxiliary pattern 2025 may be planarized by, for example, CMP, so that it has a flat surface. Likewise, a thin oxide layer 2023 may be formed by, for example, deposition before the auxiliary pattern 2025 is formed. For details of these layers, reference may be made to the descriptions above in connection with FIGS. 4(a), 4(b) and 4(c).

Second strip-shaped patterns 2027 in a form of spacer may be formed on sidewalls of the auxiliary pattern 2025 by a spacer formation process. For example, the second strip-shaped patterns 2027 may comprise nitride, with a width of about 5-50 nm.

Similarly, second spacers 2029 may be formed directly on sidewalls of the second strip-shaped patterns 2027 without removing the auxiliary pattern 2025. Therefore, the second spacers 2029 are formed on sidewalls on only one side of the respective second strip-shaped patterns 2027 facing away the auxiliary pattern 2025. For example, the second spacers 2029 may comprise oxide, with a width of about 5-50 nm.

Figure 35:
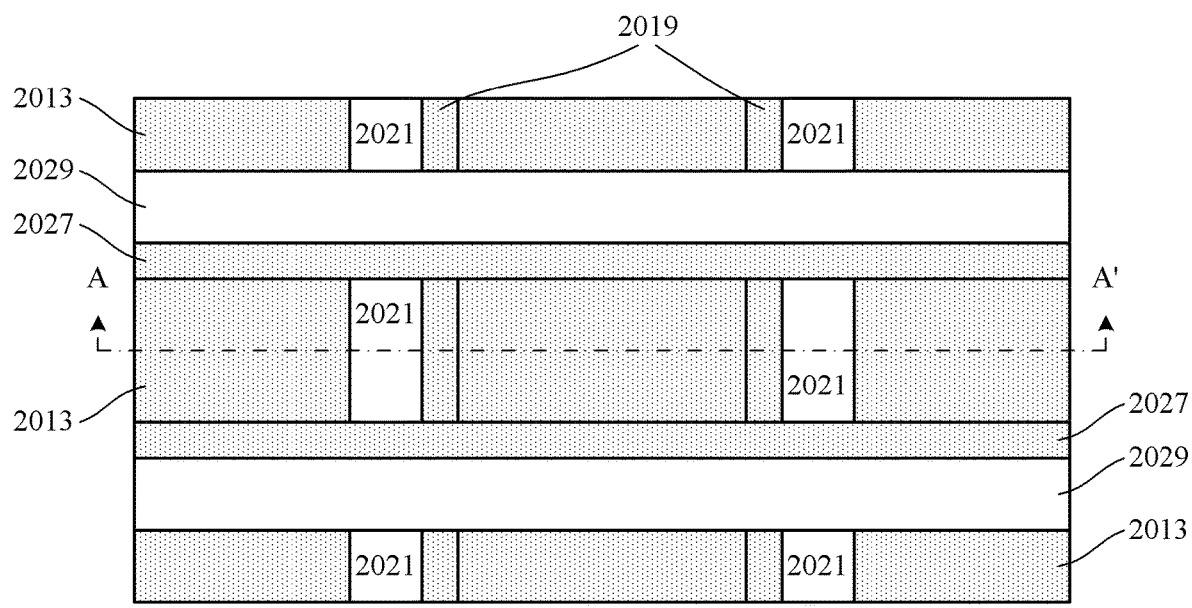

Then, as shown in FIG. 35, the auxiliary pattern 2025 may be removed by selective etching such as RIE. Further, the oxide layer 1023 may be removed by selective etching such as RIE to expose the underlying structure, particularly the first strip-shaped patterns 2019 and the first spacers 2021. In the RIE of the oxide layer, portions of the oxide layer 2015 at the top of the preliminary mask layer except for those below the respective strip-shaped patterns and spacers may also be removed to expose the underlying nitride layer 2013.

Figure 36:
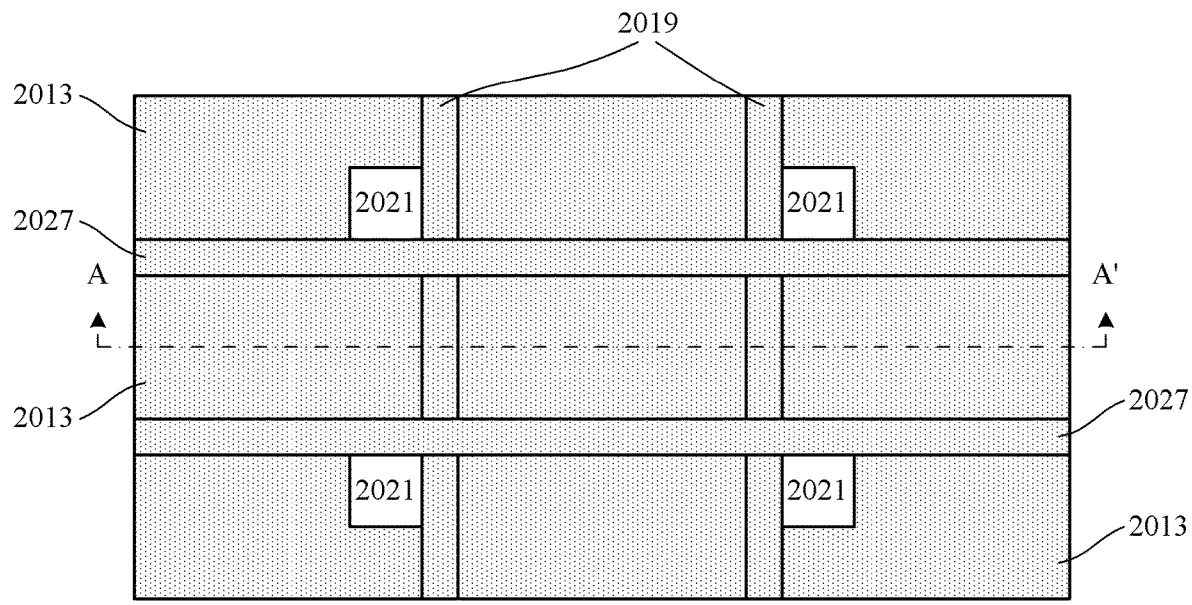

The first spacers may be selectively etched using the second strip-shaped patterns and the second spacers as a mask. As shown in FIG. 36, the first spacers 2021 (of oxynitride here) may be selectively etched by, for example, RIE. Thus, portions of the first spacers 2021 intersecting (the second strip-shaped patterns 2027+the second spacers 2029) are left. The second spacers 2029 (of oxide here) may then be removed by selective etching such as RIE.

Thus, a grid pattern is formed. The pattern may then be transferred into the preliminary mask layer to define the active regions.

Figure 37:
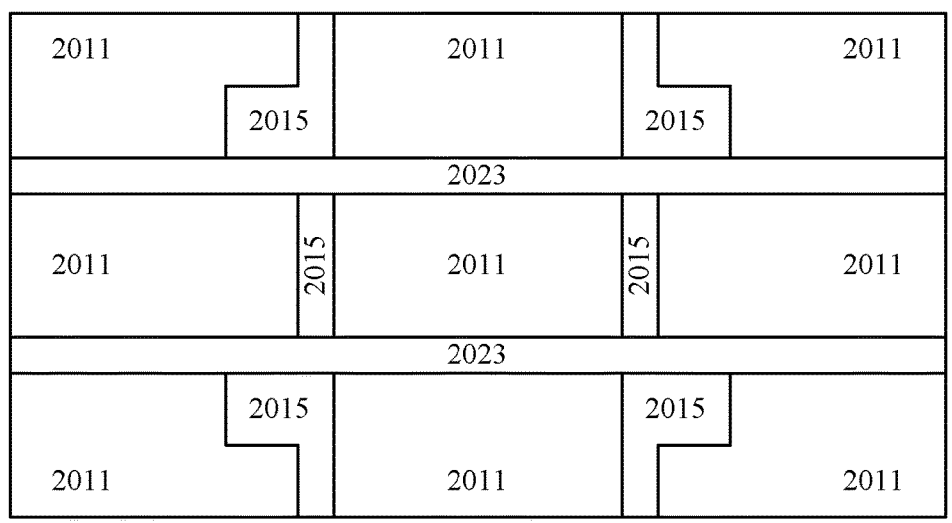

As shown in FIG. 37, the nitride layer 2013 in the preliminary mask layer is patterned using the above pattern as a mask. For example, the nitride layer 2013 may be patterned by selective etching such as RIE. Thus, the above pattern may be transferred to the nitride layer 2013. In addition, the first strip-shaped patterns 2019 and the second strip-shaped patterns 2027 both comprise nitride here, and may also be removed (portions of the first strip-shaped patterns 2019 intersecting the second strip-shaped patterns 2027 may be left, as described above). Then, the first spacers 2021 (of oxynitride here) may be removed by selective etching such as RIE. Thus, a grid-shaped mask layer is obtained. After that, the oxide may be selectively etched by, for example, RIE to expose the underlying semiconductor layer, so as to define the active regions using the mask layer, and to fabricate the semiconductor device in the same way as described above, details of which are omitted here.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

The embodiments of the present disclosure have been described above. However, these embodiments are for illustrative purposes only and are not intended to limit the scope of the present disclosure. The scope of the disclosure is defined by the appended claims and their equivalents. Numerous alternatives and modifications may be made by those skilled in the art without departing from the scope of the present disclosure, and such alternatives and modifications should all fall within the scope of the present disclosure.

I claim:

1. A semiconductor device, comprising:
   a substrate;
   a pillar-shaped active region extending vertically on the substrate, wherein the active region comprises a first source/drain region at a lower portion thereof, a second source/drain region at an upper portion thereof, a channel region between the first source/drain region and the second source/drain region and close to a peripheral surface thereof, and a body region on a laterally inner side of the channel region, wherein the first source/drain region comprises a first heavily doped region and the second source/drain region comprises a second heavily doped region;

a first region which is substantially undoped or lightly doped and on a laterally inner side of the first heavily doped region;

a second region which is substantially undoped or lightly doped and on a laterally inner side of the second heavily doped region; and a gate stack formed around a periphery of the channel region;

wherein the body region is substantially undoped or lightly doped and forms ohmic contact with at least one of the first region or the second region.

2. The semiconductor device according to claim 1, wherein there are a plurality of such semiconductor devices disposed on the substrate, wherein respective body regions of at least some of the semiconductor devices are electrically isolated from each other.

3. The semiconductor device according to claim 2, wherein a first one and a second one of the plurality of semiconductor devices have different conductivity types, and have respective body regions of different types of doping.

4. The semiconductor device according to claim 3, wherein the first semiconductor device is an n-type device having a body region which is p-type doped, and the second semiconductor device is a p-type device having a body region which is n-type doped.

5. The semiconductor device according to claim 1, wherein the active region comprises a first source/drain layer, a channel layer, and a second source/drain layer which are stacked in sequence on the substrate, wherein the first source/drain region is formed substantially in the first source/drain layer, the second source/drain region is formed substantially in the second source/drain layer, and the channel region is formed substantially in the channel layer.

6. The semiconductor device according to claim 5,
wherein the first heavily doped region is formed at least partially in the first source/drain layer close to a peripheral surface of the first source/drain layer, and the first region is formed at least partially in the first source/drain layer inside the first heavily doped region, and,
wherein the second heavily doped region is formed at least partially in the second source/drain layer close to a peripheral surface of the second source/drain layer, and the second region is formed at least partially in the second source/drain layer inside the second heavily doped region.

7. The semiconductor device according to claim 5, wherein the channel layer comprises a first semiconductor material and a second semiconductor material formed around a periphery of the first semiconductor material.

8. The semiconductor device according to claim 7, wherein the body region is formed substantially in the first semiconductor material, and the channel region is formed substantially in the second semiconductor material.

9. The semiconductor device according to claim 7, wherein the first semiconductor material has its periphery recessed with respect to those of the first source/drain layer and the second source/drain layer, and the second semiconductor material is formed in a recess formed by the periphery of the first semiconductor material with respect to those of the first source/drain layer and the second source/drain layer.

10. The semiconductor device according to claim 7, wherein the second semiconductor material forms a heterojunction with respect to at least one of the first source/drain layer, the second source/drain layer, and the first semiconductor material.

11. The semiconductor device according to claim 7, wherein
for an n-type device, a concentration of electrons in the second semiconductor material is greater than that in the first semiconductor material when the device is ON; or
for a p-type device, a concentration of holes in the second semiconductor material is greater than that in the first semiconductor material when the device is ON.

12. The semiconductor device according to claim 7, wherein
for an n-type device, a conduction band energy level in the second semiconductor material is lower than that in the first semiconductor material; or
for a p-type device, a valence band energy level in the second semiconductor material is higher than that in the first semiconductor material.

13. The semiconductor device according to claim 1, wherein the body region forms an ultra-steep well structure with respect to the channel region.

14. The semiconductor device according to claim 13, wherein a doping concentration in the body region decreases as a distance to a corresponding one of the gate stacks decreases.

15. The semiconductor device according to claim 1, wherein the body region, the channel region, and a gate dielectric layer in the gate stack form a quantum well structure.

16. The semiconductor device according to claim 1, wherein there is a doping interface or a crystalline interface between the body region and the channel region.

17. The semiconductor device according to claim 1, further comprising dielectric spacers surrounding respective ends of the channel region, wherein the dielectric spacers cause the ends of the channel region to be recessed with respect to peripheral surfaces of the respective source/drain regions while abutting the respective source/drain regions.

18. The semiconductor device according to claim 17, wherein the dielectric spacer comprises a dielectric with a low dielectric constant or gas.

19. The semiconductor device according to claim 1, wherein the channel region has its ends close to the respective source/drain regions doped to a certain extent.

20. The semiconductor device according to claim 1, wherein the first source/drain region and the second source/drain region are doped to have different conductivity types.

21. An electronic device, comprising an integrated circuit comprising the semiconductor device according to claim 1.

22. The electronic device according to claim 21, further comprising a display operatively coupled to the integrated circuit and a transceiver operatively coupled to the integrated circuit.

23. The electronic device according to claim 21, wherein the electronic device comprises a smart phone, a computer, a tablet computer, an artificial intelligence device, a wearable device, or a mobile power supply.

24. A method of manufacturing a semiconductor device, comprising:

disposing a stack of a first source/drain layer, a preliminary channel layer, and a second source/drain layer on a substrate;
forming a mask layer in a form of a grid on the stack, the mask layer comprising body portions at intersections of the grid and bridge portions between the respective body portions;
defining, in the stack, a plurality of active regions corresponding to the respective body portions using the mask layer, wherein in each of the active regions, the preliminary channel layer has its periphery recessed with respect to those of the first source/drain layer and the second source/drain layer;
forming, in each of the active regions, a channel layer in a recess formed by the periphery of the prior-formed preliminary channel layer with respect to those of the first source/drain layer and the second source/drain layer; and
forming gate stacks around peripheries of the respective channel layers.

25. The method according to claim 24, wherein disposing the stack comprises doping the preliminary channel layer into a certain conductivity type.

26. The method according to claim 24, wherein defining the active regions comprises:
patterning the stack into a grid corresponding to the mask layer using the mask layer as a mask;
selectively etching the preliminary channel layer, so that sidewalls of the preliminary channel layer are retracted inwards to form a plurality of separated portions corresponding to the respective body portions of the mask layer;
forming a first position holder layer between the first source/drain layer and the second source/drain layer to surround each of the separated portions of the channel layer; and
selectively etching the first source/drain layer and the second source/drain layer, so that sidewalls of the first source/drain layer and the second source/drain layer are retracted inwards to form a plurality of separated portions corresponding to the respective body portions of the mask layer, wherein an extent to which the sidewalls of the first source/drain layer and the second source/drain layer are retracted is less than that to which the sidewalls of the channel layer are retracted.

27. The method according to claim 26, further comprising:
doping the first source/drain layer and the second source/drain layer to form source/drain regions therein.

28. The method according to claim 27, wherein the doping comprises:
forming a dopant source layer on surfaces of the first source/drain layer and the second source/drain layer; and
driving dopants from the dopant source layer into portions of the first source/drain layer and the second source/drain layer close to their respective peripheral surfaces.

29. The method according to claim 26, wherein the forming of the channel layer comprises:
forming a second position holder layer on surfaces of the first source/drain layer and the second source/drain layer; and
removing the first position holder layer, and epitaxially growing the channel layer.

30. The method according to claim 24, wherein the forming of the mask layer comprises:
forming a preliminary mask layer on the substrate;
forming, on the preliminary mask layer, a plurality of first strip-shaped patterns extending in a first direction;
forming, on sidewalls of the plurality of first strip-shaped patterns, first spacers extending in the first direction;
forming, on the preliminary mask layer having the first strip-shaped patterns and the first spacers formed thereon, a plurality of second strip-shaped patterns extending in a second direction crossing the first direction;
forming, on sidewalls of the plurality of second strip-shaped patterns, second spacers extending in the second direction;
selectively etching the first spacers using the second strip-shaped patterns and the second spacers as a mask;
removing the second spacers; and
transferring the current first strip-shaped patterns, the current second strip-shaped patterns, and patterns of the current first spacers into the preliminary mask layer.

31. The method according to claim 30, wherein the forming of the first strip-shaped patterns comprises:
forming a first auxiliary pattern extending in the first direction; and
forming, on sidewalls of the first auxiliary pattern, spacers extending in the first direction to act as the first strip-shaped patterns.

32. The method according to claim 31, wherein the forming of the first spacers comprises:
with the presence of the first auxiliary pattern, forming the first spacers on sidewalls of the respective spacers, as the first strip-shaped patterns, facing away from the first auxiliary pattern; and
removing the first auxiliary pattern.

33. The method according to claim 31, wherein the forming of the first spacers comprises:
removing the first auxiliary pattern; and
forming the first spacers on opposite sidewalls of the respective spacers acting as the first strip-shaped patterns.

34. The method according to claim 30, wherein the forming of the second strip-shaped patterns comprises:
forming a second auxiliary pattern extending in the second direction; and
forming, on sidewalls of the second auxiliary pattern, spacers extending in the second direction to act as the second strip-shaped patterns.

35. The method according to claim 34, wherein the forming of the second spacers comprises:
with the presence of the second auxiliary pattern, forming the second spacers on sidewalls of the respective spacers, as the second strip-shaped patterns, facing away from the second auxiliary pattern; and
removing the second auxiliary pattern.

36. The method according to claim 34, wherein the forming of the second spacers comprises:
removing the second auxiliary pattern; and
forming the second spacers on opposite sidewalls of the respective spacers acting as the second strip-shaped patterns.

* * * * *